United States Patent
Song et al.

(10) Patent No.: US 11,482,602 B2
(45) Date of Patent: Oct. 25, 2022

(54) SEMICONDUCTOR DEVICES AND METHODS OF FABRICATING THE SAME

(71) Applicant: Samsung Electronics Co., Ltd., Suwon-si (KR)

(72) Inventors: Hyun-Seung Song, Hwaseong-si (KR); Tae-Yeol Kim, Hwaseong-si (KR); Jae-Jik Baek, Seongnam-si (KR)

(73) Assignee: Samsung Electronics Co., Ltd.

(*) Notice: Subject to any disclaimer, the term of this patent is extended or adjusted under 35 U.S.C. 154(b) by 60 days.

(21) Appl. No.: 17/034,088

(22) Filed: Sep. 28, 2020

(65) Prior Publication Data

US 2021/0217861 A1   Jul. 15, 2021

(30) Foreign Application Priority Data

Jan. 10, 2020 (KR) .......................... 10-2020-0003715

(51) Int. Cl.
*H01L 29/417* (2006.01)
*H01L 23/522* (2006.01)
*H01L 29/40* (2006.01)

(52) U.S. Cl.
CPC .... *H01L 29/41775* (2013.01); *H01L 23/5226* (2013.01); *H01L 29/401* (2013.01)

(58) Field of Classification Search
CPC . H01L 29/41775; H01L 29/401; H01L 29/78; H01L 29/0603; H01L 23/5226; H01L 23/481; H01L 21/823814; H01L 21/823821; H01L 21/76805; H01L 21/76897

USPC .......................................................... 257/734
See application file for complete search history.

(56) References Cited

U.S. PATENT DOCUMENTS

| | | | |
|---|---|---|---|
| 4,105,328 A | 8/1978 | Wasson et al. | |
| 4,348,810 A | 9/1982 | Oda et al. | |
| 4,680,958 A | 7/1987 | Ruelle et al. | |
| 9,490,317 B1 | 11/2016 | Labonte et al. | |
| 9,985,104 B2 | 5/2018 | Alptekin et al. | |
| 10,037,918 B2 | 7/2018 | Hsu et al. | |
| 10,199,271 B1 | 2/2019 | Xie et al. | |
| 10,243,053 B1 | 3/2019 | Xie et al. | |
| 11,195,951 B2* | 12/2021 | Yu ......................... | H01L 29/165 |
| 2018/0315652 A1* | 11/2018 | Tsai .................. | H01L 21/76889 |
| 2018/0337188 A1* | 11/2018 | Yu ..................... | H01L 21/26513 |
| 2019/0067131 A1* | 2/2019 | Liaw ................. | H01L 21/76877 |
| 2019/0103311 A1 | 4/2019 | Tsai et al. | |

(Continued)

*Primary Examiner* — Dao H Nguyen
(74) *Attorney, Agent, or Firm* — Myers Bigel, P.A.

(57) ABSTRACT

A semiconductor device is disclosed. The semiconductor device includes a gate electrode on a substrate and extending in a first direction, source/drain patterns spaced apart from each other, in a second direction, with the gate electrode interposed therebetween, a gate contact electrically connected to the gate electrode, and an active contact electrically connected to at least one of the source/drain patterns. The active contact includes a lower contact pattern electrically connected to the at least one of the source/drain patterns, the lower contact pattern having a first width in the first direction, and an upper contact pattern electrically connected to a top surface of the lower contact pattern, the upper contact pattern having a second width in the first direction that is smaller than the first width. The upper contact pattern and the gate contact horizontally overlap each other.

20 Claims, 53 Drawing Sheets

(56) References Cited

U.S. PATENT DOCUMENTS

2019/0115261 A1 4/2019 Lai et al.
2020/0411378 A1* 12/2020 Huang ............ H01L 21/823475

* cited by examiner

SEMICONDUCTOR DEVICES AND METHODS OF FABRICATING THE SAME

CROSS-REFERENCE TO RELATED APPLICATION(S)

This U.S. non-provisional patent application claims priority under 35 U.S.C. § 119 to Korean Patent Application No. 10-2020-0003715, filed on Jan. 10, 2020, in the Korean Intellectual Property Office, the entire contents of which are hereby incorporated by reference.

BACKGROUND

The present disclosure relates to semiconductor devices. Due to their small-size, multifunctional, and/or low-cost characteristics, semiconductor devices are being esteemed as important elements in the electronics industry. Semiconductor devices are classified into a memory device for storing data, a logic device for processing data, and a hybrid device including both of memory and logic elements. As the electronics industry advances, there is an increasing demand for semiconductor devices with improved characteristics. For example, there is an increasing demand for semiconductor devices with high reliability, high performance, and/or multiple functions. To meet this demand, complexity and/or integration density of semiconductor devices are being increased.

SUMMARY

An embodiment of the inventive concept provides a highly reliable semiconductor device.

According to an embodiment of the inventive concept, a semiconductor device may include a gate electrode on a substrate and extending in a first direction, source/drain patterns spaced apart from each other, in a second direction, with the gate electrode interposed therebetween, a gate contact electrically connected to the gate electrode, and an active contact electrically connected to at least one of the source/drain patterns. The active contact may include a lower contact pattern electrically connected to the at least one of the source/drain patterns, the lower contact pattern having a first width in the first direction, and an upper contact pattern electrically connected to a top surface of the lower contact pattern, the upper contact pattern having a second width in the first direction that is smaller than the first width. The upper contact pattern and the gate contact may horizontally overlap each other.

According to an embodiment of the inventive concept, a semiconductor device may include a gate electrode on a substrate and extending in a first direction, source/drain patterns spaced apart from each other, in a second direction, with the gate electrode interposed therebetween, a gate contact electrically connected to the gate electrode, and an active contact electrically connected to at least one of the source/drain patterns. The active contact may include a lower contact pattern electrically connected to the at least one of the source/drain patterns and an upper contact pattern electrically connected to a top surface of the lower contact pattern. The lower contact pattern may include a first end portion proximal to the gate contact and a second end portion distal from the gate contact. The upper contact pattern may be on the second end portion and is absent from the first end portion.

According to an embodiment of the inventive concept, a semiconductor device may include a gate electrode extending in a first direction on an active pattern on a substrate, source/drain patterns spaced apart from each other, in a second direction, with the gate electrode interposed therebetween, a gate contact electrically connected to the gate electrode, an active contact electrically connected to at least one of the source/drain patterns, a gate insulating layer between the active pattern and the gate electrode, a gate capping pattern on the gate electrode, a first via on the active contact, a second via on the gate contact, interconnection lines electrically connected to the first via or the second via, and an interlayer insulating layer on the gate capping pattern. The active contact may include a lower contact pattern electrically connected to the at least one of the source/drain patterns and an upper contact pattern electrically connected to a top surface of the lower contact pattern. The lower contact pattern may have a first width in the first direction, and the upper contact pattern may have a second width in the first direction that is smaller than the first width. The upper contact pattern and the gate contact may horizontally overlap each other.

According to an embodiment of the inventive concept, a method of fabricating a semiconductor device may include forming a first active pattern on a substrate, forming a source/drain pattern on the first active pattern, forming a gate electrode on the first active pattern, forming an interlayer insulating layer on the gate electrode and the source/drain pattern, forming a contact hole to penetrate the interlayer insulating layer and to expose the source/drain pattern, forming a lower contact pattern in a lower portion of the contact hole, forming a sacrificial layer on the lower contact pattern in the contact hole, removing a portion of the sacrificial layer to form a sacrificial pattern including a first opening, forming a mold pattern in the first opening, and replacing the sacrificial pattern with an upper contact pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1A:
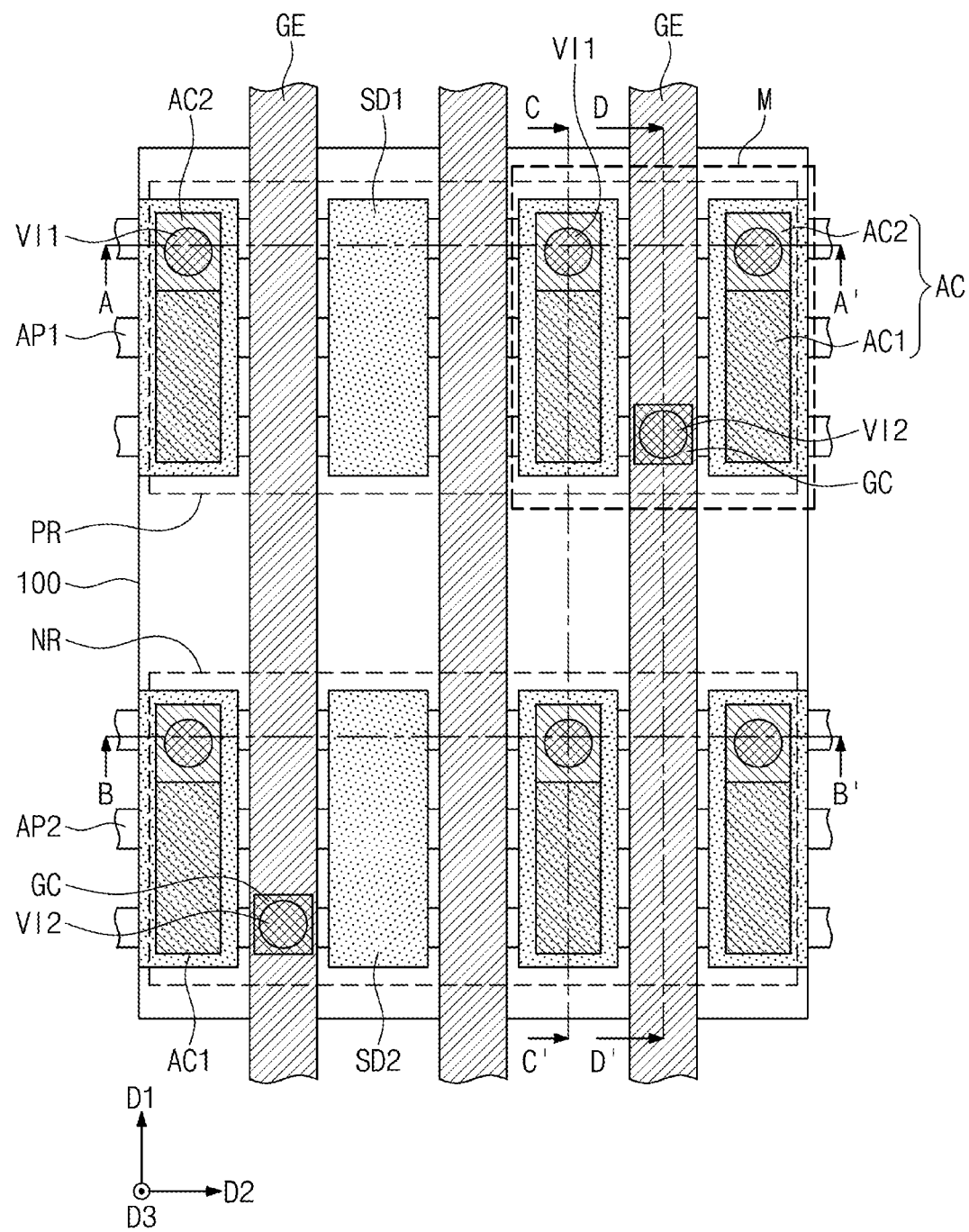
FIG. 1A is a plan view illustrating a semiconductor device according to an embodiment of the inventive concept.
Figure 1B:
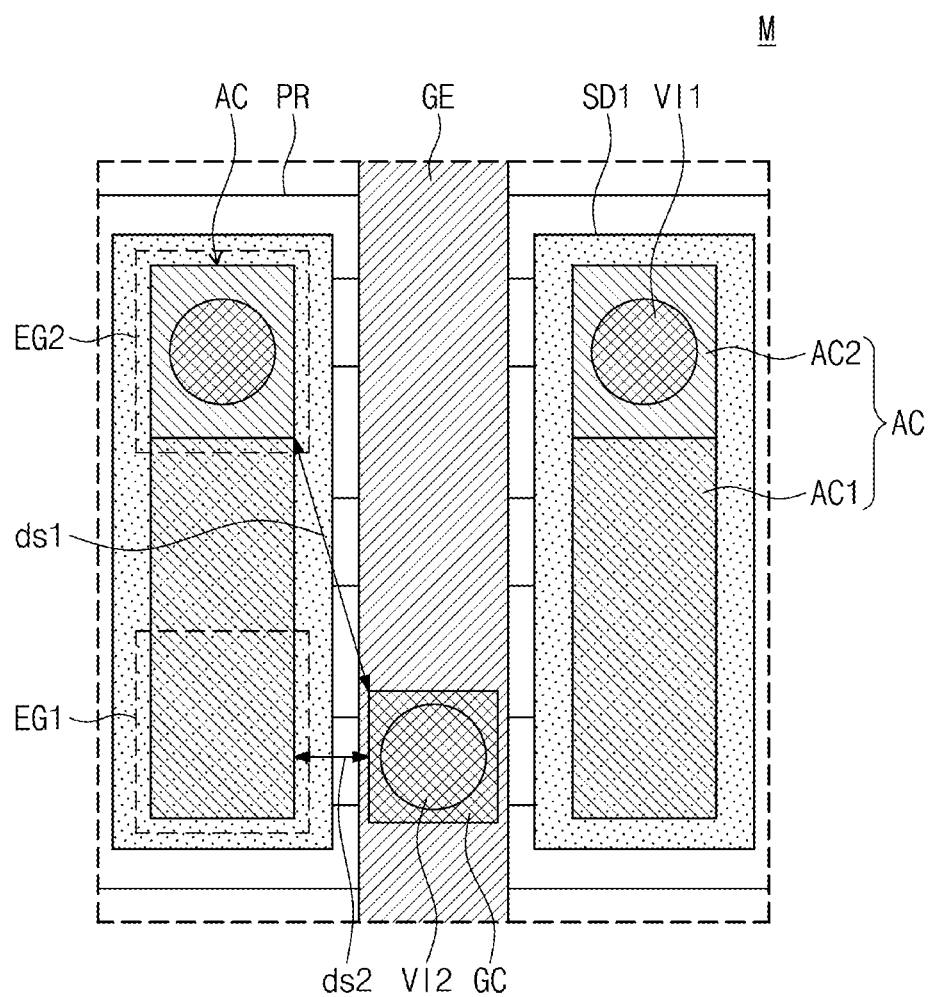
FIG. 1B is an enlarged view illustrating a region 'M' of FIG. 1A.

FIG. 1A is a plan view illustrating a semiconductor device according to an embodiment of the inventive concept. FIG. 1B is an enlarged view illustrating a region 'M' of FIG. 1A. FIGS. 2A to 2D are sectional views taken along lines A-A', B-B', C-C', and D-D', respectively, of FIG. 1A. FIG. 3A is an enlarged sectional view illustrating a region 'Q' of FIG. 2C.

Referring to FIGS. 1A, 2A to 2D, and 3A, a substrate 100 including a first active region PR and a second active region NR may be provided. The substrate 100 may be a semiconductor substrate, which is formed of and/or includes silicon, germanium, silicon-germanium, or the like, or a compound semiconductor substrate. As an example, the substrate 100 may be a silicon wafer.

In an embodiment, the first and second active regions PR and NR may be logic cell regions, on which logic transistors constituting a logic circuit of the semiconductor device are disposed. For example, logic transistors constituting the logic circuit may be disposed on the logic cell region of the substrate 100. The first active region PR and the second active region NR may include some portions (e.g., source/drain electrodes) of the logic transistors. The first active region PR may be a PMOSFET region, and the second active region NR may be an NMOSFET region.

The first and second active regions PR and NR may be defined by a second trench TR2, which is formed in an upper portion of the substrate 100. The second trench TR2 may be placed between the first active region PR and the second active region NR. The first and second active regions PR and NR may be spaced apart from each other, in a first direction D1, with the second trench TR2 interposed therebetween. Each of the first and second active regions PR and NR may be extended in a second direction D2 that is different from the first direction D1.

First active patterns AP1 and second active patterns AP2 may be provided on the first active region PR and the second active region NR, respectively. The first and second active patterns AP1 and AP2 may be extended in the second direction D2 to be parallel to each other. The first and second active patterns AP1 and AP2 may be vertically protruding portions of the substrate 100. A first trench TR1 may be defined between adjacent ones of the first active patterns AP1 and between adjacent ones of the second active patterns AP2. The first trench TR1 may be shallower than the second trench TR2.

A device isolation layer ST may be provided to fill the first and second trenches TR1 and TR2. The device isolation layer ST may include a silicon oxide layer. Upper portions of the first and second active patterns AP1 and AP2 may protrude vertically above the device isolation layer ST (e.g., see FIG. 2D). Each of the upper portions of the first and second active patterns AP1 and AP2 may be shaped like a fin. The device isolation layer ST may not cover the upper portions of the first and second active patterns AP1 and AP2. The device isolation layer ST may be on (e.g., cover) lower side surfaces of the first and second active patterns AP1 and AP2.

First source/drain patterns SD1 may be provided on the upper portions of the first active patterns AP1. The first source/drain patterns SD1 may be impurity regions of a first conductivity type (e.g., p-type). A first channel pattern CH1 may be interposed between a pair of the first source/drain patterns SD1. Second source/drain patterns SD2 may be provided on the upper portions of the second active patterns AP2. The second source/drain patterns SD2 may be impurity regions of a second conductivity type (e.g., n-type). A second channel pattern CH2 may be interposed between a pair of the second source/drain patterns SD2.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The first source/drain patterns SD1 may include a semiconductor material (e.g., silicon germanium (SiGe)) whose lattice constant is larger than a lattice constant of a semiconductor material in the substrate 100. Accordingly, the first source/drain patterns SD1 may exert a compressive stress on the first channel patterns CH1. Moreover, the second source/drain patterns SD2 may include, for example, the same semiconductor material (e.g., silicon (Si)) as the substrate 100.

Gate electrodes GE may be provided to cross the first and second active patterns AP1 and AP2 and to extend in the first direction D1. The gate electrodes GE may be spaced apart from each other in the second direction D2. The gate electrodes GE may overlap the first and second channel patterns CH1 and CH2, when viewed in a plan view. Each of the gate electrodes GE may be provided to surround the top surface and both side surfaces of each of the first and second channel patterns CH1 and CH2.

Referring back to FIG. 2D, the gate electrode GE may be provided to face a first top surface TS1 of the first channel pattern CH1 and at least one of first side surfaces SW1 of the first channel pattern CH1. The gate electrode GE may be provided to face a second top surface TS2 of the second channel pattern CH2 and at least one of second side surfaces SW2 of the second channel pattern CH2. In other words, the transistor according to the present embodiment may be a three-dimensional field-effect transistor (e.g., FinFET), in which the gate electrode GE is provided to three-dimensionally surround the channel patterns CH1 and CH2.

Referring back to FIGS. 1 and 2A to 2D, a pair of gate spacers GS may be disposed on both side surfaces of each of the gate electrodes GE. The gate spacers GS may be extended along the gate electrodes GE and in the first direction D1. The top surfaces of the gate spacers GS may be higher than the top surfaces of the gate electrodes GE. The top surfaces of the gate spacers GS may be coplanar with a top surface of a first interlayer insulating layer 110, which will be described below. The gate spacers GS may be formed of and/or include at least one of silicon carbonitride (SiCN), silicon carbon oxynitride (SiCON), or silicon nitride (SiN). In an embodiment, the gate spacers GS may be provided to have a multi-layered structure, which includes at least two different materials selected from SiCN, SiCON, and SiN.

A gate capping pattern GP may be provided on each of the gate electrodes GE. The gate capping pattern GP may be extended along the gate electrode GE and in the first direction D1. The gate capping pattern GP may be formed of and/or include at least one of various materials that have an etch selectivity with respect to first and second interlayer insulating layers 110 and 120 to be described below. For example, the gate capping patterns GP may be formed of and/or include at least one of various nitrides (e.g., silicon oxynitride (SiON), SiCN, SiCON, and SiN).

A gate dielectric pattern GI may be interposed between the gate electrode GE and the first active pattern AP1 and between the gate electrode GE and the second active pattern AP2. The gate dielectric pattern GI may be extended along a bottom surface of the gate electrode GE thereon. As an example, the gate dielectric pattern GI may be on (e.g., cover) the first top surface TS1 and the first side surfaces SW1 of the first channel pattern CH1. The gate dielectric pattern GI may be on (e.g., cover) the second top surface TS2 and the second side surfaces SW2 of the second channel pattern CH2. The gate dielectric pattern GI may be on (e.g., cover) the top surface of the device isolation layer ST located below the gate electrode GE (e.g., see FIG. 2D).

In an embodiment, the gate dielectric pattern GI may be formed of and/or include a high-k dielectric material, whose dielectric constant is higher than that of a silicon oxide layer. As an example, the high-k dielectric material may include at least one of hafnium oxide, hafnium silicon oxide, hafnium zirconium oxide, hafnium tantalum oxide, or lanthanum oxide. In certain embodiments, the gate dielectric pattern GI may be formed of and/or include at least one of various ferroelectric materials. The gate dielectric pattern GI including the ferroelectric material may serve as a negative capacitor. The ferroelectric material of the gate dielectric pattern GI may include hafnium oxide, in which at least one of zirconium (Zr), silicon (Si), aluminum (Al), or lanthanum (La) is doped or otherwise contained.

The gate electrode GE may include a first metal pattern and a second metal pattern on the first metal pattern. The first metal pattern may be provided on the gate dielectric pattern GI and adjacent to the first and second channel patterns CH1 and CH2. The first metal pattern may include a work function metal, which can be used to adjust a threshold voltage of the transistor. By adjusting a thickness and composition of the first metal pattern, it may be possible to realize a transistor having a desired threshold voltage.

The first metal pattern may include a metal nitride layer. For example, the first metal pattern may contain at least one metal, which is selected from the group consisting of titanium (Ti), tantalum (Ta), aluminum (Al), tungsten (W), and molybdenum (Mo), in addition to nitrogen (N). The first metal pattern may further include carbon (C). The first metal pattern may include a plurality of work function metal layers, which are stacked on the substrate 100.

The second metal pattern may include a metallic material whose resistance is lower than the first metal pattern. For example, the second metal pattern may include at least one metal selected from the group consisting of tungsten (W), aluminum (Al), titanium (Ti), and tantalum (Ta).

A first interlayer insulating layer 110 may be provided on the substrate 100. The first interlayer insulating layer 110 may be on (e.g., cover) the gate spacers GS and the first and second source/drain patterns SD1 and SD2. A top surface of the first interlayer insulating layer 110 may be substantially coplanar with top surfaces of the gate capping patterns GP and the top surfaces of the gate spacers GS. A second interlayer insulating layer 120 may be provided on the first interlayer insulating layer 110 to be on (e.g., to cover) the gate capping patterns GP. A third interlayer insulating layer 130 may be provided on the second interlayer insulating layer 120. For example, the first to third interlayer insulating layers 110, 120, and 130 may be formed of and/or include silicon oxide.

Active contacts AC, which are electrically and respectively connected to the first and second source/drain patterns SD1 and SD2, may be provided to penetrate the first and second interlayer insulating layers 110 and 120. Each of the active contacts AC may be provided between each pair of the gate electrodes GE.

The active contact AC may be a self-aligned contact. In other words, the active contact AC may be formed in a self-aligned manner using the gate capping pattern GP and the gate spacer GS. For example, the active contact AC may be on (e.g., cover) at least a portion of the side surface of the gate spacer GS. Although not shown, the active contact AC may be on (e.g., cover) a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected to the second source/drain pattern SD1 or SD2 through the silicide pattern SC. The silicide pattern SC may be formed of and/or include at least one of various metal silicides (e.g., titanium silicide, tantalum silicide, tungsten silicide, nickel silicide, and cobalt silicide).

Hereinafter, the active contact AC will be described in more detail. The active contact AC may include a lower contact pattern AC1 and an upper contact pattern AC2. The lower contact pattern AC1 may be electrically connected to the first source/drain pattern SD1 or the second source/drain pattern SD2 through the silicide pattern SC. The lower contact pattern AC1 may include a first conductive pattern FM1 and a first barrier pattern BM1. The first barrier pattern BM1 may be on (e.g., cover) side and bottom surfaces of the first conductive pattern FM1. The first barrier pattern BM1 may expose (e.g., be absent from at least a portion of) a top surface of the first conductive pattern FM1. The upper contact pattern AC2 may include a second conductive pattern FM2 and a second barrier pattern BM2. The second barrier pattern BM2 may be on (e.g., cover) side and bottom surfaces of the second conductive pattern FM2. The second barrier pattern BM2 may expose (e.g., be absent from at least a portion of) a top surface of the second conductive pattern FM2.

The first and second conductive patterns FM1 and FM2 may be formed of and/or include at least one of various metals (e.g., aluminum, copper, tungsten, molybdenum, and cobalt). The first conductive pattern FM1 and the second conductive pattern FM2 may include different materials from each other. As an example, the first conductive pattern FM1 may be formed of and/or include cobalt, and the second conductive pattern FM2 may be formed of and/or include tungsten. In certain embodiments, the first conductive pattern FM1 and the second conductive pattern FM2 may include the same material.

The first and second barrier patterns BM1 and BM2 may include a metal layer and/or a metal nitride layer. The metal layer may include at least one of titanium, tantalum, tungsten, nickel, cobalt, or platinum. The metal nitride layer may include at least one of a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer. The first barrier pattern BM1 and the second barrier pattern BM2 may include different materials from each other. As an example, the first barrier pattern BM1 may include a titanium nitride layer, and the second barrier pattern BM2 may include a tungsten nitride layer. Alternatively, the first barrier pattern BM1 and the second barrier pattern BM2 may include the same material. The first barrier pattern BM1 and the second barrier pattern BM2 may have different thicknesses from each other.

On the device isolation layer ST filling the second trench TR2, at least one gate contact GC may be provided to penetrate the second interlayer insulating layer 120 and the gate capping pattern GP and may be electrically connected to the gate electrode GE. The gate contact GC may include a third conductive pattern FM3 and a third barrier pattern BM3. The third barrier pattern BM3 may be on (e.g., cover) side and bottom surfaces of the third conductive pattern FM3. The third barrier pattern BM3 may expose (e.g., be absent from at least a portion of) a top surface of the third conductive pattern FM3.

The third conductive pattern FM3 may be formed of and/or include at least one of various metals (e.g., aluminum, copper, tungsten, molybdenum, and cobalt). The third conductive pattern FM3 and the second conductive pattern FM2 may include different materials from each other. As an example, the third conductive pattern FM3 may be formed of and/or include cobalt, and the second conductive pattern FM2 may be formed of and/or include tungsten. In certain embodiments, the third conductive pattern FM3 and the second conductive pattern FM2 may be formed of and/or include the same material. The third barrier pattern BM3 may include a metal layer and/or a metal nitride layer. The third barrier pattern BM3 and the second barrier pattern BM2 may include different materials from each other. As an example, the third barrier pattern BM3 may include a titanium nitride layer, and the second barrier pattern BM2 may include a tungsten nitride layer. In certain embodiments, the third barrier pattern BM3 and the second barrier pattern BM2 may include the same material. The third barrier pattern BM3 and the second barrier pattern BM2 may have different thicknesses from each other.

At least one of the gate contacts GC may be provided on the first active region PR or the second active region NR. At least one of the gate contacts GC may be provided between the first active region PR and the second active region NR. At least one of the gate contacts GC, which are provided on the first active region PR or the second active region NR, may be disposed adjacent to the active contact AC in the second direction D2 or in an opposite direction of the second direction D2. In an embodiment, referring to FIG. 1B, the gate contact GC may be disposed adjacent to the active contact AC in the second direction D2. The gate contact GC may be disposed between an adjacent pair of the active contacts AC.

As shown in FIGS. 1B and 3A, the upper contact pattern AC2 may be on (e.g., cover) a portion of a top surface C1T of the lower contact pattern AC1 and may expose (i.e., be absent from) another portion of the top surface C1T. The lower contact pattern AC1 may be a bar-shaped pattern extending in the first direction D1. The upper contact pattern AC2 may be disposed at the same level as the gate contact GC. For example, at least a portion of the upper contact pattern AC2 may be horizontally overlapped (e.g., in a direction that is oblique to the first direction D1 and the second direction D2) with at least a portion of the gate contact GC. Accordingly, at least a portion of the upper contact pattern AC2 may be in the same horizontal D1-D2 plane as at least a portion of the gate contact GC. The upper contact pattern AC2 may be disposed at a position that is maximally/distally spaced apart from the gate contact GC. In an embodiment, the lower contact pattern AC1 may include a first end portion EG1, which is located near (i.e., closer/proximal to) the gate contact GC, and a second end portion EG2, which is spaced apart at a greater distance (i.e., distal) from the gate contact GC. The upper contact pattern AC2 may be provided on the second end portion EG2 to expose (e.g., to be absent from) the first end portion EG1. As a result, when viewed in a plan view, a first distance ds1 between the gate contact GC and the upper contact pattern AC2 may be larger than a second distance ds2 between the gate and active contacts GC and AC (in particular, the lower contact pattern AC1). The first distance ds1 may be along a direction that is oblique to the first direction D1 and the second direction D2, whereas the second distance ds2 may be along the second direction D2.

The gate contacts GC and the active contacts AC may be formed at the same level from the substrate 100. As an integration density of the semiconductor device increases, the distance between the gate contacts GC and the active contacts AC may decrease, and in this case, the gate and active contacts GC and AC disposed at the same level may be undesirably connected to each other. According to an embodiment of the inventive concept, since the upper contact pattern AC2 is formed at a position far from the gate contact GC, it may be possible to protect/prevent the active contact AC from being connected to the gate contact GC.

The active contact AC may be provided in a contact hole 112 penetrating the first interlayer insulating layer 110 and the second interlayer insulating layer 120. The lower contact pattern AC1 may be provided in a lower portion of the contact hole 112, and the upper contact pattern AC2 may be provided in an upper portion of the contact hole 112. A portion of the upper portion of the contact hole 112 may be occupied by the upper contact pattern AC2, and the remaining portion may be filled with a mold pattern 119. The mold pattern 119 may be formed of and/or include silicon oxide, silicon nitride, or silicon oxynitride.

In an embodiment, a portion of the top surface C1T of the lower contact pattern AC1 may be electrically connected to the upper contact pattern AC2, and a remaining portion may be on (e.g., in physical contact with) the mold pattern 119. The upper contact pattern AC2 and the mold pattern 119 may have top surfaces that are coplanar with the top surface of the second interlayer insulating layer 120.

As shown in FIG. 3A, the upper contact pattern AC2 may include a first side surface S1 and a second side surface S2, when viewed in a sectional view. The first side surface S1 may be inclined at a first angle $\alpha 1$ to the top surface C1T of the lower contact pattern AC1, and the second side surface S2 may be inclined at a second angle $\alpha 2$ to the top surface C1T of the lower contact pattern AC1. The first angle $\alpha 1$ may be an angle between the first side surface Si and a bottom surface C2B of the upper contact pattern AC2, and the second angle $\alpha 2$ may be an angle between the second side surface S2 and the bottom surface C2B of the upper contact pattern AC2.

In an embodiment, one of the first and second angles $\alpha 1$ and $\alpha 2$ may be an acute angle, and the other may be an obtuse angle. The first and second angles $\alpha 1$ and $\alpha 2$ may be measured based on a top surface of the lower contact pattern AC1 overlapped by (e.g., covered with) the upper contact pattern AC2. In an embodiment, the first angle α1 may be an obtuse angle, and the second angle α2 may be an acute angle.

In an embodiment, the upper contact pattern AC2 may have a parallelogram section, not a rectangular section. For example, a center axis of the upper contact pattern AC2 passing through centers of top and bottom surfaces may not be perpendicular to a top surface of the lower contact pattern AC1. The first side surface S1 may be continuously extended from (e.g., aligned with) the side surface of the lower contact pattern AC1.

Figure 2A:
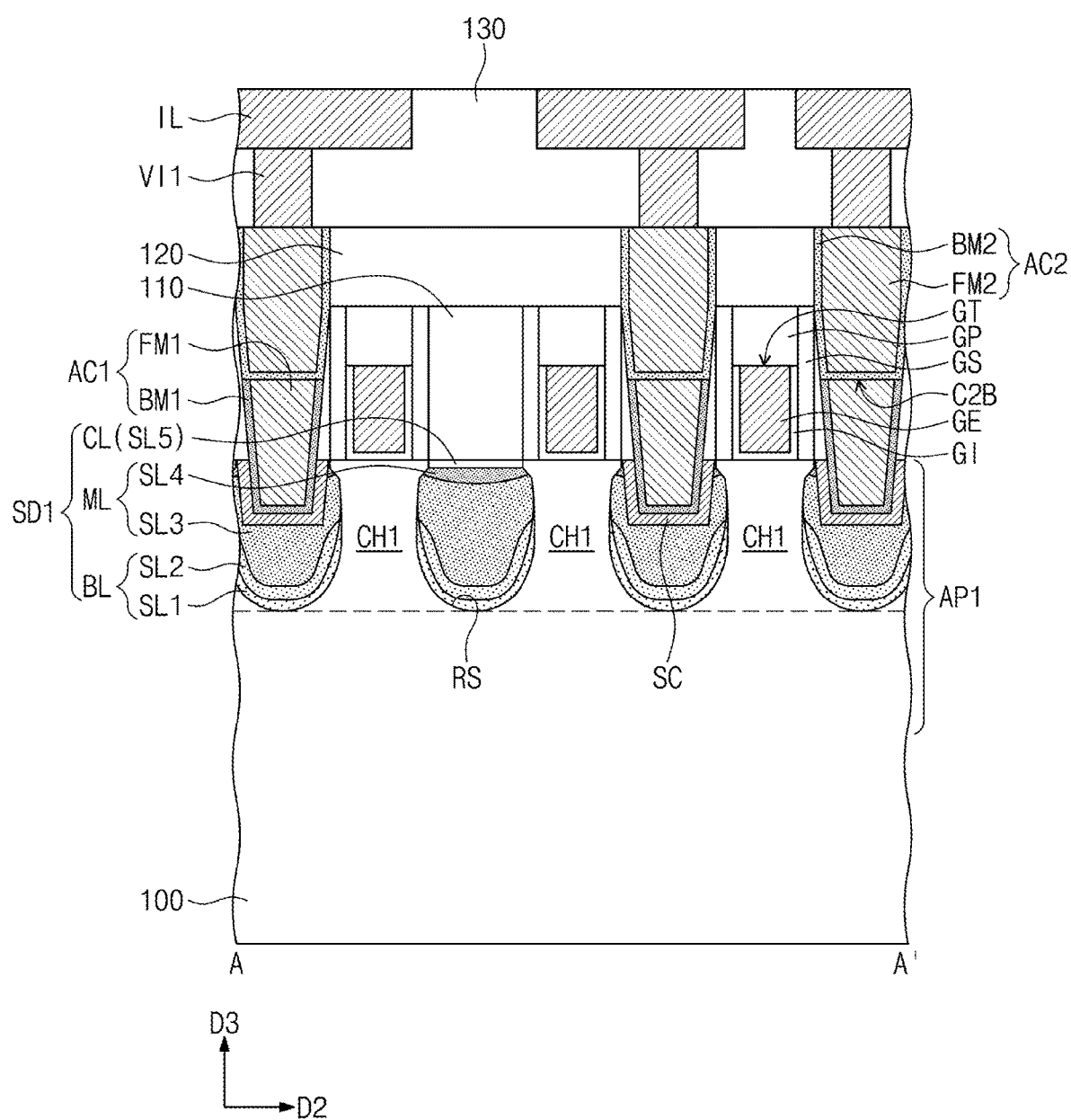
FIGS. 2A to 2D are sectional views taken along lines A-A', B-B', C-C', and D-D', respectively, of FIG. 1A.
Figure 2B:
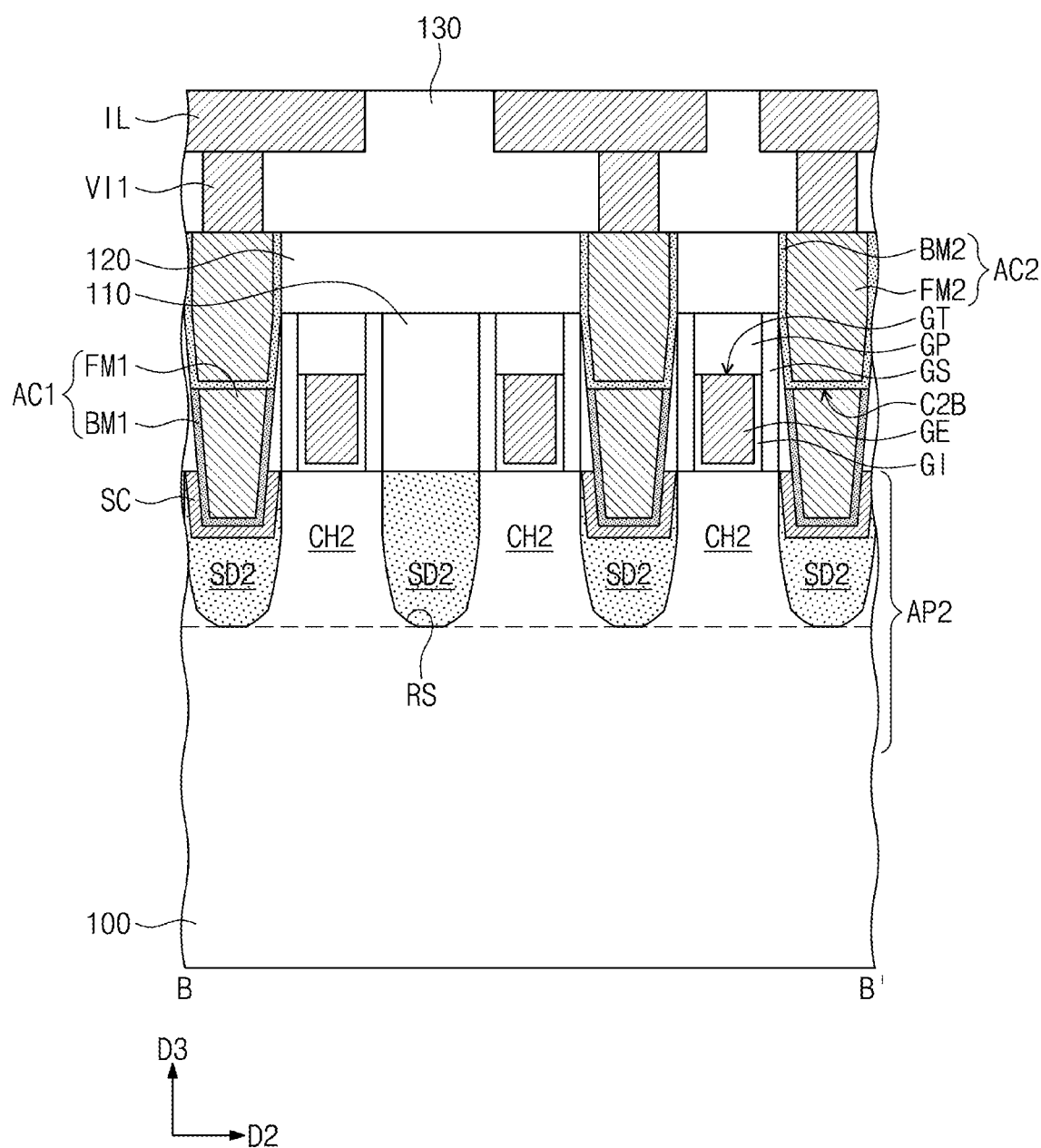
Figure 2D:
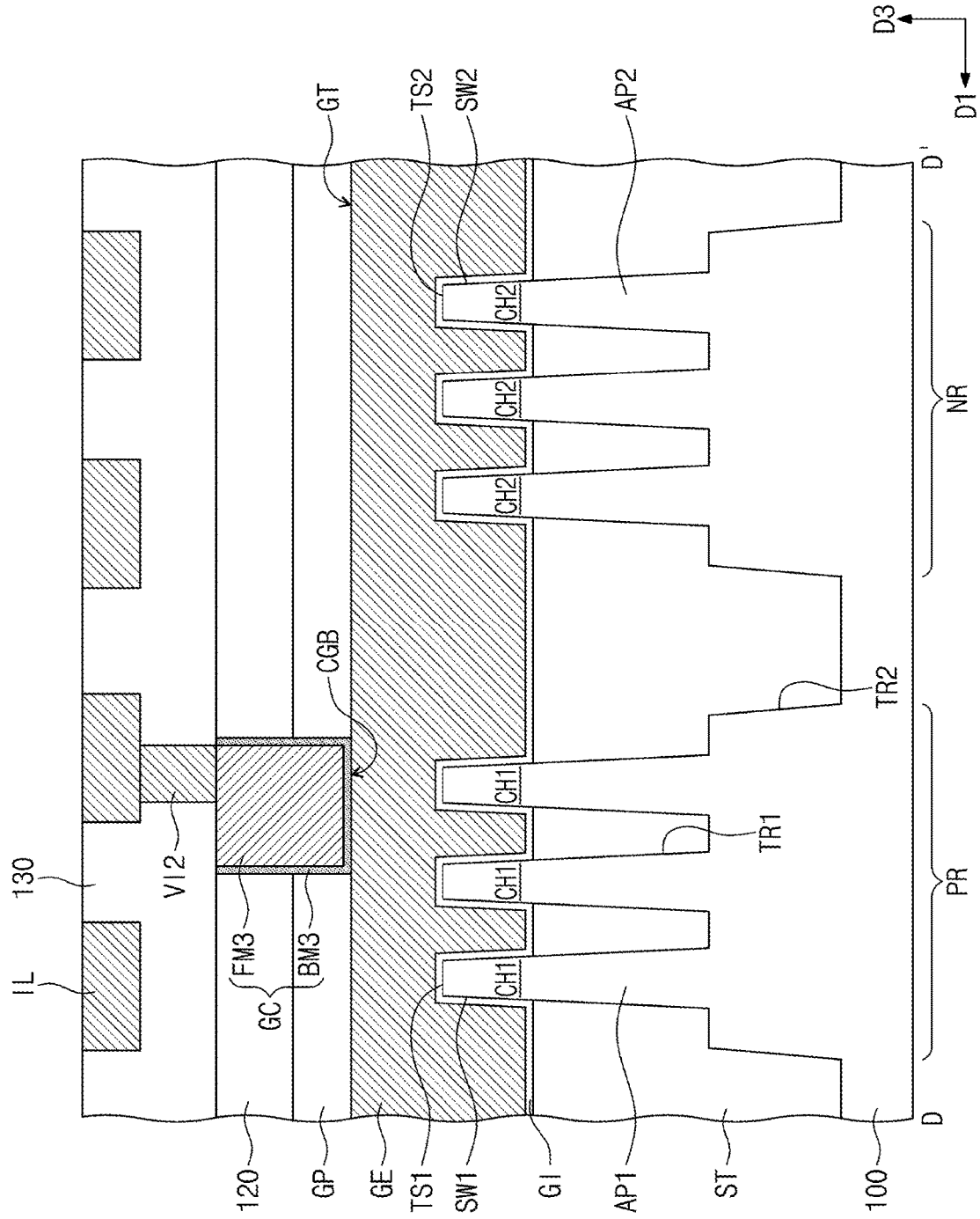
Figure 3A:
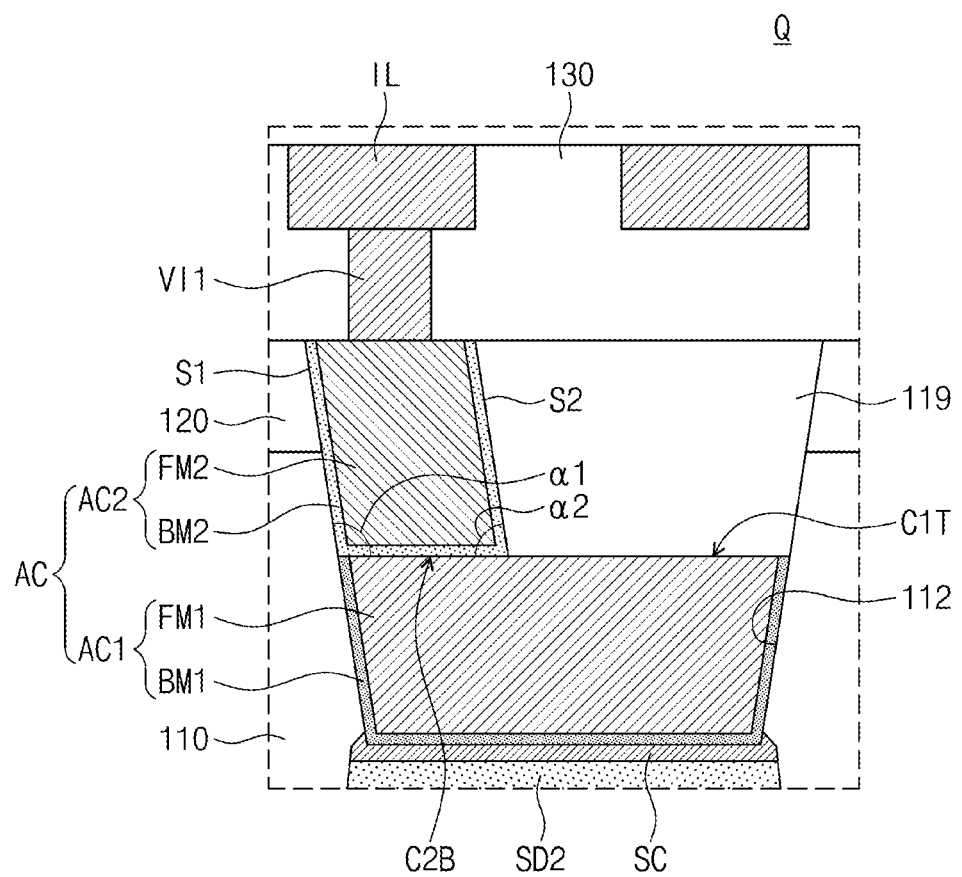
FIG. 3A is an enlarged sectional view illustrating a region 'Q' of FIG. 2C.

As shown in FIGS. 2A and 2B, the bottom surface C2B of the upper contact pattern AC2 may be lower than a top surface GT of the gate electrode GE. In certain embodiments, the bottom surface C2B of the upper contact pattern AC2 may be higher than or equal to the top surface GT of the gate electrode GE. As shown in FIG. 2D, a bottom surface GCB of the gate contact GC may be located at substantially the same level as the top surface GT of the gate electrode GE. The bottom surface C2B of the upper contact pattern AC2 may be lower than the bottom surface GCB of the gate contact GC.

A first via VI1 may be provided on the upper contact pattern AC2, and a second via VI2 may be provided on the gate contact GC. The first via VI1 and the second via VI2 may be provided in the third interlayer insulating layer 130. The first via VI1 and the second via VI2 may be located at the same level (i.e., may horizontally overlap each other). The first via VI1 and the second via VI2 may be formed of and/or include the same material. In an embodiment, the first via VI1 and the second via VI2 may include a conductive pattern and a barrier pattern enclosing the conductive pattern. The conductive pattern may be formed of and/or include at least one of various metals (e.g., aluminum, copper, tungsten, molybdenum, or cobalt). The barrier pattern may include a metal nitride layer (e.g., a titanium nitride (TiN) layer, a tantalum nitride (TaN) layer, or a tungsten nitride (WN) layer).

A plurality of interconnection lines IL may be provided in the third interlayer insulating layer 130. Each of the interconnection lines IL may be extended in the second direction D2. The first via VI1 may be provided between a first interconnection line of the interconnection lines IL and the active contact AC. The first interconnection line may be electrically connected to the active contact AC through the first via VI1. The second via VI2 may be provided between a second interconnection line of the interconnection lines IL and the gate contact GC. The second interconnection line may be electrically connected to the gate contact GC through the second via VI2.

Although not shown, a plurality of additional interconnection layers stacked on the interconnection lines IL may be further provided. Logic cells, which are connected to each other through the interconnection lines IL and the interconnection layers, may constitute a logic circuit.

Hereinafter, the first source/drain pattern SD1 will be described in more detail with reference to FIGS. 2A, 2C, and 3. A recess RS may be formed in an upper portion of the first active pattern AP1. The recess RS may be formed between an adjacent pair of the first channel patterns CH1. The first source/drain pattern SD1 may be provided in the recess RS.

The first source/drain pattern SD1 may include a buffer layer BL, a main layer ML on the buffer layer BL, and a capping layer CL on the main layer ML. In an embodiment, the buffer layer BL may include first and second semiconductor layers SL1 and SL2. The main layer ML may include third and fourth semiconductor layers SL3 and SL4. The capping layer CL may include a fifth semiconductor layer SL5. In certain embodiments, the buffer layer BL may be composed of a single semiconductor layer. The main layer ML may also be composed of a single semiconductor layer.

Each of the buffer and main layers BL and ML may include a semiconductor material whose lattice constant is greater than a lattice constant of a semiconductor material of the substrate 100. In the case where the substrate 100 includes silicon (Si), the buffer layer BL and the main layer ML may be formed of and/or include silicon-germanium (SiGe). A lattice constant of germanium (Ge) may be larger than that of silicon (Si).

In detail, the buffer layer BL may contain germanium (Ge) of a relatively low concentration. As an example, the germanium (Ge) concentration of the first semiconductor layer SL1 of the buffer layer BL may range from 10 at % to 25 at %. The germanium (Ge) concentration of the second semiconductor layer SL2 of the buffer layer BL may be higher than the germanium (Ge) concentration of the first semiconductor layer SL1. The germanium (Ge) concentration of the second semiconductor layer SL2 may range from 25 at % to 45 at %. The germanium (Ge) concentration of the buffer layer BL may increase in a third direction D3.

The main layer ML may contain germanium (Ge) of a relatively high concentration. As an example, the germanium (Ge) concentration of the third semiconductor layer SL3 of the main layer ML may range from 50 at % to 60 at %. The germanium (Ge) concentration of the fourth semiconductor layer SL4 of the main layer ML may be higher than the germanium (Ge) concentration of the third semiconductor layer SL3. The germanium (Ge) concentration of the fourth semiconductor layer SL4 may range from 55 at % to 70 at %. The germanium (Ge) concentration of the main layer ML may increase in the third direction D3.

The buffer layer BL and the main layer ML may include impurities (e.g., boron), allowing the first source/drain pattern SD1 to have the p-type conductivity. A concentration (e.g., atomic percent) of impurities in the main layer ML may be higher than that in the buffer layer BL.

The fifth semiconductor layer SL5 of the capping layer CL may include the same semiconductor material as that in the substrate 100. As an example, the fifth semiconductor layer SL5 may contain silicon (Si) and may have a single crystalline structure. The silicon (Si) concentration of the fifth semiconductor layer SL5 may range from 95 at % to 100 at %. The germanium (Ge) concentration of the fifth semiconductor layer SL5 may range from 0 at % to 5 at %. In an embodiment, germanium (Ge) in the fourth semiconductor layer SL4 may be diffused into the fifth semiconductor layer SL5, and in this case, the fifth semiconductor layer SL5 may contain a tiny amount of germanium (Ge) (e.g., lower than 5 at %).

A sectional shape, in the first direction D1, of the first source/drain pattern SD1 will be described with reference to FIG. 2C. The buffer layer BL may be provided on each of the first active patterns AP1. The buffer layers BL on three first active patterns AP1 may have top surfaces located at different levels. For example, the buffer layer BL located on the second one of the first active patterns AP1 may be located at a level that is lower than the buffer layers BL located on the first and third ones of the first active patterns AP1.

The main layer ML may be provided on the first active patterns AP1. For example, the main layers ML, which are respectively provided on the first active patterns AP1, may be merged to form a single main layer ML on the first active patterns AP1.

The main layer ML may include a first surface FA1, a second surface FA2, a third surface FA3, and a fourth surface FA4. The first to fourth surfaces FA1 to FA4 may be surfaces of the third semiconductor layer SL3. The first to fourth surfaces FA1 to FA4 may be substantially the same crystal plane. The first to fourth surfaces FA1-FA4 may be the (111) crystal planes.

An edge SE of the main layer ML may be defined by the first surface FA1 and the second surface FA2 or by the third surface FA3 and the fourth surface FA4. The edge SE may horizontally protrude in a direction away from the first active patterns AP1. For example, the edge SE may protrude in a direction parallel to the first direction D1.

The capping layer CL may be provided on the main layer ML. The capping layer CL may be on (e.g., cover) the first to fourth surfaces FA1 to FA4 of the main layer ML. The capping layer CL may be on (e.g., cover) the edge SE of the main layer ML. The first source/drain pattern SD1 may have the largest width in the first direction D1, at a level of the edge SE of the main layer ML.

Figure 2C:
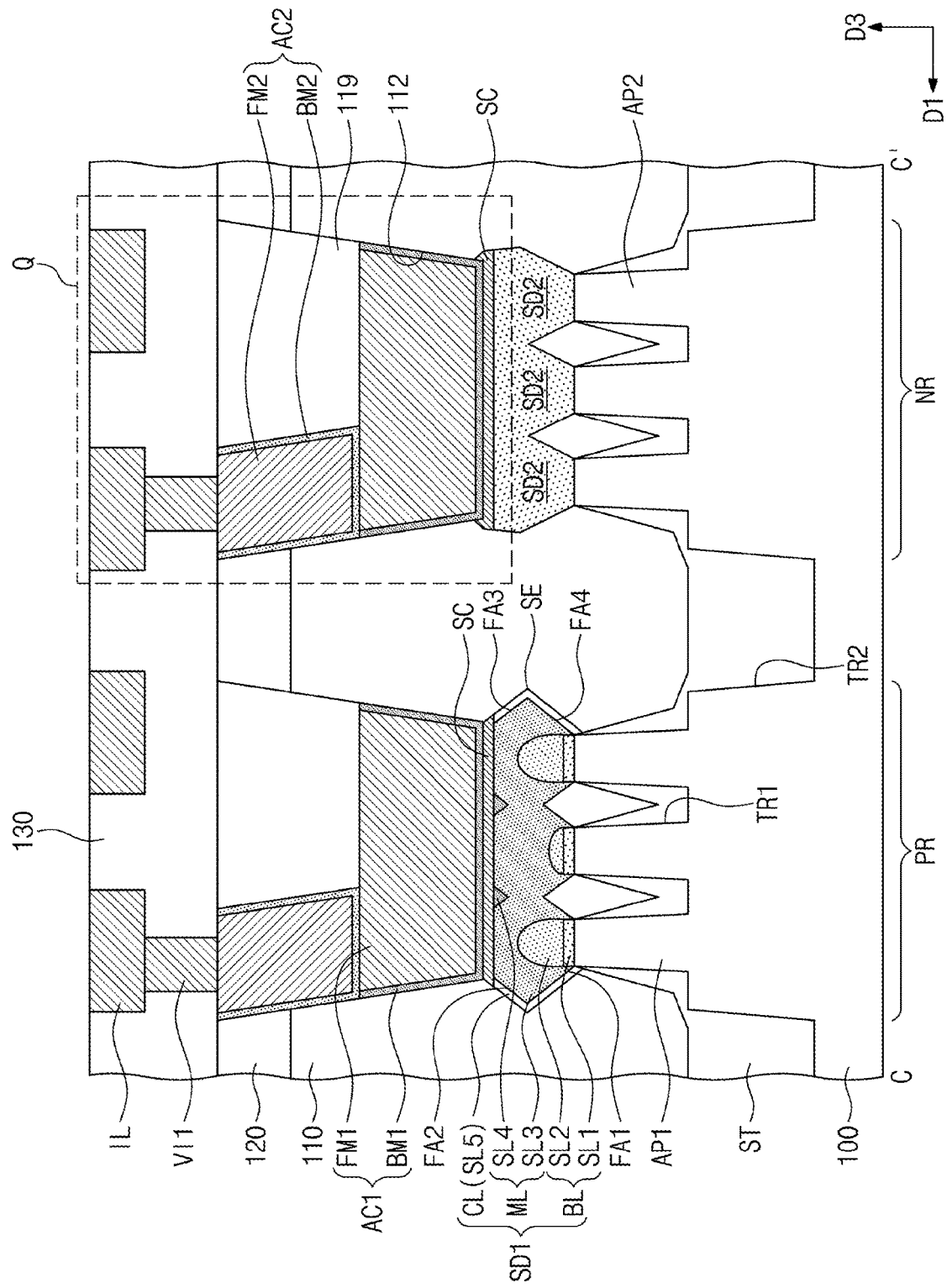
Figure 3B:
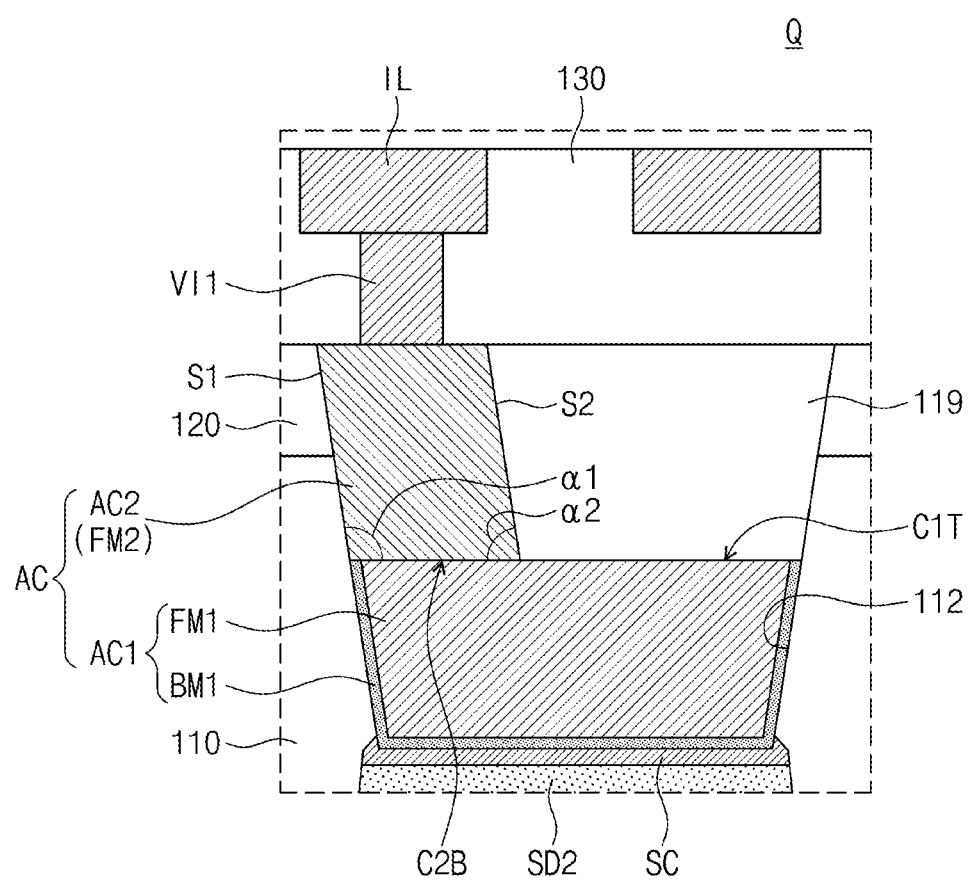
FIGS. 3B, 3C, and 3D are enlarged sectional views illustrating the region 'Q' of FIG. 2C according to other embodiments of the inventive concept.
Figure 3C:
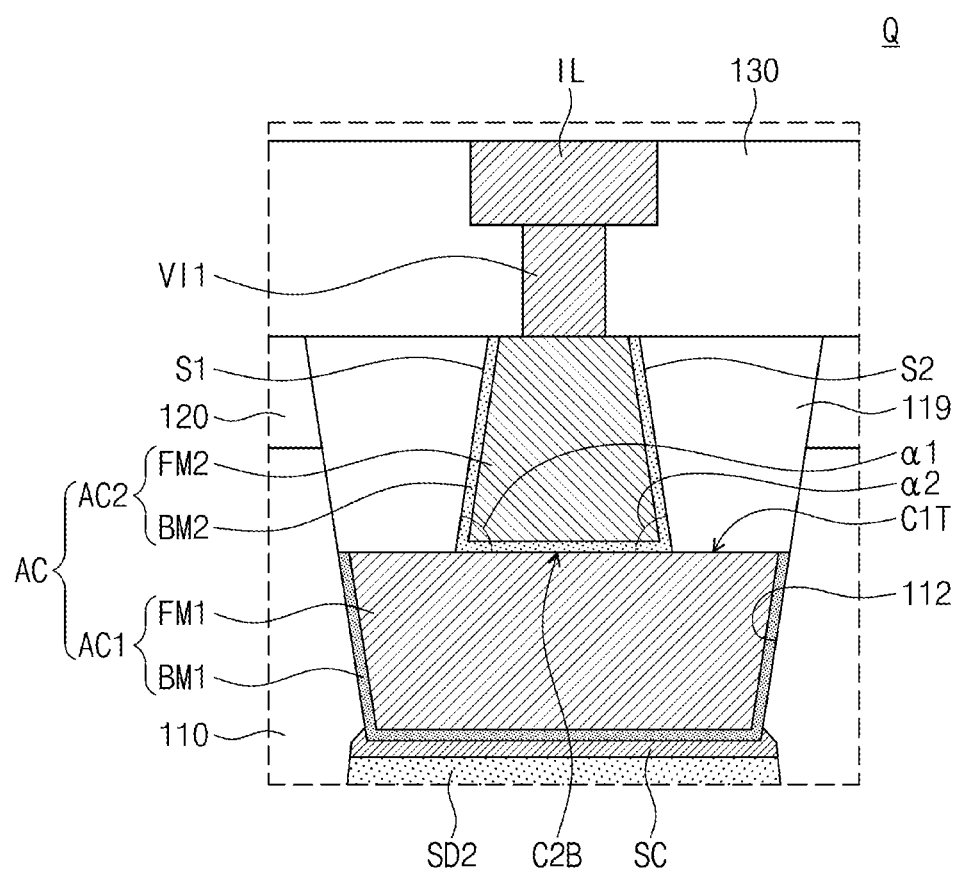
Figure 3D:
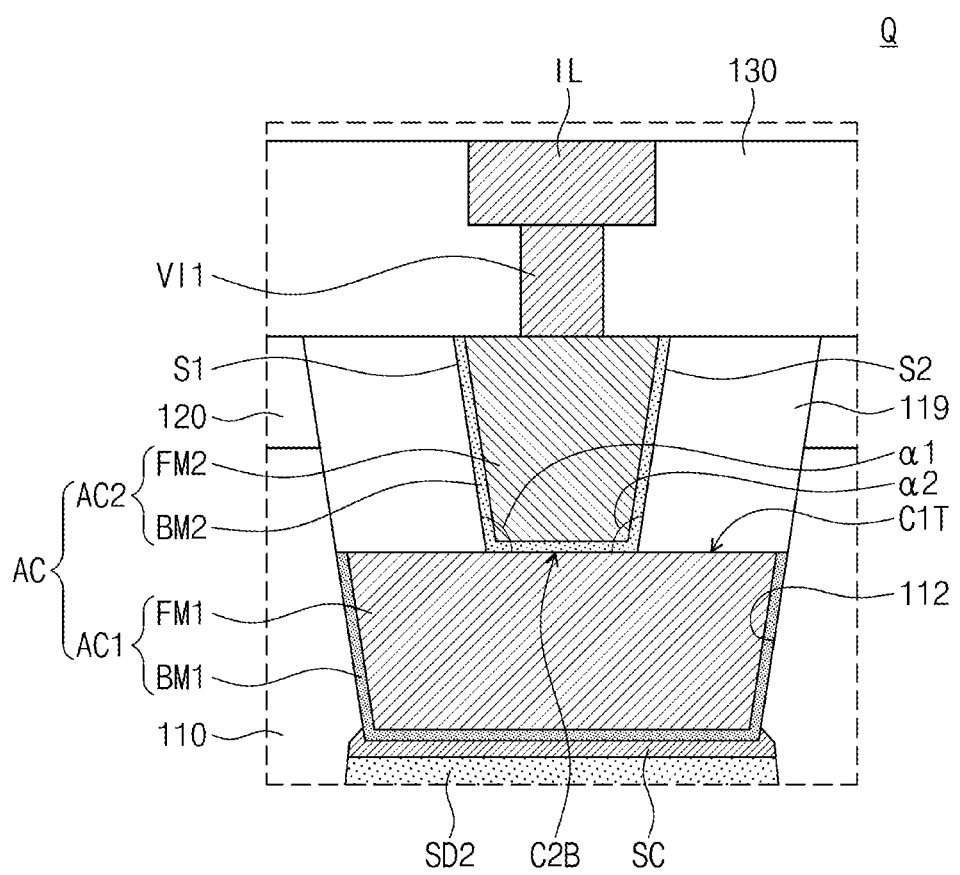

FIGS. 3B, 3C, and 3D are enlarged sectional views illustrating the region 'Q' of FIG. 2C according to other embodiments of the inventive concept.

Referring to FIG. 3B, the upper contact pattern AC2 may not include a barrier pattern, unlike the structure shown in FIG. 3A. The upper contact pattern AC2 may include the second conductive pattern FM2, and a bottom surface of the second conductive pattern FM2 may be the bottom surface C2B of the upper contact pattern AC2.

Referring to FIGS. 3C and 3D, the upper contact pattern AC2 may include the first side surface S1 and the second side surface S2, when viewed in a sectional view. The first side surface S1 may be inclined at the first angle α1 to the top surface C1T of the lower contact pattern AC1, and the second side surface S2 may be inclined at the second angle α2 to the top surface C1T of the lower contact pattern AC1. The first angle α1 may be an angle between the first side surface S1 and the bottom surface C2B of the upper contact pattern AC2, and the second angle α2 may be an angle between the second side surface S2 and the bottom surface C2B of the upper contact pattern AC2.

As shown in FIG. 3C, both of the first and second angles α1 and α2 may be acute. In this case, the bottom surface C2B of the upper contact pattern AC2 may be wider than the top surface of the upper contact pattern AC2. Alternatively, as shown in FIG. 3D, both of the first and second angles α1 and α2 may be obtuse. In this case, the bottom surface C2B of the upper contact pattern AC2 may be narrower than the top surface of the upper contact pattern AC2. In each of the embodiments of FIGS. 3C and 3D, the first and second angles α1 and α2 may be the same, and the upper contact pattern AC2 may have an isosceles trapezoidal section.

According to an embodiment of the inventive concept, the distance between the upper contact pattern AC2 and the gate contact GC may be increased, and in this case, it may be possible to protect/prevent the contacts from being unintentionally connected to each other and to secure the reliability of the semiconductor device.

Figure 11A:
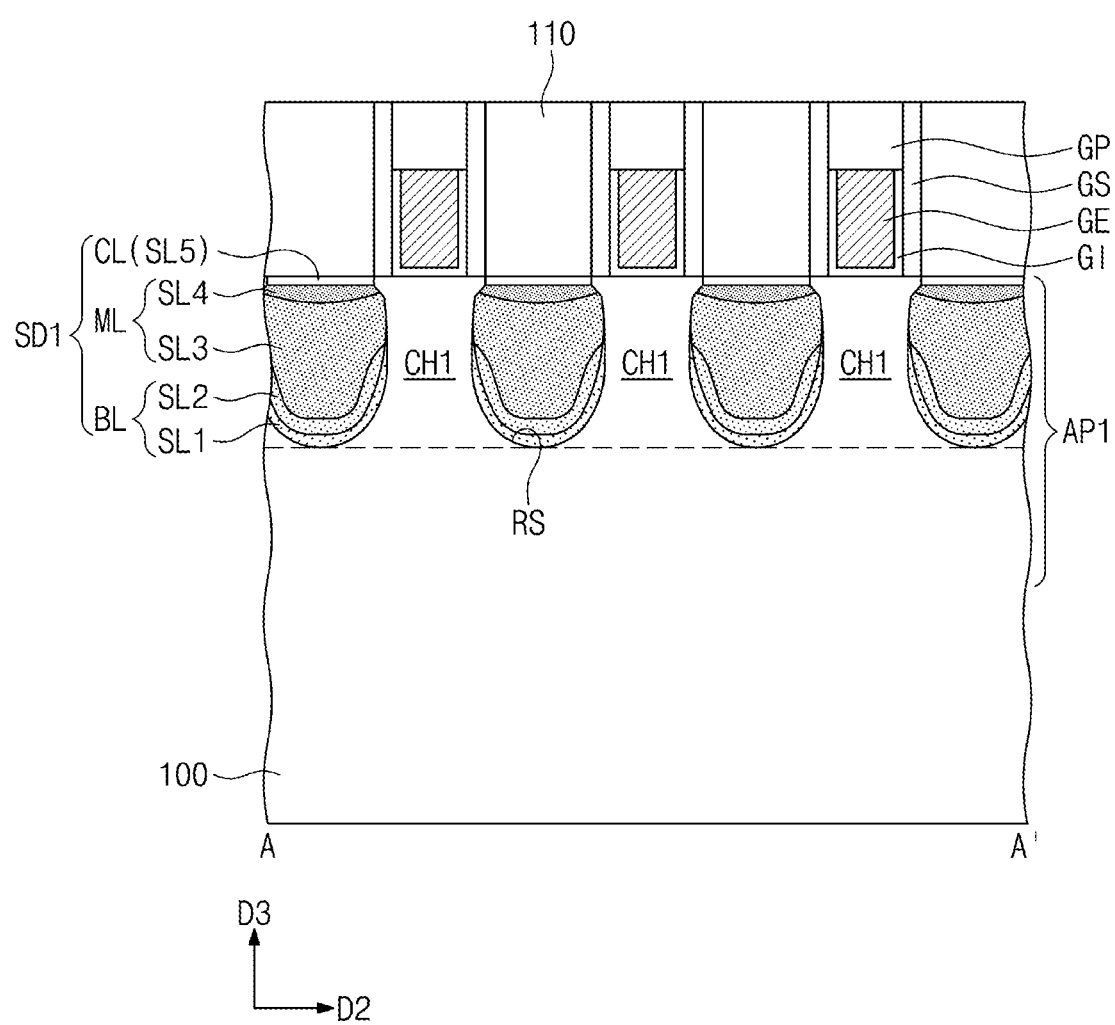
Figure 11B:
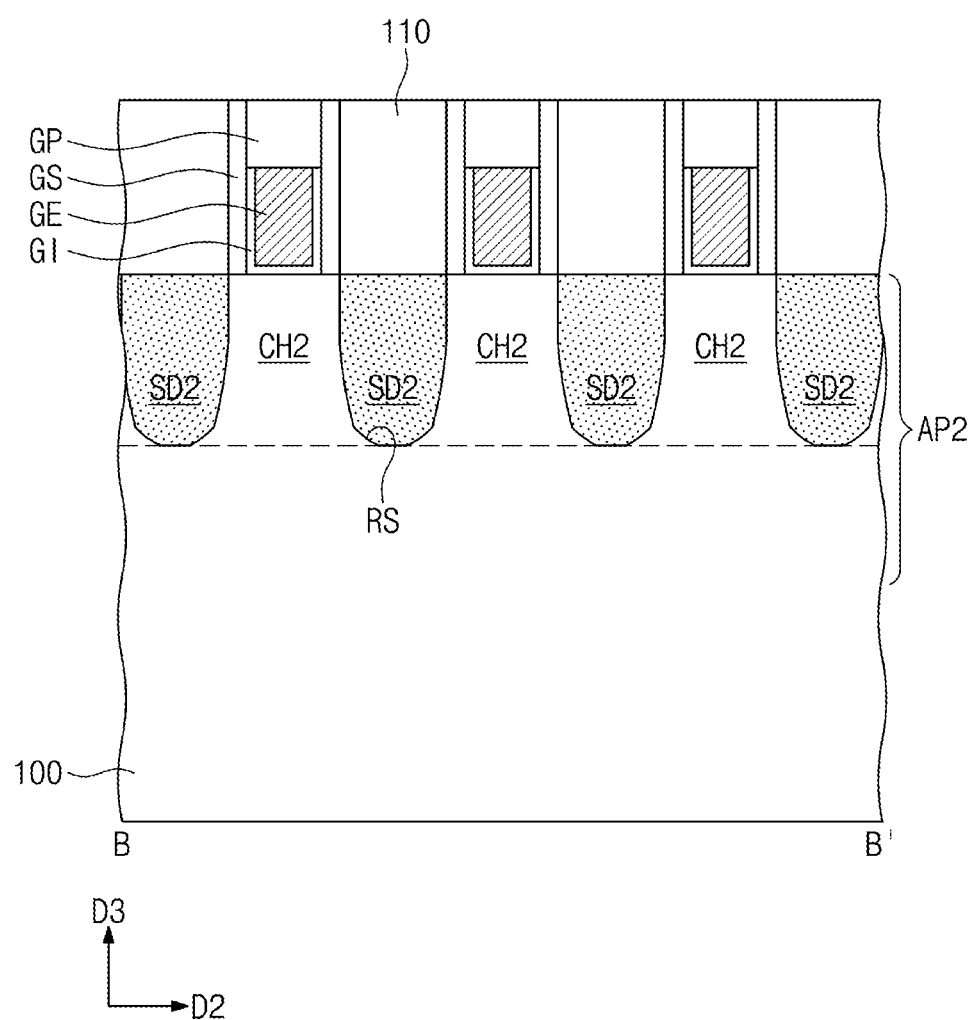
Figure 11C:
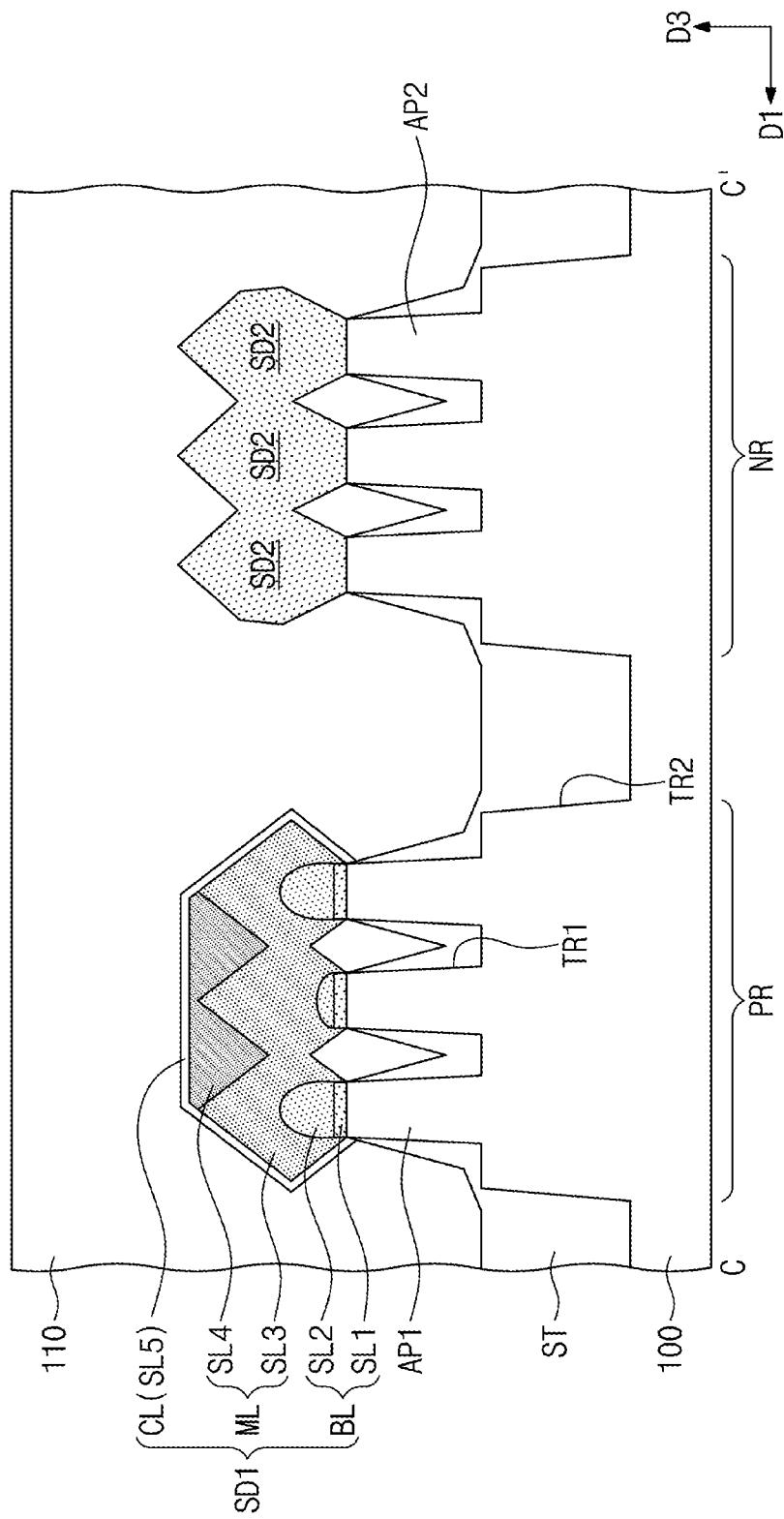
Figure 11D:
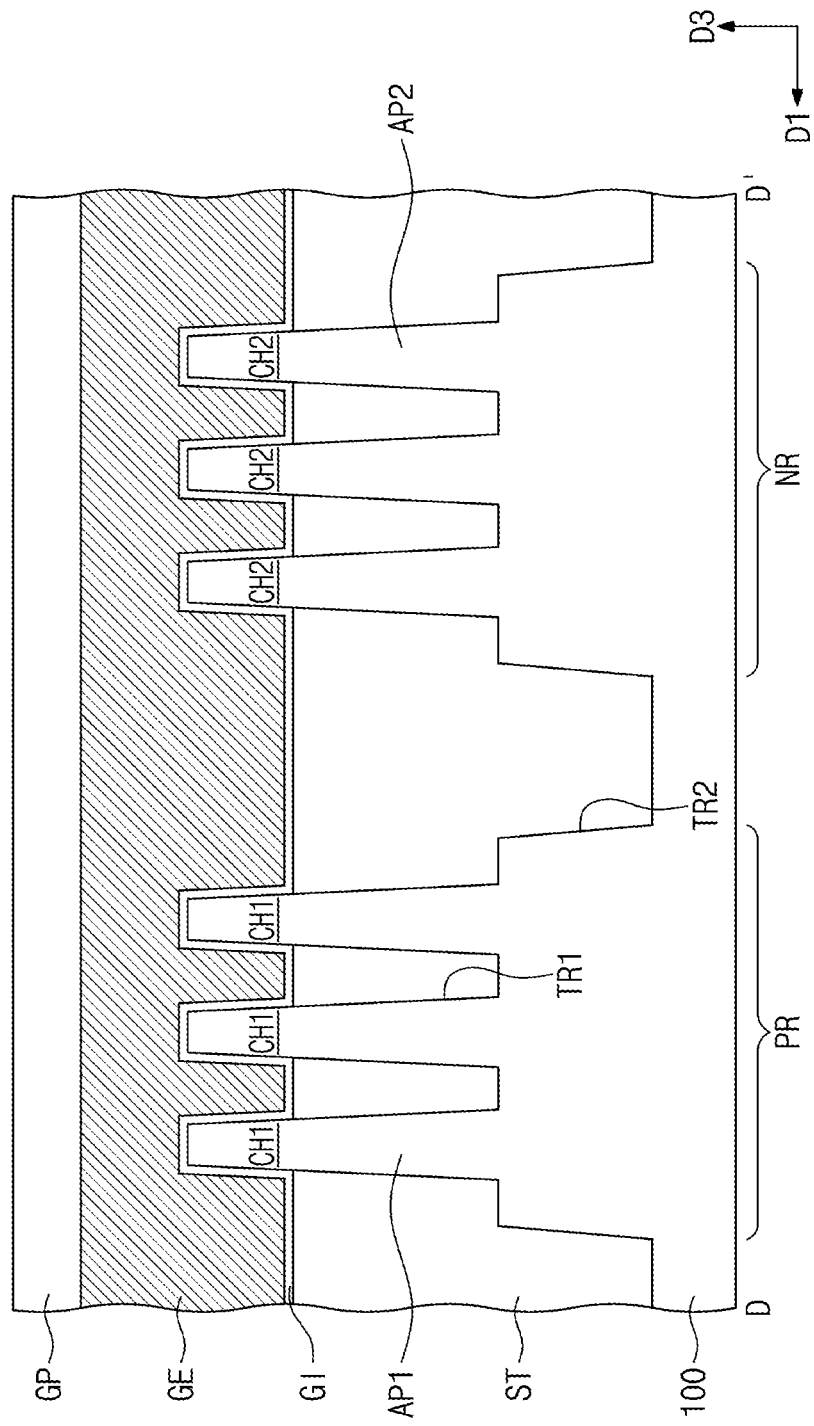
FIGS. 11D and 13D are sectional views taken along lines D-D' of FIGS. 10 and 12, respectively.
Figure 12:
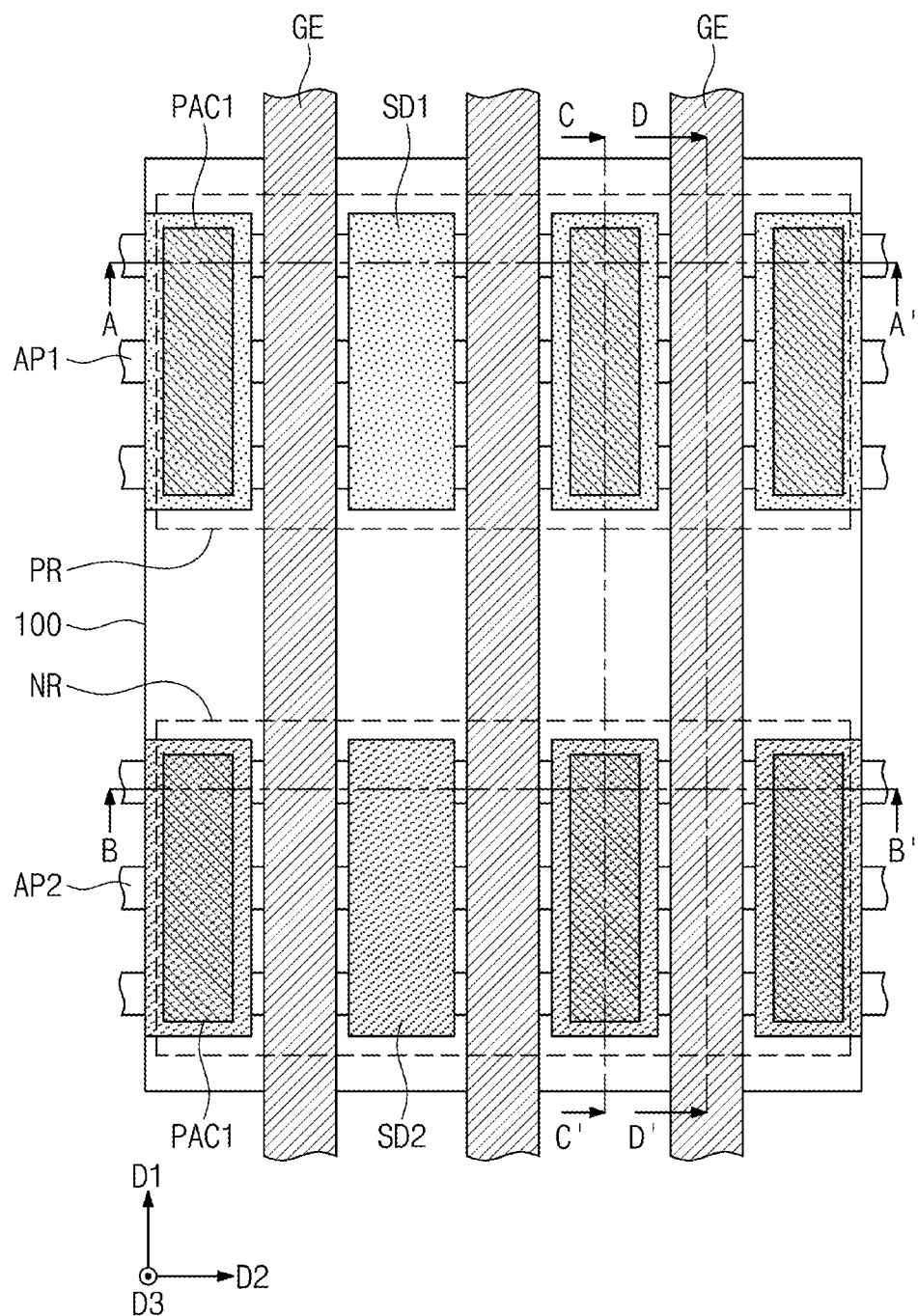
Figure 13A:
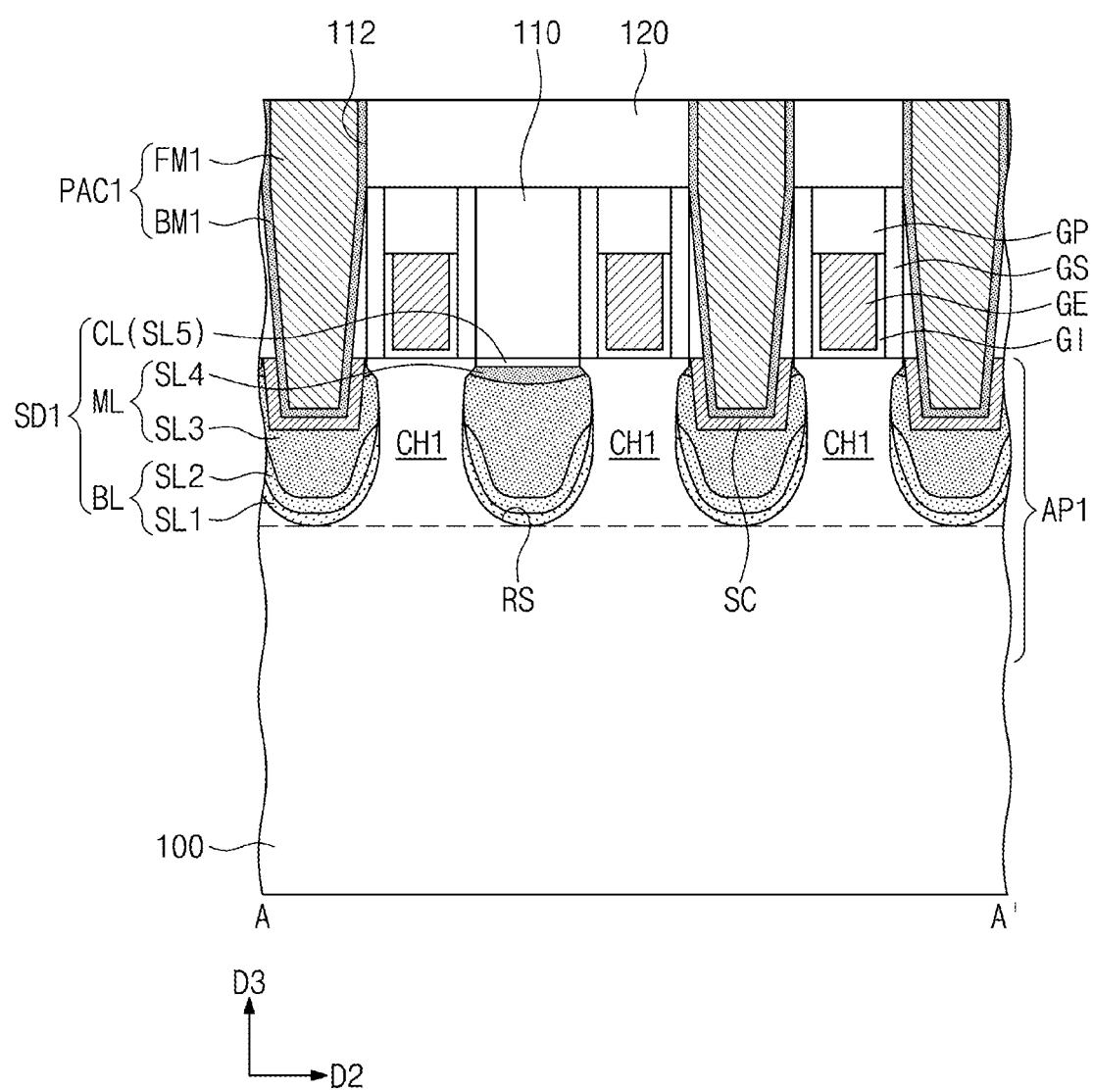
Figure 13B:
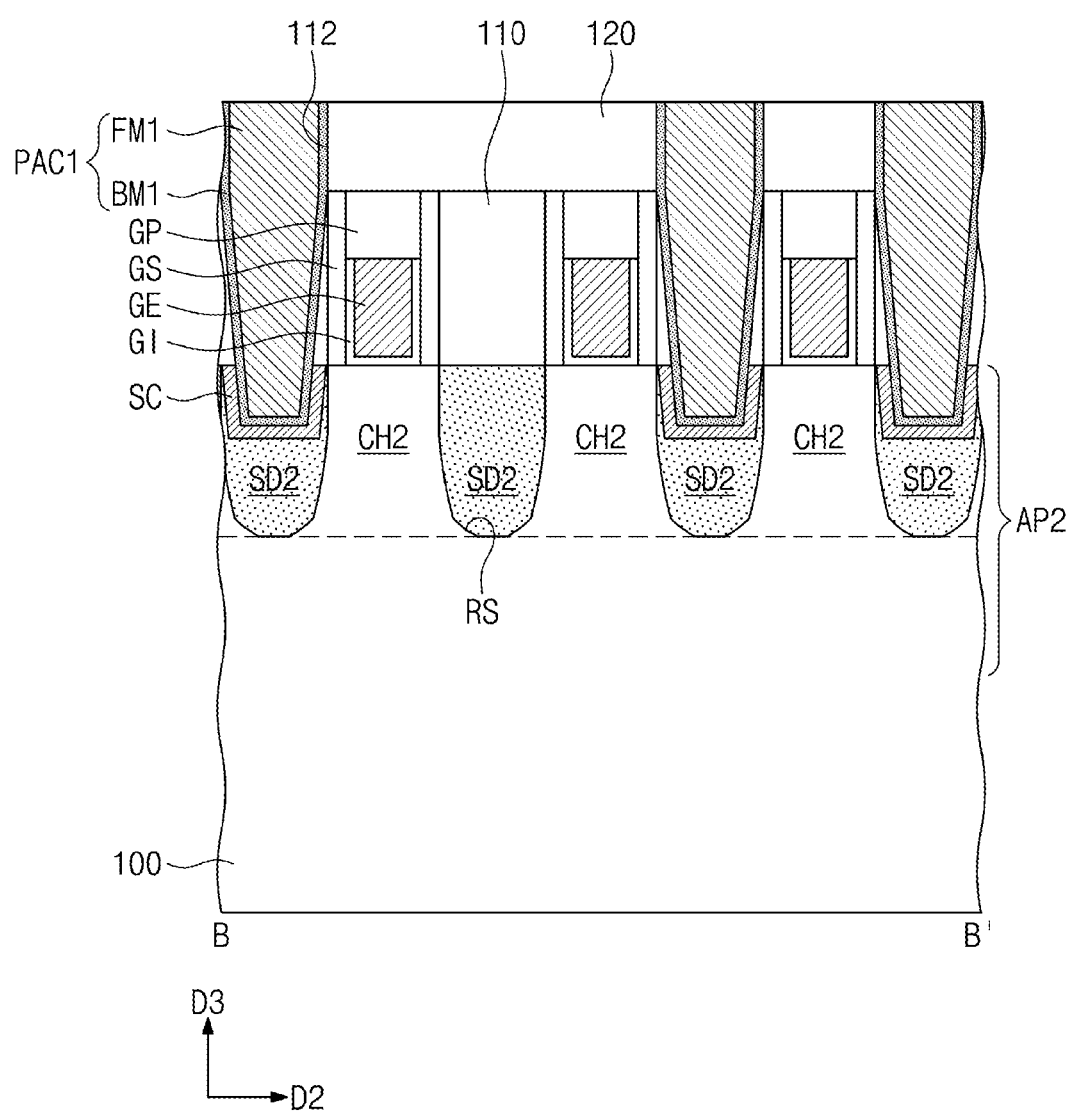
Figure 13C:
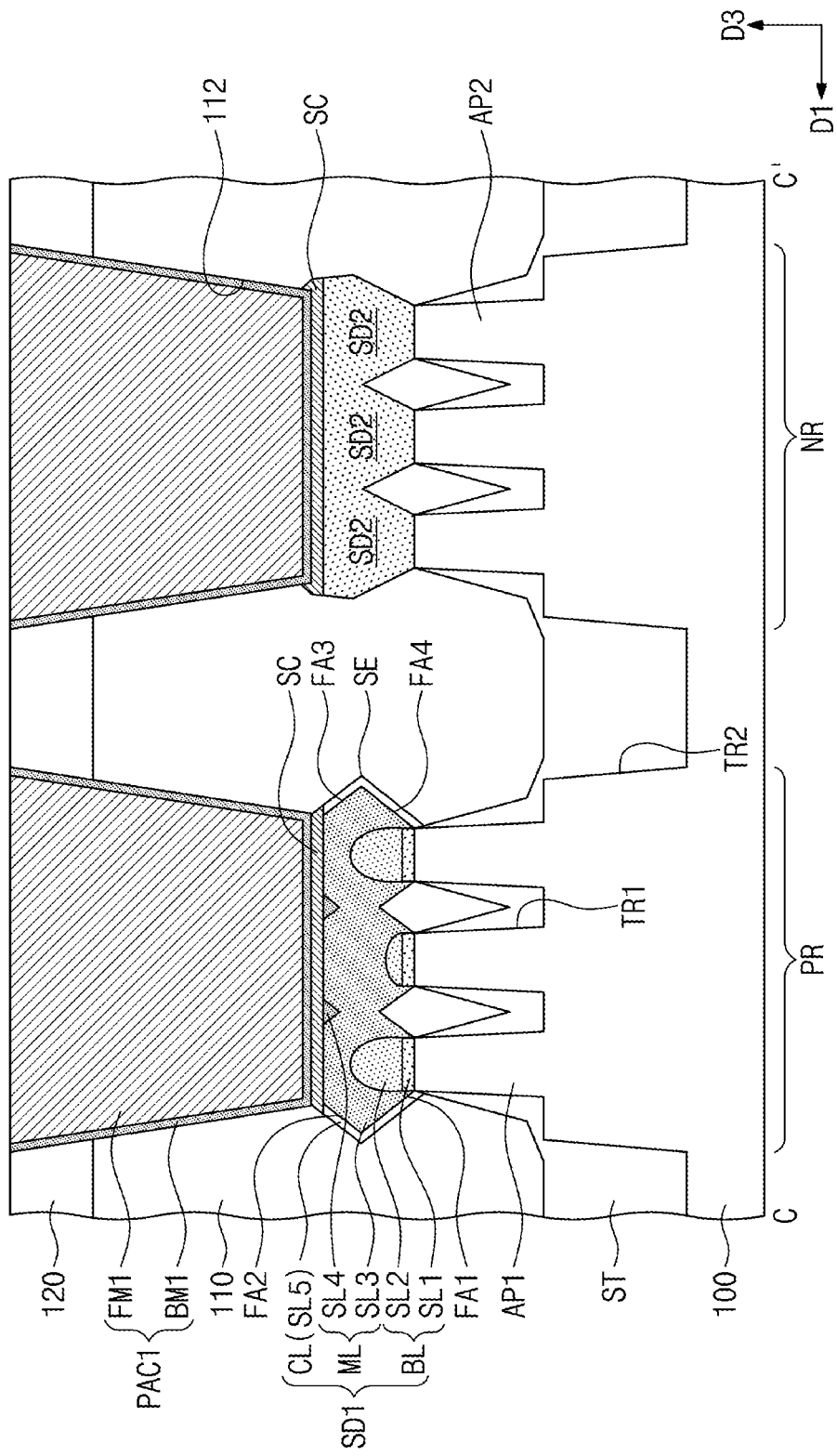
Figure 13D:
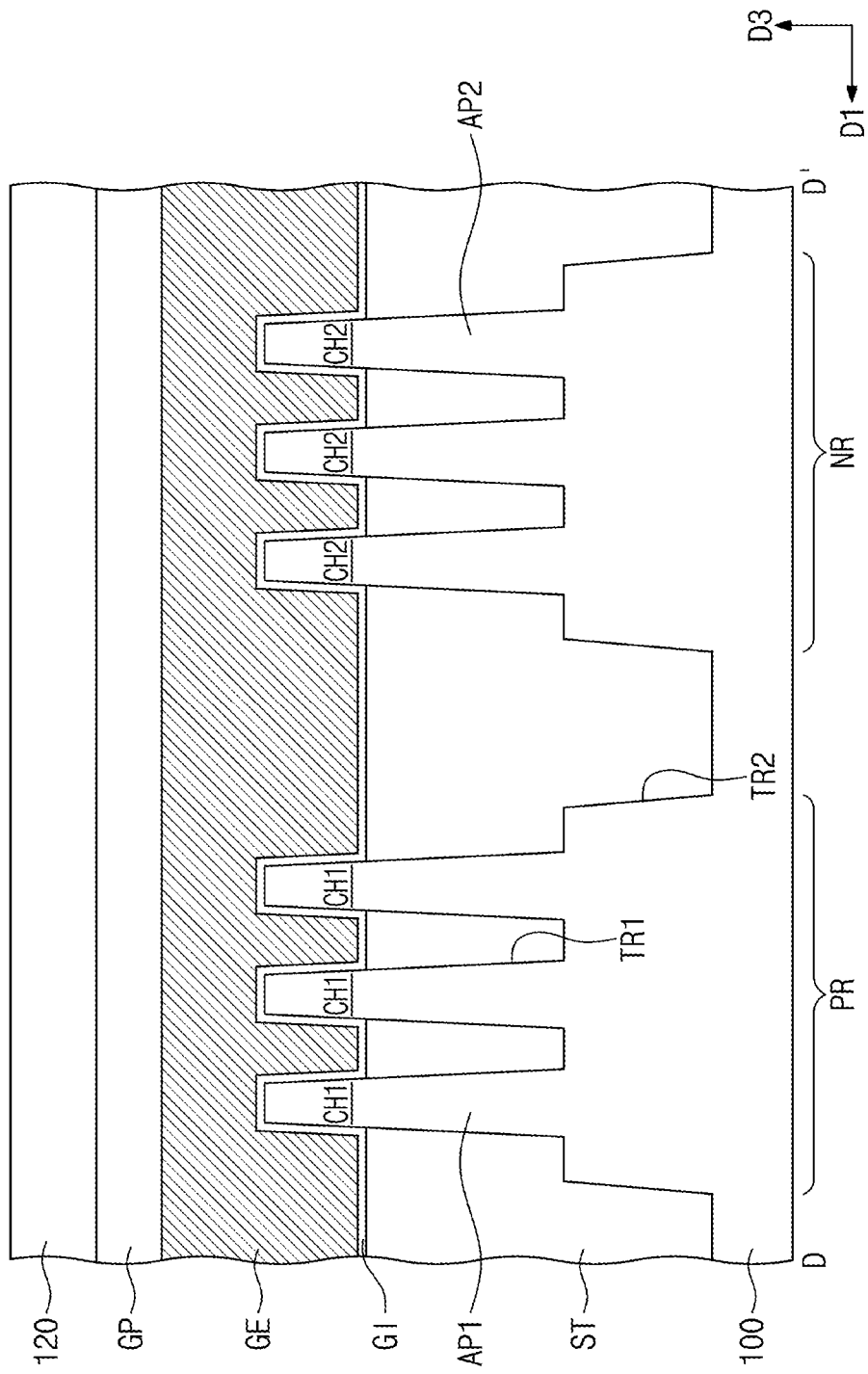

FIGS. 4, 6, 8, 10, 12, 15, and 17 are plan views illustrating a method of fabricating a semiconductor device, according to an embodiment of the inventive concept. FIGS. 5, 7A, 9A, 11A, 13A, 14A, 16A, and 18A are sectional views taken along lines A-A' of FIGS. 4, 6, 8, 10, 12, 12, 15, and 17, respectively. FIGS. 7B, 9B, 11B, 13B, 14B, 16B, and 18B are sectional views taken along lines B-B' of FIGS. 6, 8, 10, 12, 12, 15, and 17, respectively. FIGS. 7C, 9C, 11C, 13C, 14C, 16C, and 18C are sectional views taken along lines C-C' of FIGS. 6, 8, 10, 12, 12, 15, and 17, respectively. FIGS. 11D and 13D are sectional views taken along lines D-D' of FIGS. 10 and 12, respectively.

Figure 4:
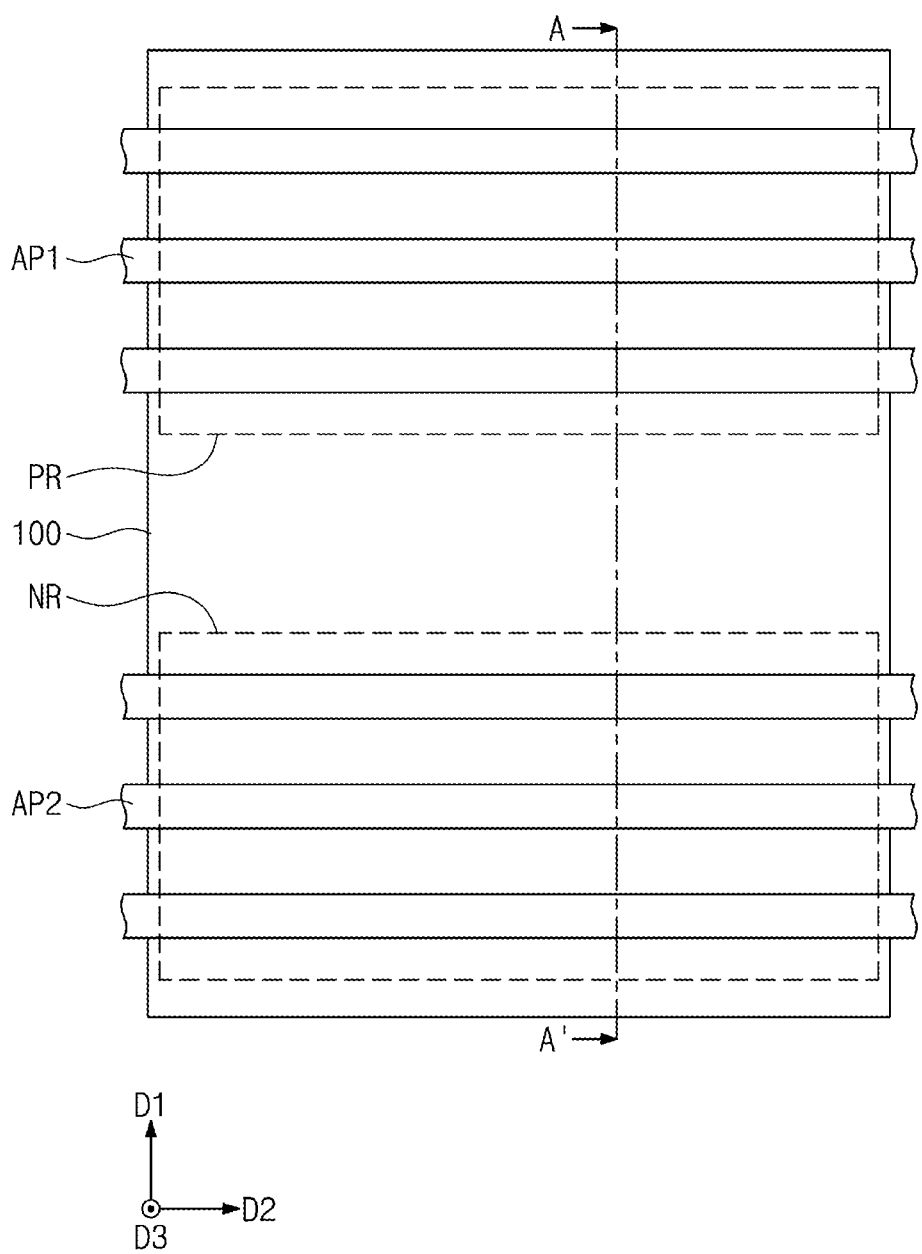
FIGS. 4, 6, 8, 10, 12, 15, and 17 are plan views illustrating a method of fabricating a semiconductor device, according to an embodiment of the inventive concept.
Figure 5:
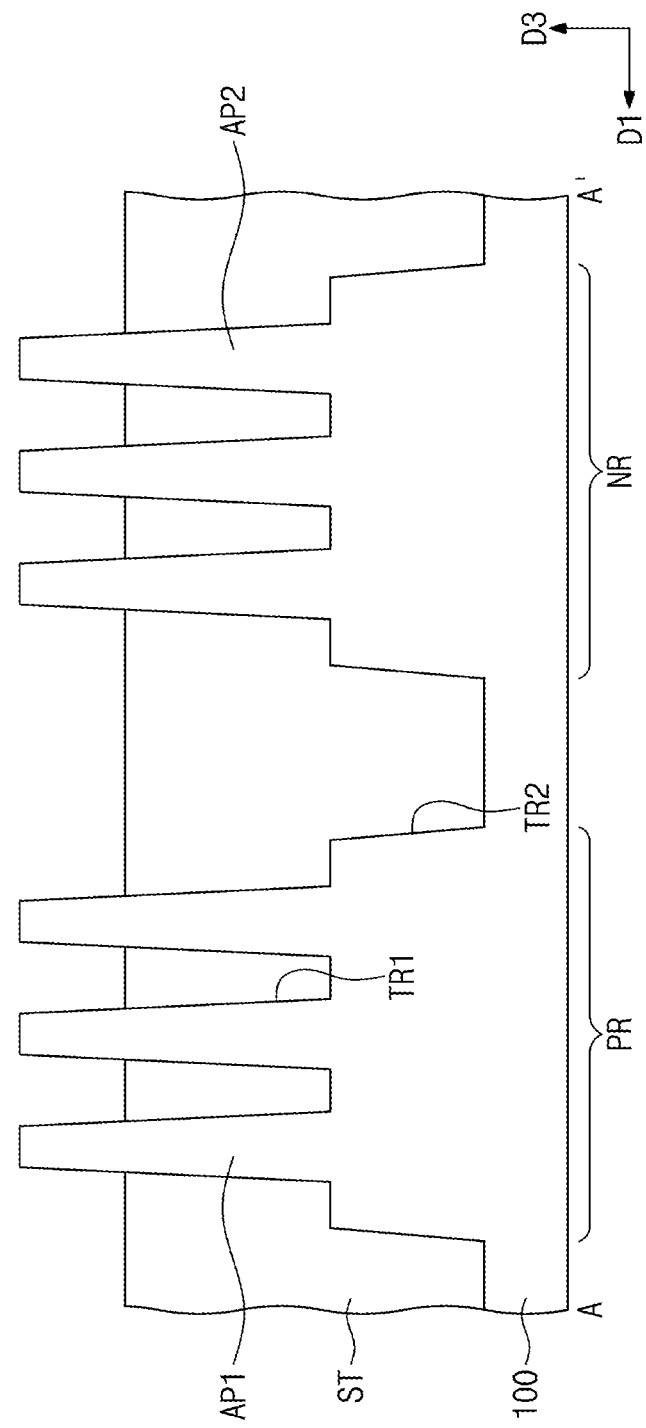
FIGS. 5, 7A, 9A, 11A, 13A, 14A, 16A, and 18A are sectional views taken along lines A-A' of FIGS. 4, 6, 8, 10, 12, 12, 15, and 17, respectively.
Figure 6:
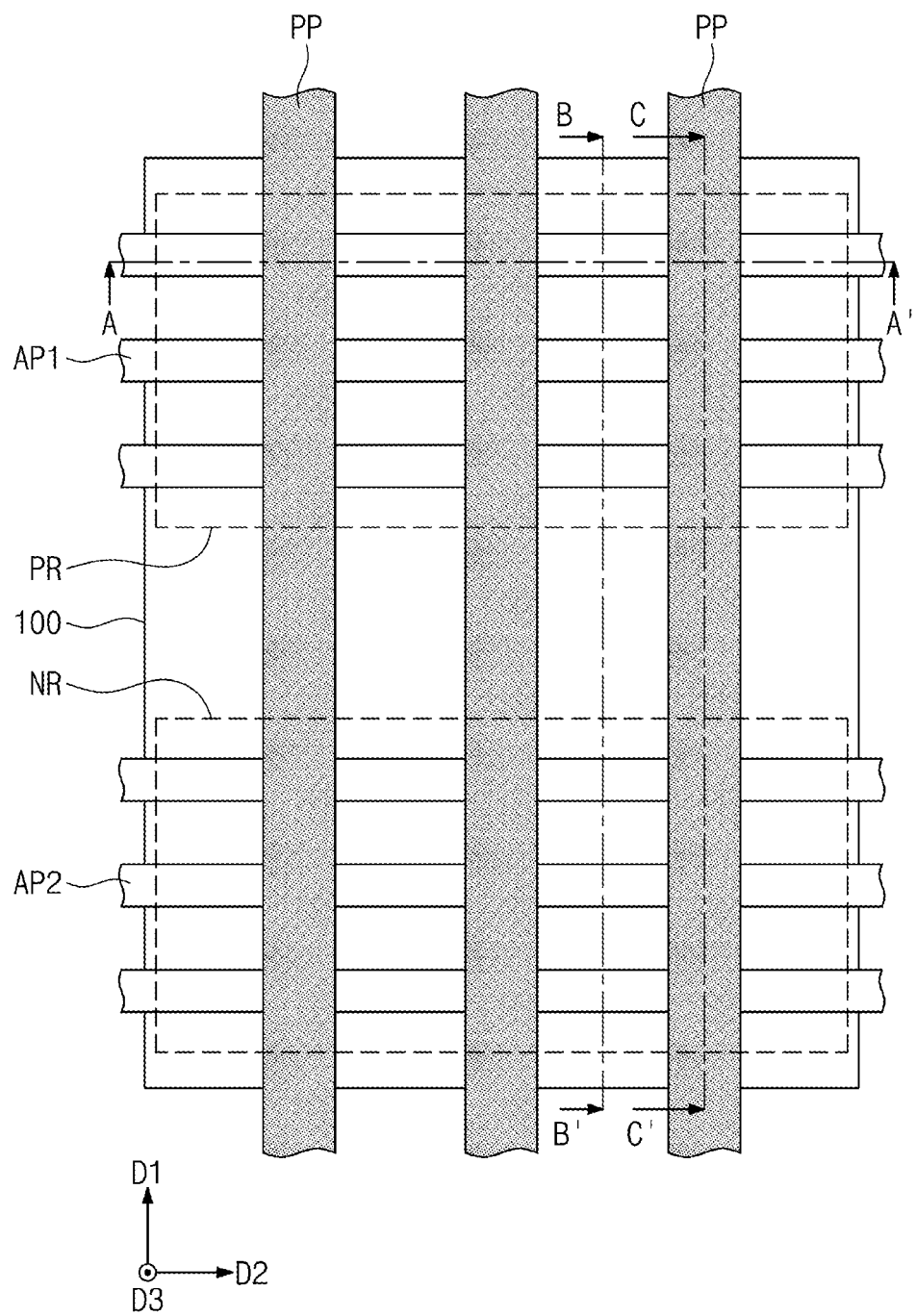
Figure 7A:
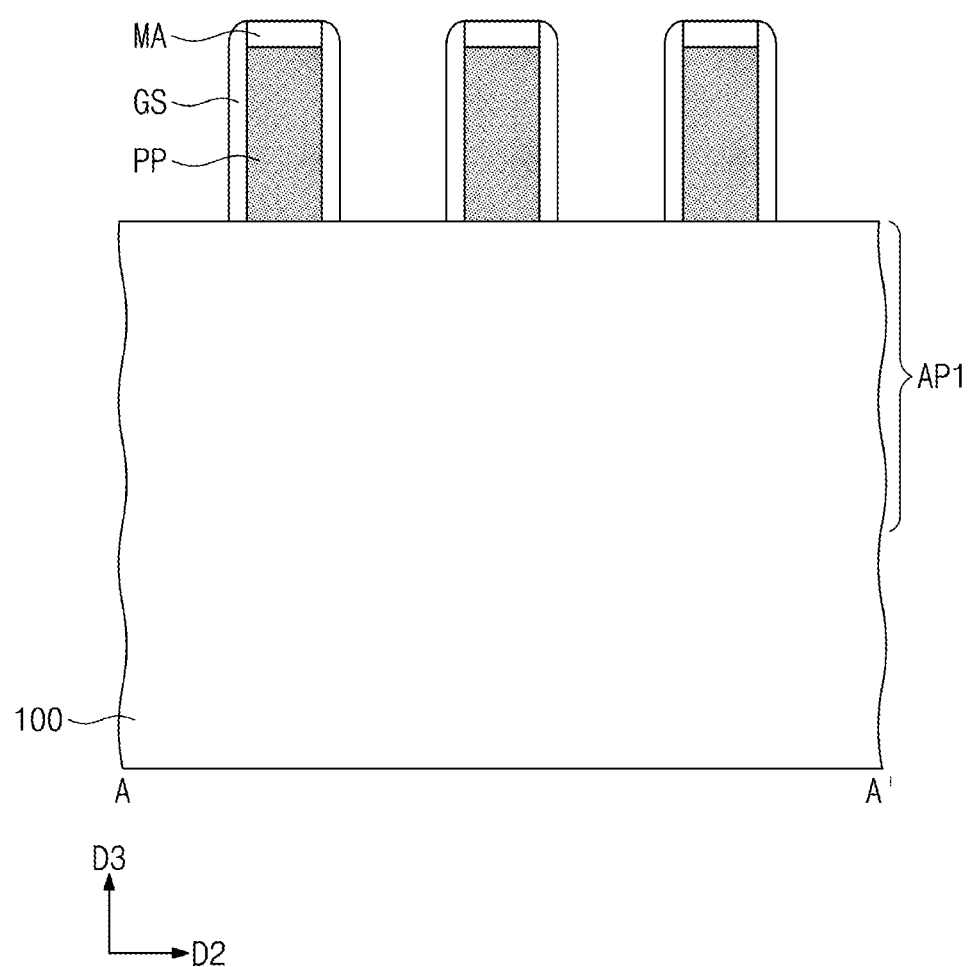
Figure 7B:
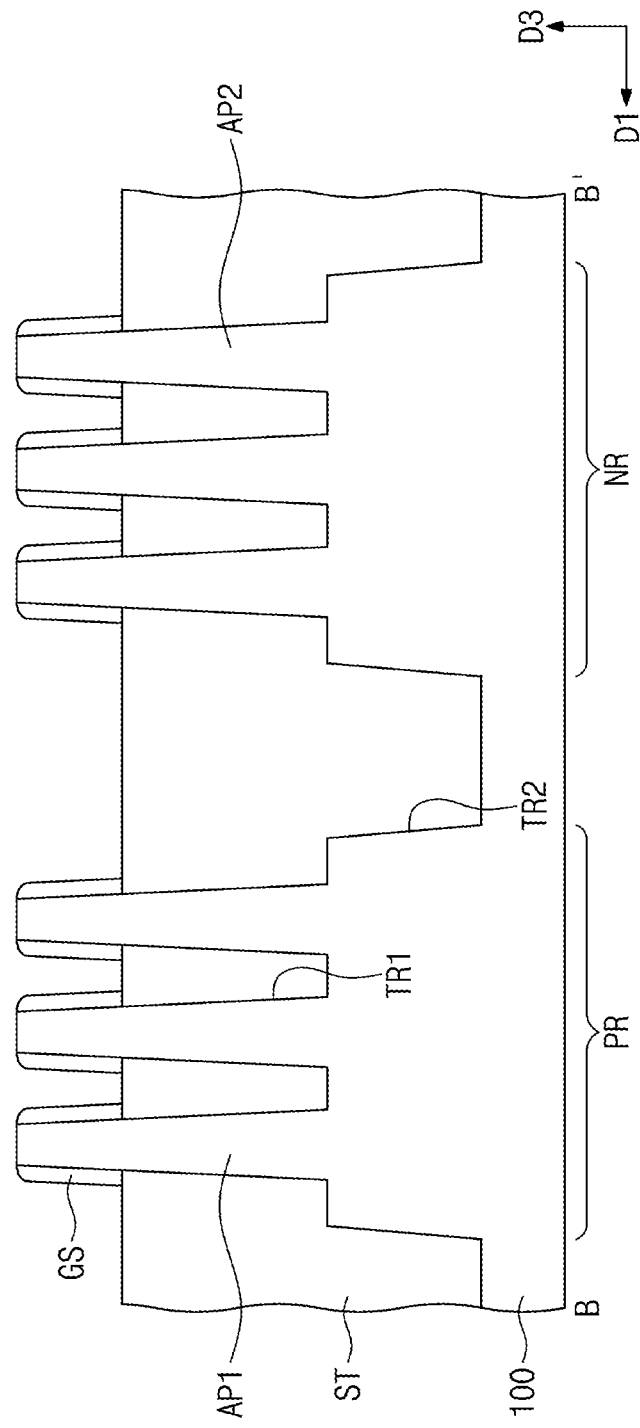
FIGS. 7B, 9B, 11B, 13B, 14B, 16B, and 18B are sectional views taken along lines B-B' of FIGS. 6, 8, 10, 12, 12, 15, and 17, respectively.
Figure 7C:
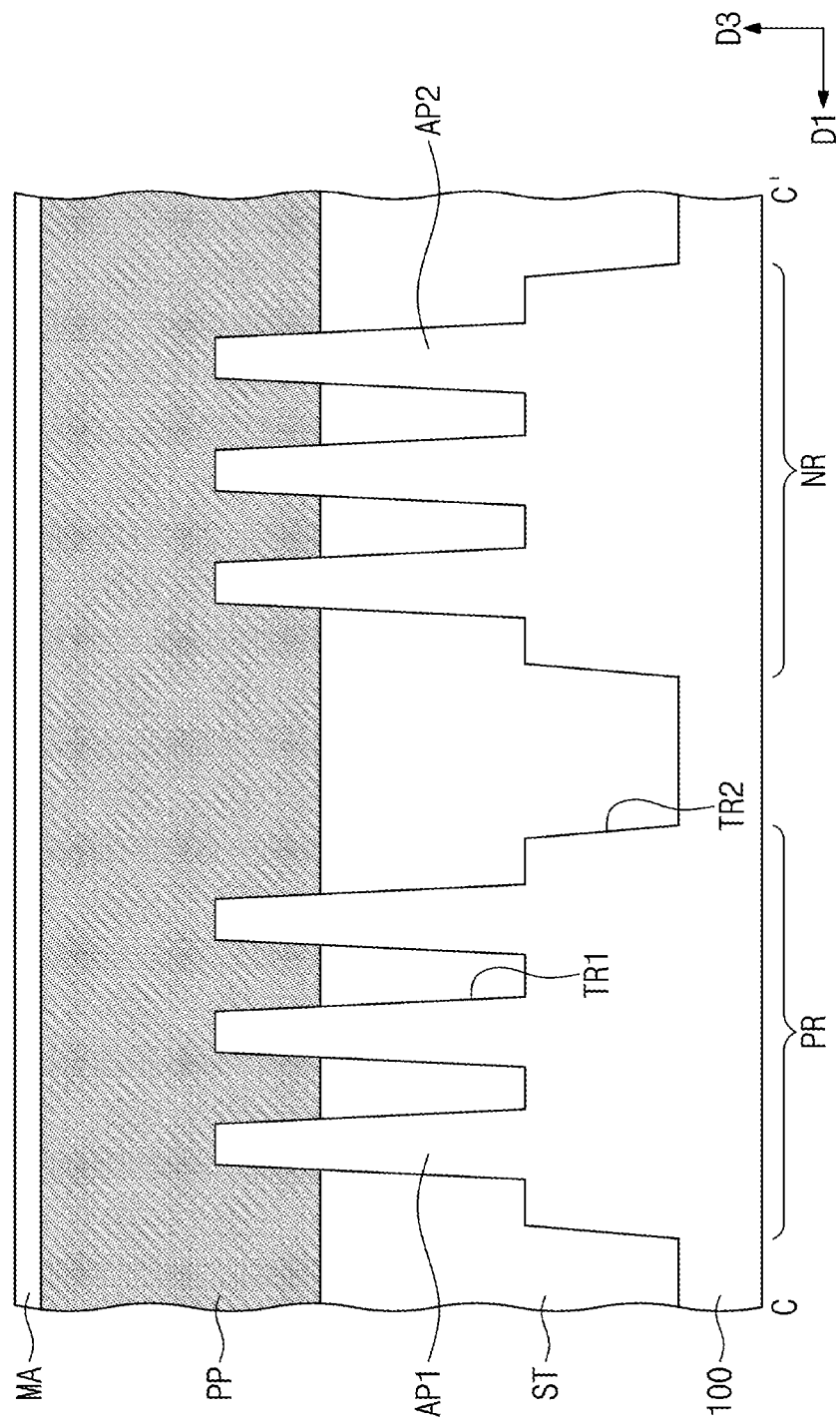
FIGS. 7C, 9C, 11C, 13C, 14C, 16C, and 18C are sectional views taken along lines C-C' of FIGS. 6, 8, 10, 12, 12, 15, and 17, respectively.
Figure 8:
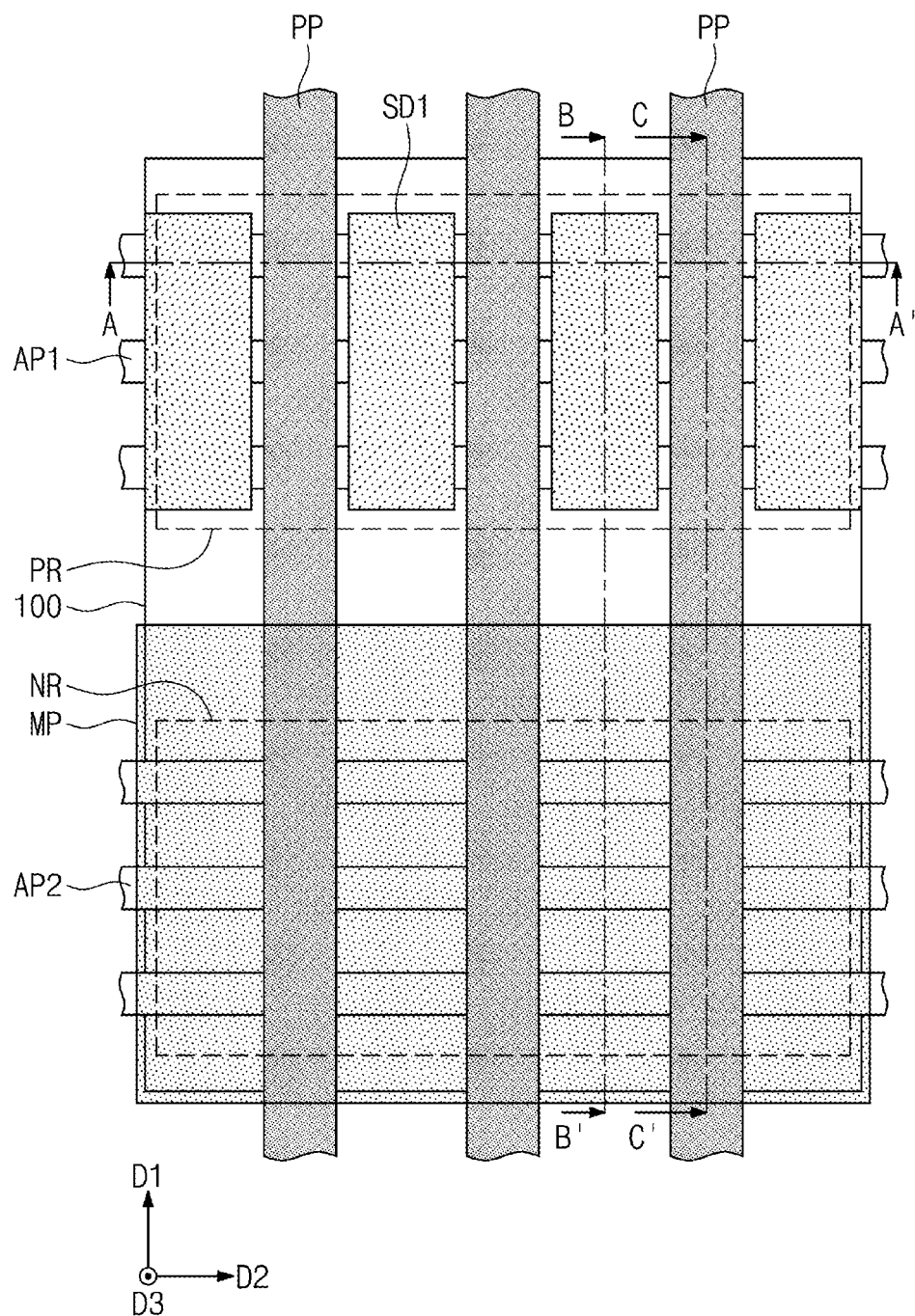
Figure 9A:
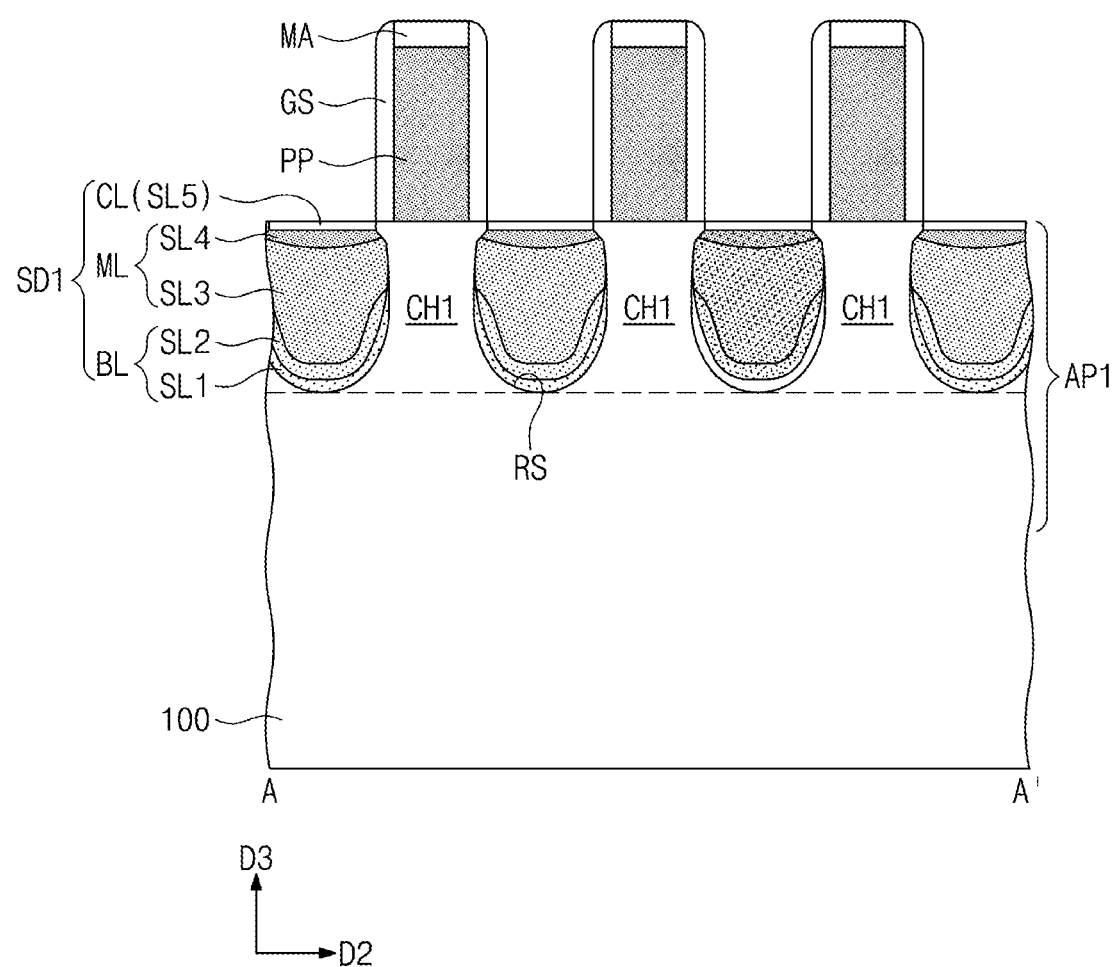
Figure 9B:
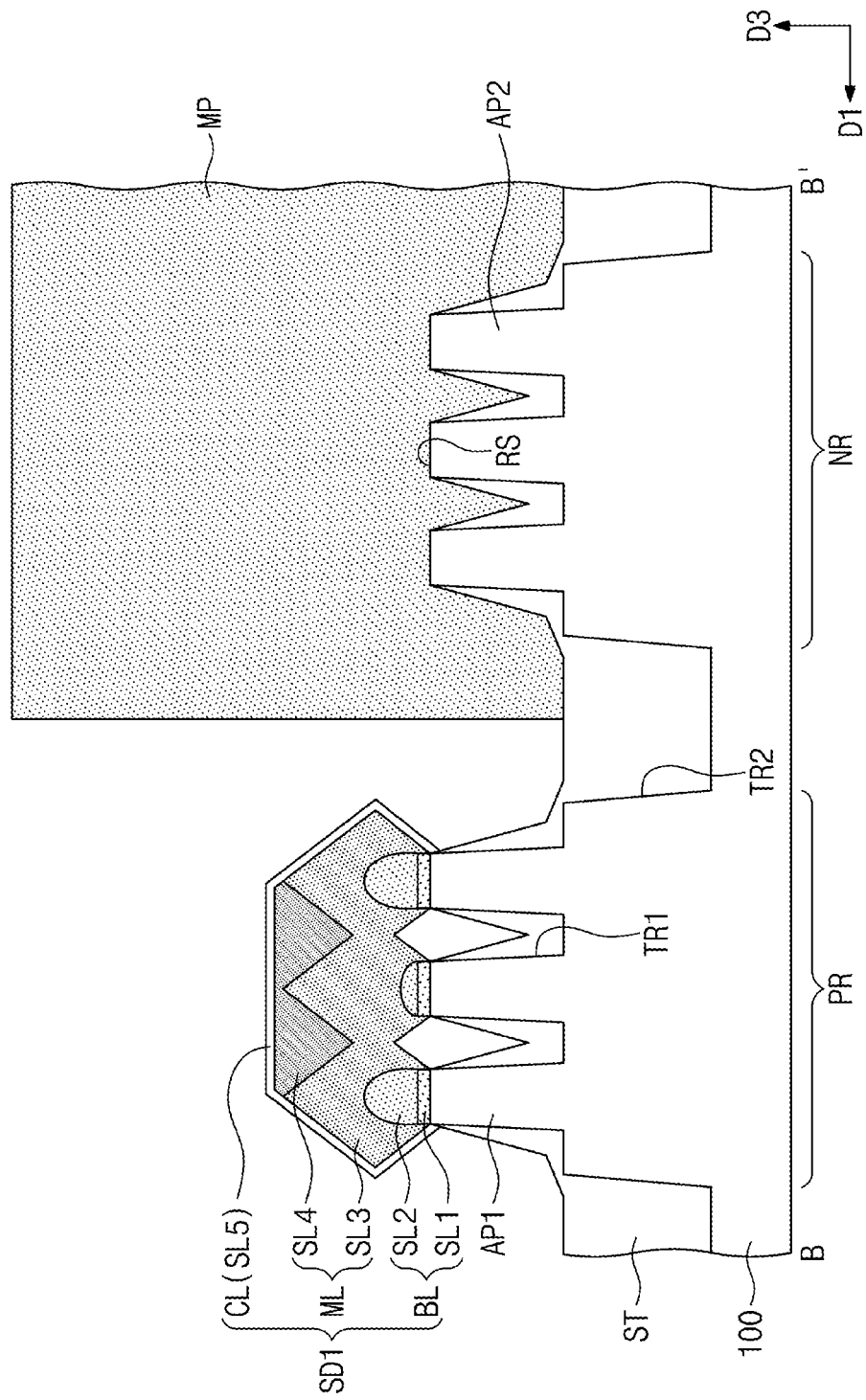
Figure 9C:
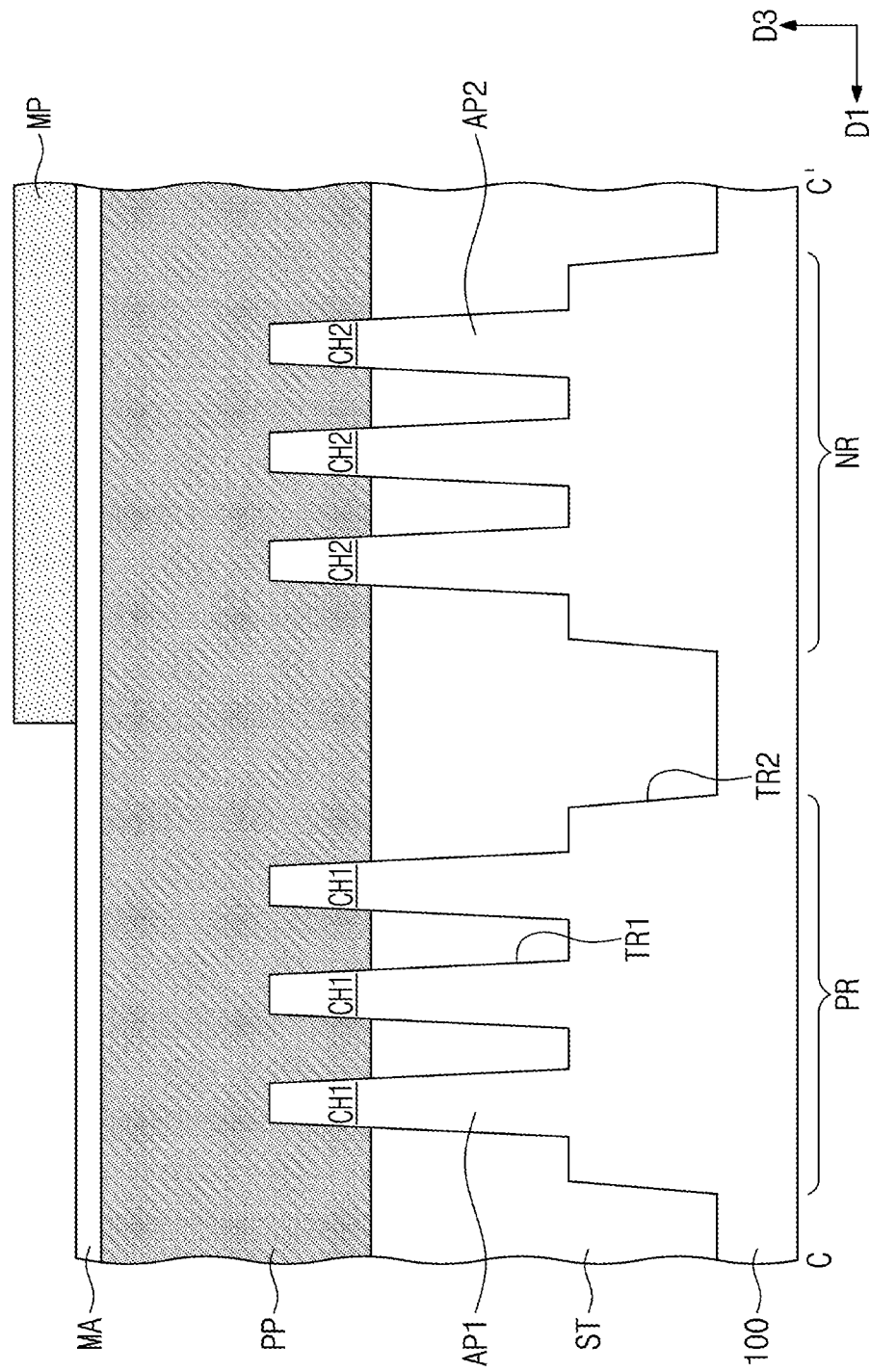
Figure 10:
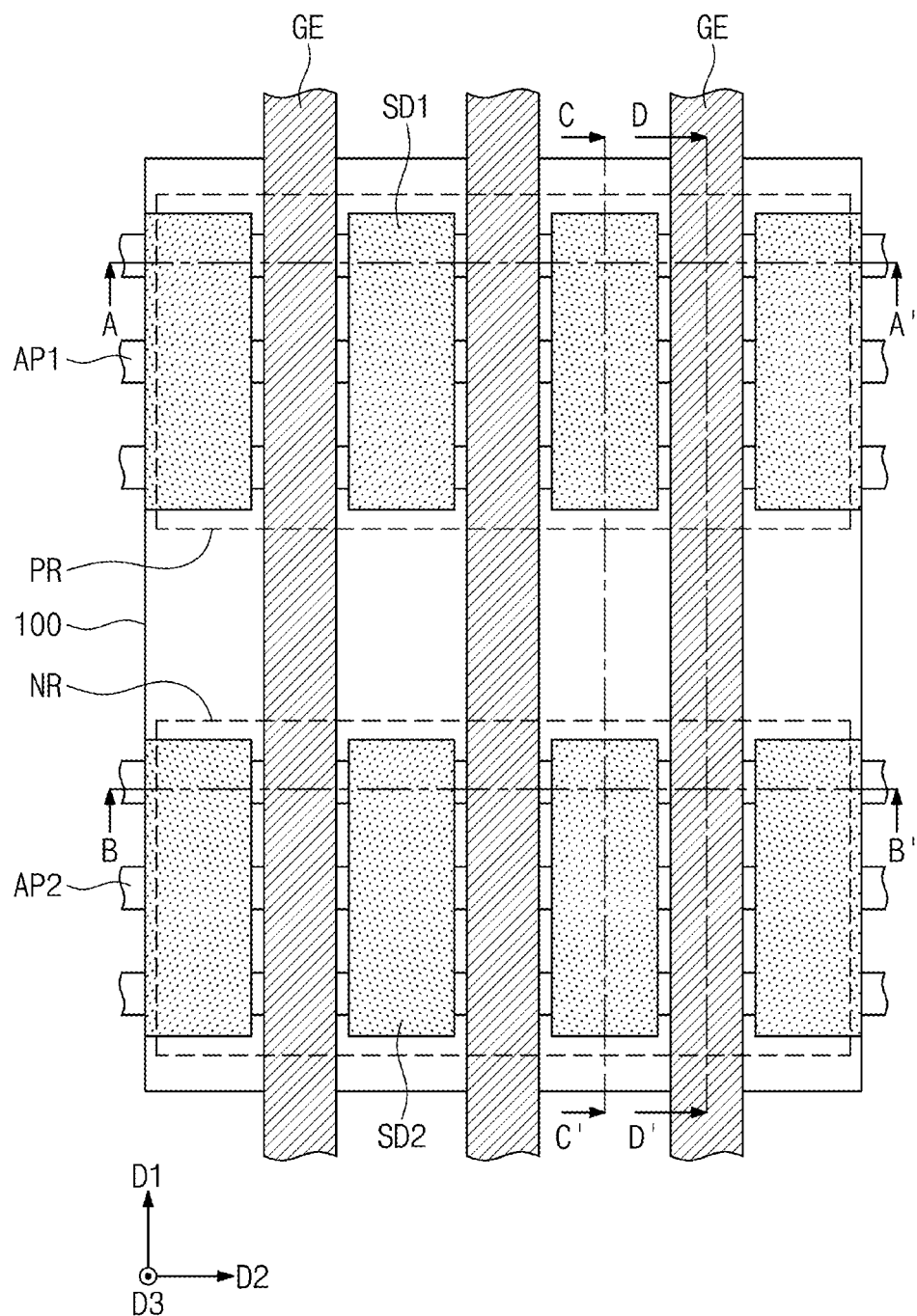

Referring to FIGS. 4 and 5, the substrate 100 including the first and second active regions PR and NR may be provided. The first and second active patterns AP1 and AP2 may be formed by patterning the substrate 100. The first active patterns AP1 may be formed on the first active region PR, and the second active patterns AP2 may be formed on the second active region NR. The first trench TR1 may be formed between the first active patterns AP1 and between the second active patterns AP2.

The substrate 100 may be patterned to form the second trench TR2 between the first and second active regions PR and NR. The second trench TR2 may be formed to be deeper than the first trench TR1.

The device isolation layer ST may be formed on the substrate 100 in (e.g., to fill) the first and second trenches TR1 and TR2. The device isolation layer ST may be formed of and/or include at least one of various insulating materials (e.g., silicon oxide). The device isolation layer ST may be recessed to expose upper portions of the first and second active patterns AP1 and AP2. As a result, each of the upper portions of the first and second active patterns AP1 and AP2 may have a shape vertically protruding beyond a top surface of the device isolation layer ST.

Referring to FIGS. 6 and 7A to 7C, sacrificial patterns PP may be formed to cross the first and second active patterns AP1 and AP2. Each of the sacrificial patterns PP may be a line- or bar-shaped structure extending in the first direction D1. In detail, the formation of the sacrificial patterns PP may include forming a sacrificial layer on the entire top surface of the substrate 100, forming hard mask patterns MA on the sacrificial layer, and patterning the sacrificial layer using the hard mask patterns MA as an etch mask. The sacrificial layer may be formed of and/or include a poly-silicon layer.

A pair of the gate spacers GS may be formed on opposite side surfaces of each of the sacrificial patterns PP. The gate spacers GS may be formed on both (e.g., opposite) side surfaces of each of the first and second active patterns AP1 and AP2. The both side surfaces of each of the first and second active patterns AP1 and AP2 may be portions that are not covered with the device isolation layer ST and the sacrificial patterns PP and are exposed.

The formation of the gate spacers GS may include conformally forming a gate spacer layer on the substrate 100 and anisotropically etching the gate spacer layer. The gate spacer layer may be formed of and/or include at least one of SiCN, SiCON, or SiN. In certain embodiments, the gate spacer layer may be a multi-layered structure including at least two of SiCN, SiCON, or SiN.

Referring to FIGS. 8 and 9A to 9C, recesses RS may be formed in an upper portion of each of the first and second active patterns AP1 and AP2. A pair of the recesses RS may be formed at both (e.g., opposite) sides of each of the sacrificial patterns PP. The formation of the recesses RS may include etching upper portions of the first and second active patterns AP1 and AP2 using the hard mask patterns MA and the gate spacers GS as an etch mask. During the etching process, the gate spacers GS may be removed from both side surfaces of each of the first and second active patterns AP1 and AP2. The exposed portion of the device isolation layer ST may be recessed during the etching process.

A first mask layer MP may be formed to selectively cover the second active patterns AP2. The first mask layer MP may be formed to selectively cover the second active region NR and to expose the first active region PR. The first mask layer MP may expose the first active patterns AP1.

The first source/drain patterns SD1 may be formed in (e.g., to fill) the recesses RS of the first active patterns AP1 exposed by the first mask layer MP. For example, the formation of the first source/drain pattern SD1 may include performing a selective epitaxial growth process using the exposed inner surface of the recess RS as a seed layer. Since the first source/drain patterns SD1 are formed, the first channel pattern CH1 may be defined between each pair of the first source/drain patterns SD1. As an example, the selective epitaxial growth process may include a chemical vapor deposition (CVD) process or a molecular beam epitaxy (MBE) process.

The first source/drain pattern SD1 may be formed of and/or include a second semiconductor material whose lattice constant is greater than a lattice constant of a first semiconductor material of the substrate 100. In an embodiment, the first semiconductor material may be silicon (Si), and the second semiconductor material may be germanium (Ge). The first source/drain pattern SD1 may be formed of multiple semiconductor layers. The formation of the first source/drain pattern SD1 may include sequentially forming first to fifth semiconductor layers SL1-SL5. The first and second semiconductor layers SL1 and SL2 may constitute the buffer layer BL, the third and fourth semiconductor layers SL3 and SL4 may constitute the main layer ML, and the fifth semiconductor layer SL5 may constitute the capping layer CL.

Referring to FIGS. 10 and 11A to 11D, the first mask layer MP may be removed. A second mask layer may be formed to selectively cover the first active patterns AP1. The second mask layer may selectively cover the first active region PR and may expose the second active region NR. The second mask layer may expose the second active patterns AP2.

The second source/drain patterns SD2 may be formed in (e.g., to fill) the recesses RS of the second active patterns AP2 exposed by the second mask layer. For example, the formation of the second source/drain patterns SD2 may include performing a selective epitaxial growth (SEG) process using exposed inner side surfaces of the recesses RS as a seed layer. The second source/drain patterns SD2 may be formed of and/or include the same semiconductor element (e.g., silicon (Si)) as the first semiconductor material of the substrate 100. Thereafter, the second mask layer may be removed.

The first interlayer insulating layer 110 may be formed on (e.g., to cover) the first and second source/drain patterns SD1 and SD2, the gate spacers GS, and the mask patterns MA. In an embodiment, the first interlayer insulating layer 110 may include a silicon oxide layer.

A planarization process may be performed on the first interlayer insulating layer 110 to expose the top surfaces of the sacrificial patterns PP. The planarization of the first interlayer insulating layer 110 may be performed using an etch-back or chemical mechanical polishing (CMP) process. Thus, the first interlayer insulating layer 110 may have a top surface that is coplanar with the top surfaces of the sacrificial patterns PP and the top surfaces of the gate spacers GS.

Each of the sacrificial patterns PP may be replaced with the gate electrode GE and the gate dielectric pattern GI. In detail, an empty space may be formed by selectively removing the exposed sacrificial patterns PP. The gate dielectric pattern GI may be formed in the empty space, which is formed by removing the sacrificial pattern PP. The gate electrode GE may be formed on the gate dielectric pattern GI to fill the empty space.

The gate dielectric pattern GI may be conformally formed by an atomic layer deposition (ALD) and/or a chemical oxidation process. In an embodiment, the gate dielectric pattern GI may be formed of and/or include at least one of various high-k dielectric materials. In certain embodiments, the gate dielectric pattern GI may be formed of and/or include at least one of various ferroelectric materials.

The gate electrode GE may be formed by forming a gate electrode layer on the gate dielectric pattern GI and planarizing the gate electrode layer. In an embodiment, the gate electrode layer may include a first gate electrode layer containing metal nitride and a second gate electrode layer containing low resistance metal.

The gate electrode GE may be recessed by selectively etching an upper portion of the gate electrode GE. The recessed top surface of the gate electrode GE may be lower than the top surface of the first interlayer insulating layer 110 and the top surfaces of the gate spacers GS. The gate capping pattern GP may be formed on the recessed gate electrode GE. The formation of the gate capping pattern GP may include forming a gate capping layer on (e.g., to cover) the recessed gate electrode GE and planarizing the gate capping layer to expose the top surface of the first interlayer insulating layer 110. In an embodiment, the gate capping layer may be formed of and/or include at least one of SiON, SiCN, SiCON, or SiN.

Referring to FIGS. 12 and 13A to 13D, the second interlayer insulating layer 120 may be formed on the first interlayer insulating layer 110. The contact holes 112 may be formed to penetrate the second interlayer insulating layer 120 and the first interlayer insulating layer 110. Preliminary active contacts PAC1 may be formed in the contact holes 112. The formation of the preliminary active contacts PAC1 may include sequentially forming the first barrier pattern BM1 and the first conductive pattern FM1 in the contact holes 112. The formation of the preliminary active contacts PAC1 may include a planarization process, and in an embodiment, the planarization process may be performed to expose the second interlayer insulating layer 120.

The silicide patterns SC may be formed between the preliminary active contacts PAC1 and the first source/drain pattern SD1 and between the preliminary active contacts PAC1 and the second source/drain pattern SD2. The formation of the silicide patterns SC may include performing a silicidation process on the first and second source/drain patterns SD1 and SD2. In an embodiment, the silicide patterns SC may be formed of and/or include at least one of various metal silicides (e.g., titanium silicide, tantalum silicide, tungsten silicide, nickel silicide, or cobalt silicide).

Figure 14A:
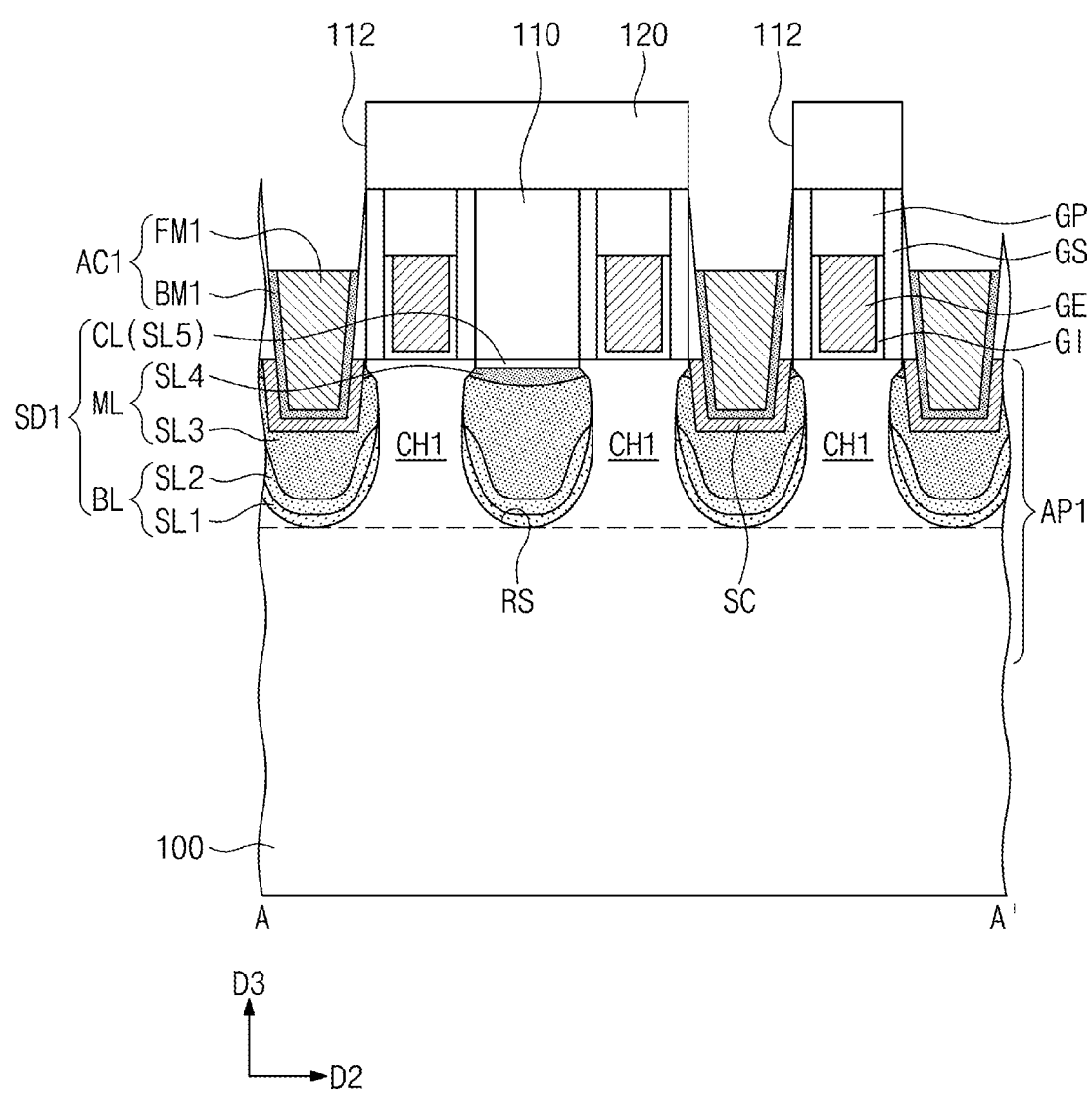
Figure 14B:
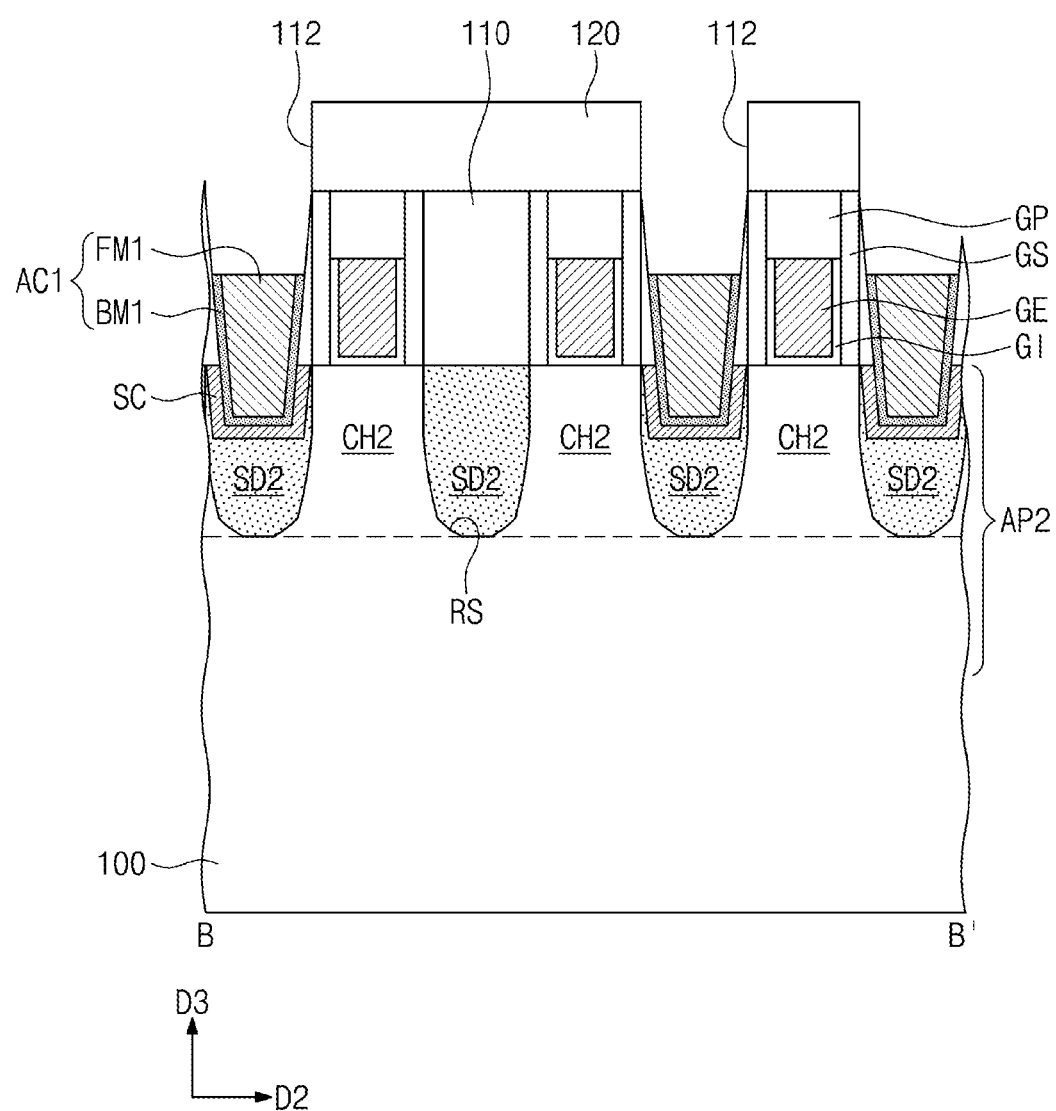
Figure 14C:
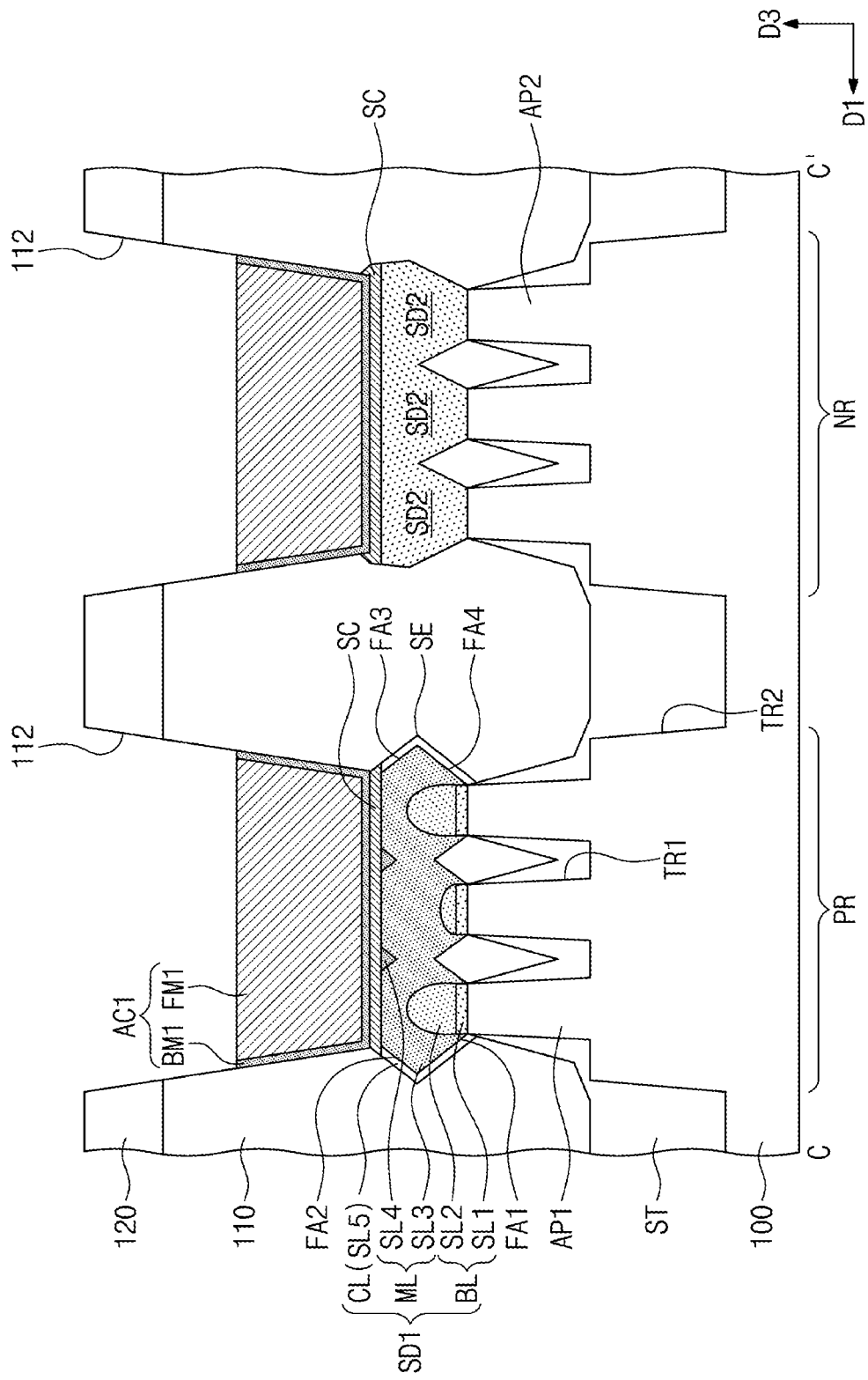

Referring to FIGS. 14A to 14C, the lower contact patterns AC1 may be formed by removing upper portions of the preliminary active contacts PAC1. The lower contact patterns AC1 may be formed to expose upper portions of the contact holes 112. The upper portions of the preliminary active contacts PAC1 may be etched until they have the top surfaces lower than the top surfaces of the gate electrodes GE.

Referring to FIGS. 15 and 16A to 16C, sacrificial patterns SA may be formed on the lower contact patterns AC1, respectively. The formation of the sacrificial patterns SA may include forming a sacrificial layer in upper portions of the contact holes 112 and forming first openings 113 to penetrate the sacrificial layer and to expose top surfaces of the lower contact patterns AC1. The sacrificial patterns SA may be formed of and/or include a material having an etch selectivity with respect to the first and second interlayer insulating layers 110 and 120 and the gate capping pattern GP. In an embodiment, the sacrificial layer may be formed by a spin coating process. The sacrificial layer may include a spin-on-hard (SOH) mask. For example, the sacrificial layer may include a layer having high carbon concentration (e.g., an amorphous carbon layer).

The sacrificial patterns SA may be formed by various methods and may be formed in various shapes. For example, a mask pattern may be formed on (e.g., to cover) a portion of the sacrificial layer and a portion of the second interlayer insulating layer 120, and the first openings 113 may be formed by an etching process using the mask pattern as an etching mask.

Referring to FIGS. 17 and 18A to 18C, mold patterns 119 may be formed in (e.g., to fill) the first openings 113. The mold patterns 119 may be formed of and/or include at least one of silicon oxide, silicon nitride, or silicon oxynitride. The formation of the mold patterns 119 may include a planarization process.

Second openings 114 may be formed by selectively removing the sacrificial patterns SA. The second openings 114 may be formed to expose the top surfaces of the lower contact patterns AC1. The upper contact patterns AC2 may be formed in (e.g., to fill) the second openings 114. Each of the upper contact patterns AC2 may include the second barrier pattern BM2 and the second conductive pattern FM2. The formation of the upper contact patterns AC2 may include a planarization process. Accordingly, the formation of the active contacts AC including the lower and upper contact patterns AC1 and AC2 may be finished.

Referring back to FIGS. 1A and 2A to 2D, the gate contact GC may be formed to penetrate the second interlayer insulating layer 120 and the gate capping pattern GP and may be electrically connected to the gate electrode GE. The gate contact GC may be formed through a separate process from that for the active contacts AC. In some embodiments, however, a part of a process of forming the active contacts AC may be used to form the gate contact GC.

The third interlayer insulating layer 130 may be formed on the second interlayer insulating layer 120. A first interconnection layer may be formed in the third interlayer insulating layer 130. The formation of the first interconnection layer may include forming the interconnection lines IL and forming vias VI1 and VI2 below the interconnection lines IL. The interconnection lines IL and the vias VI1 and VI2 may be formed by a damascene process or by a dual-damascene process.

Figure 15:
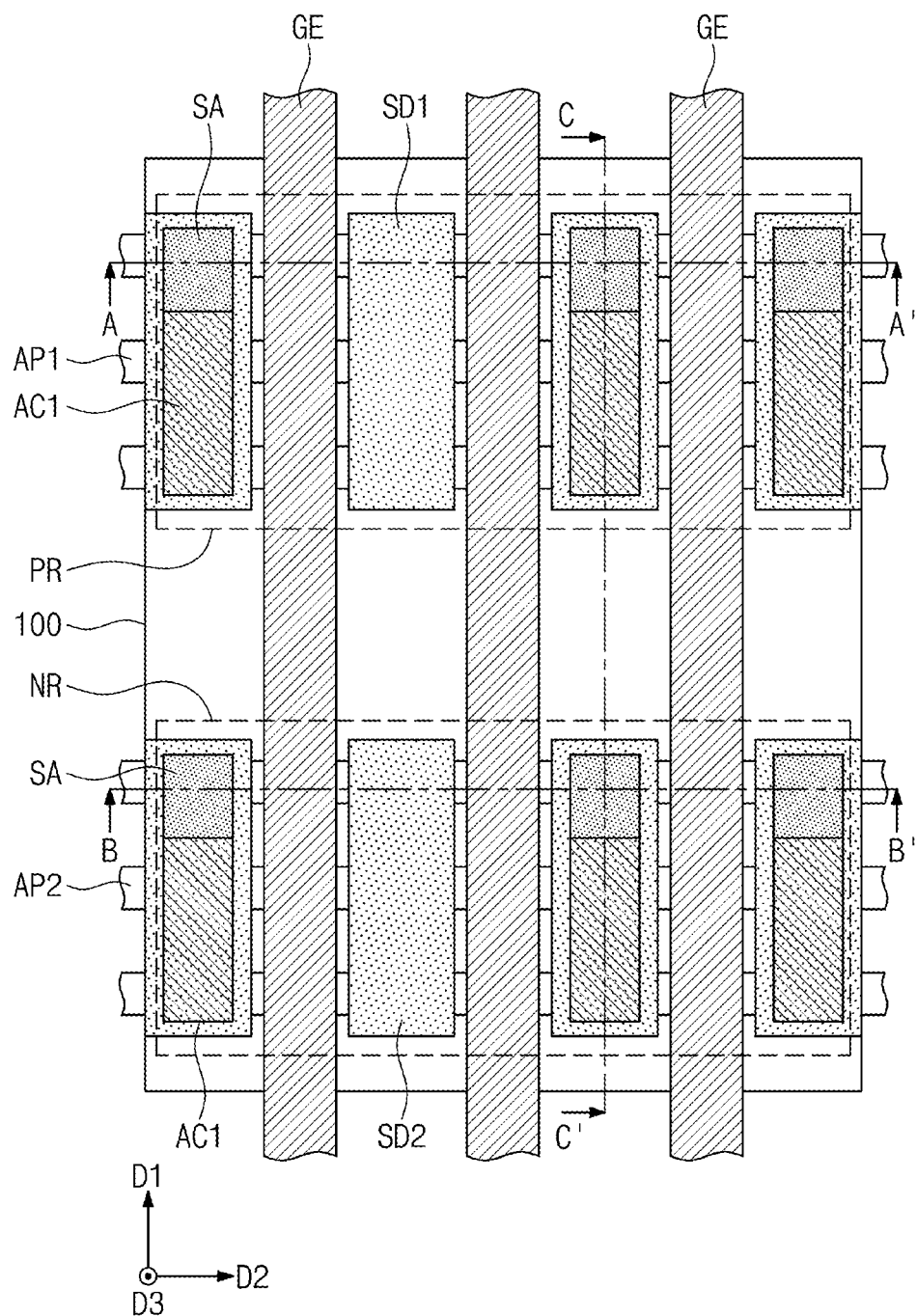
Figure 16A:
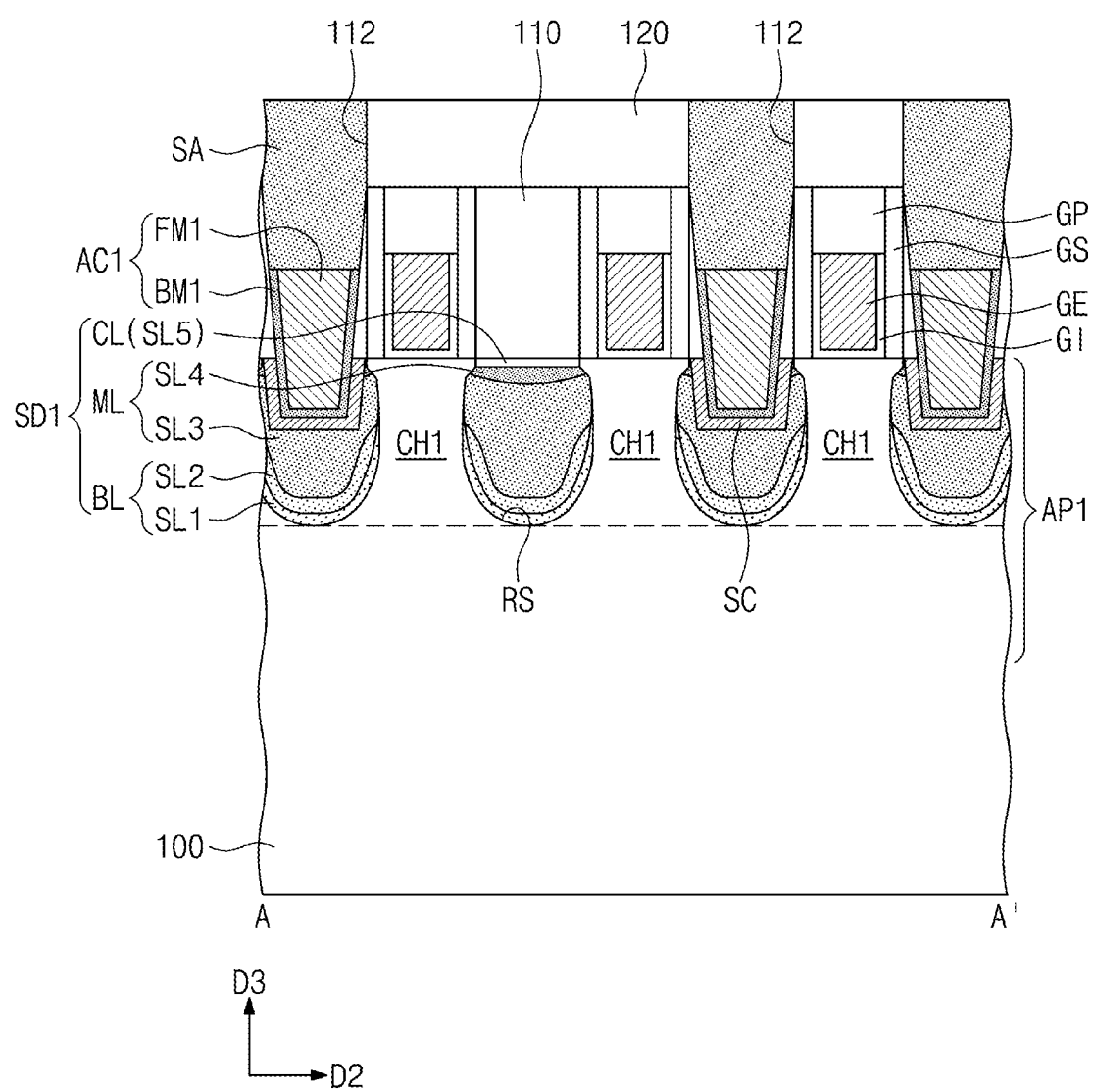
Figure 16B:
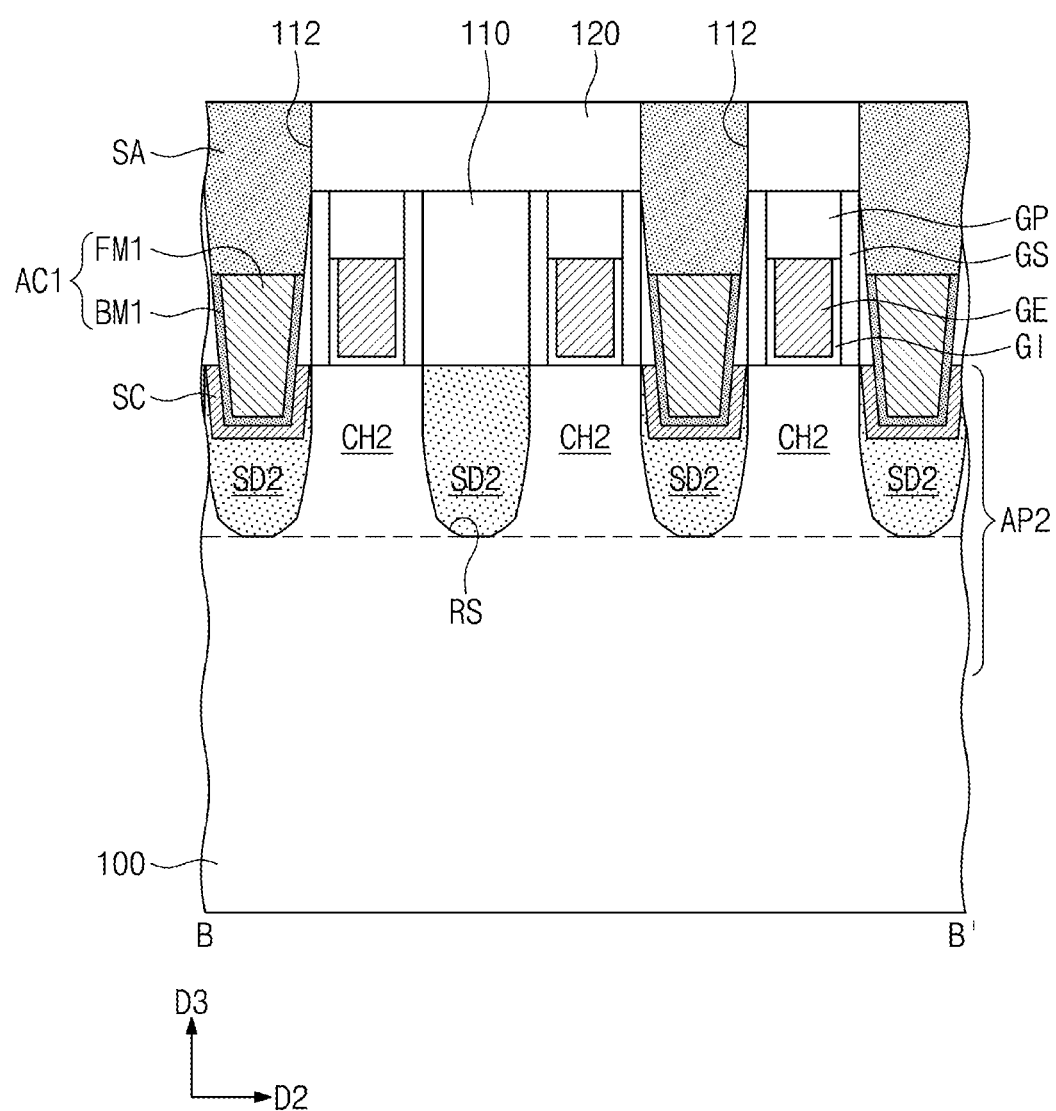
Figure 16C:
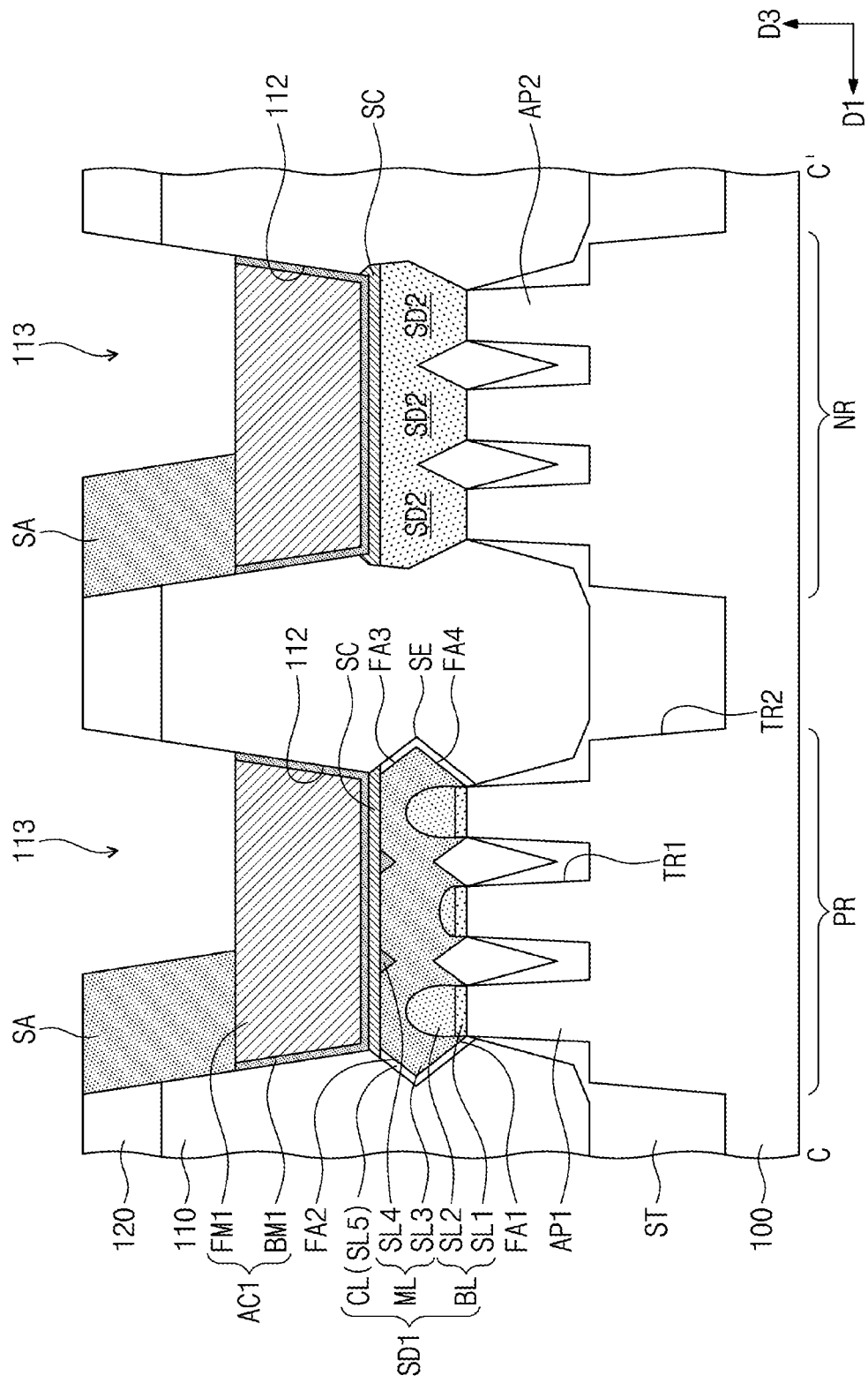
Figure 17:
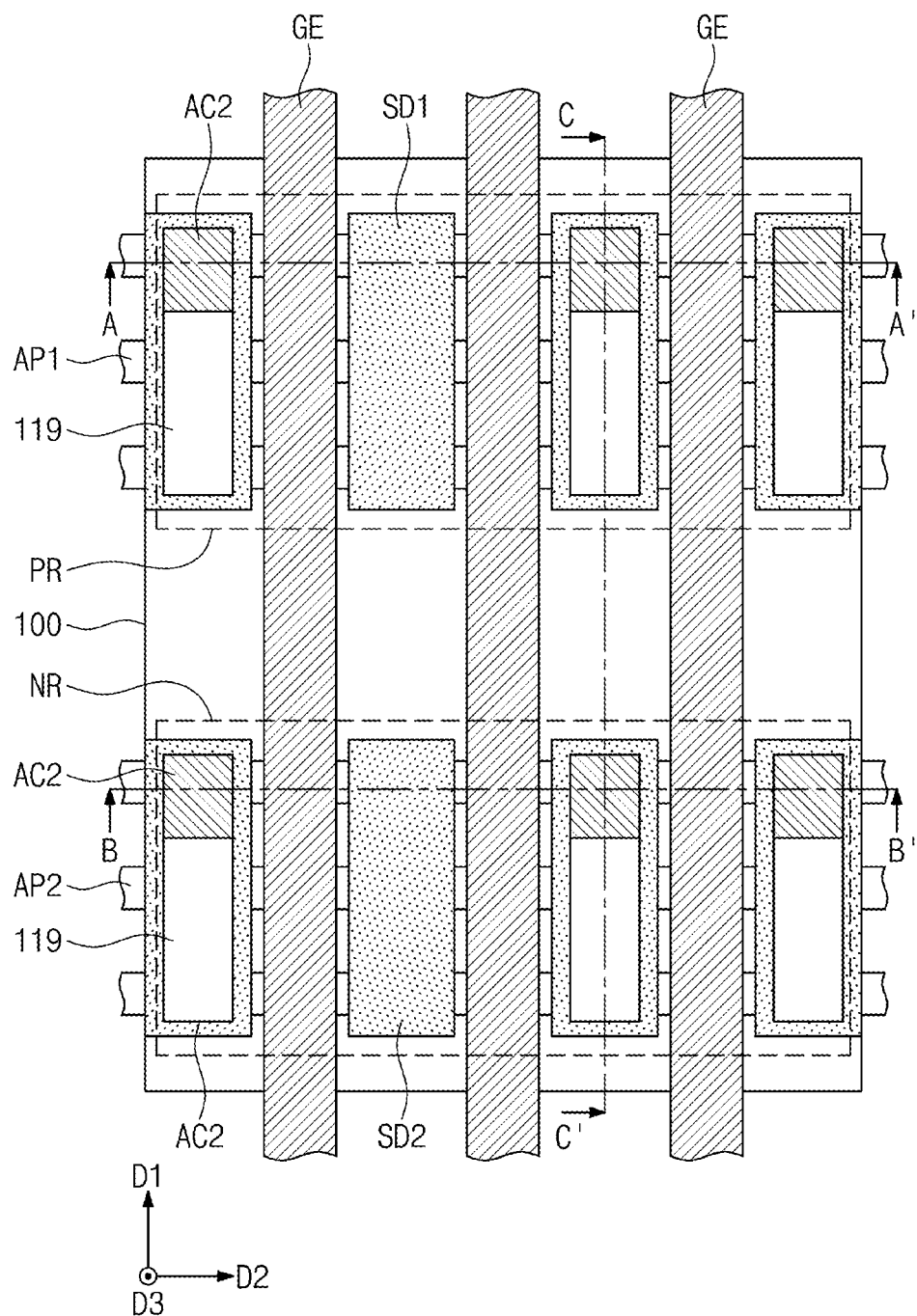
Figure 18A:
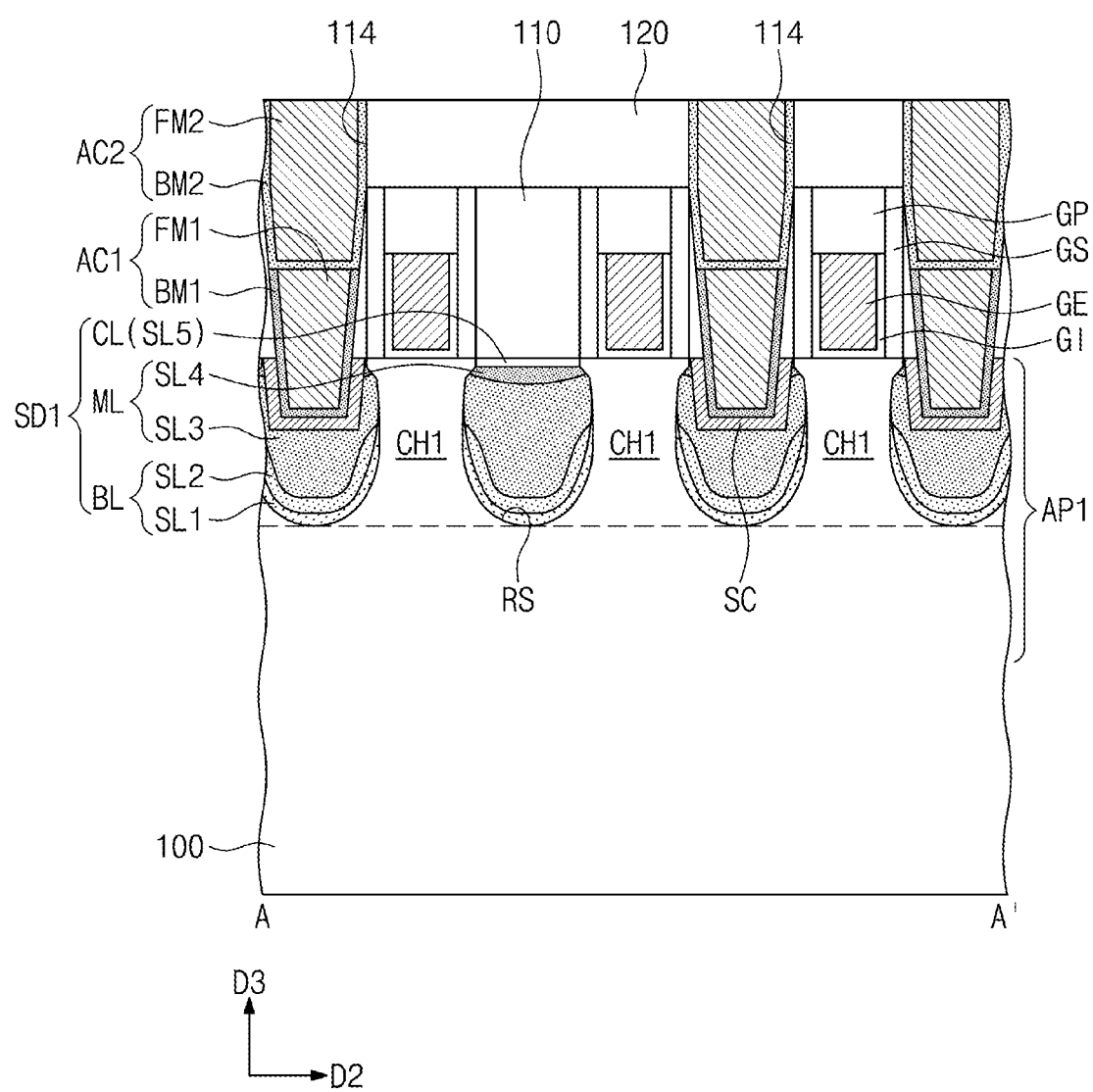
Figure 18B:
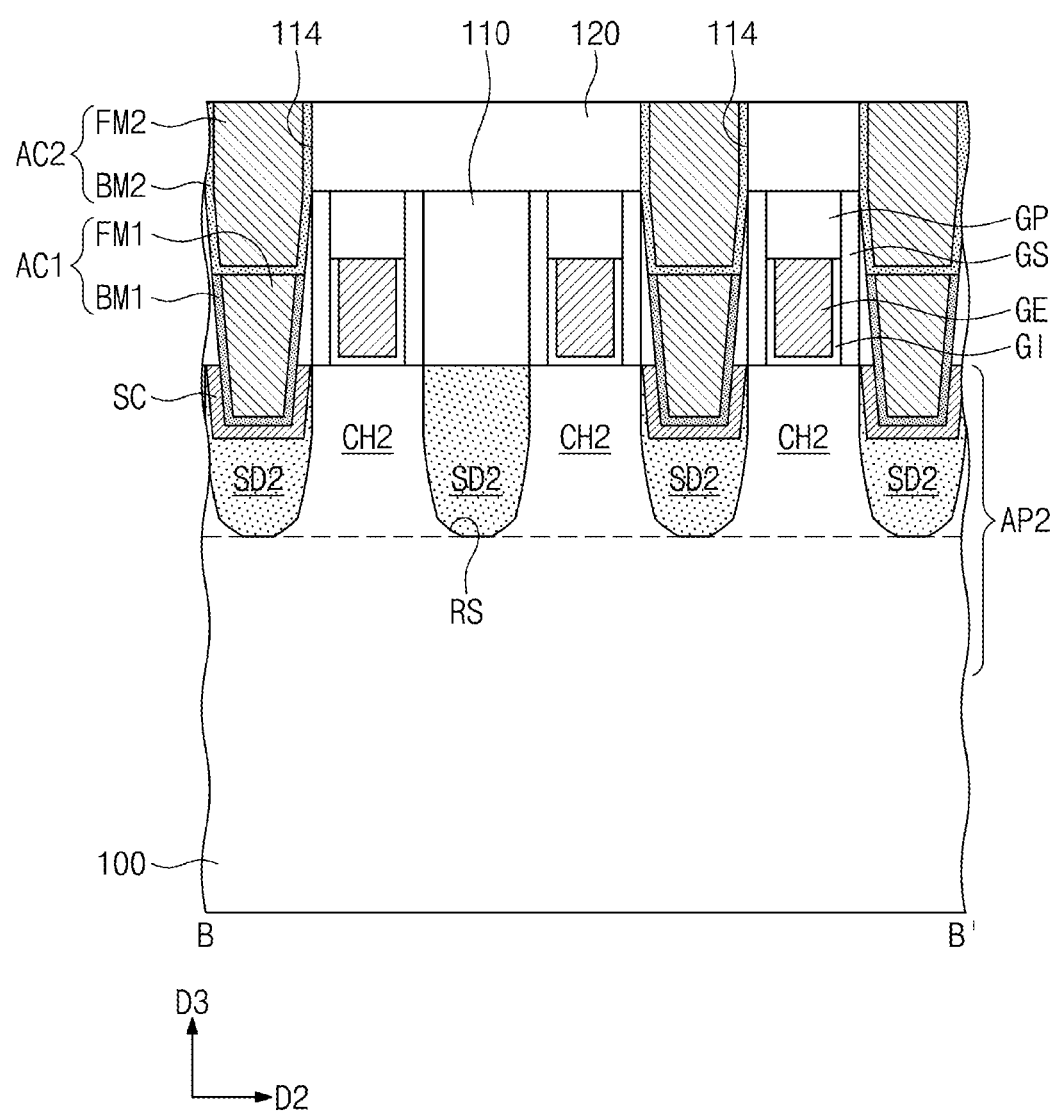
Figure 18C:
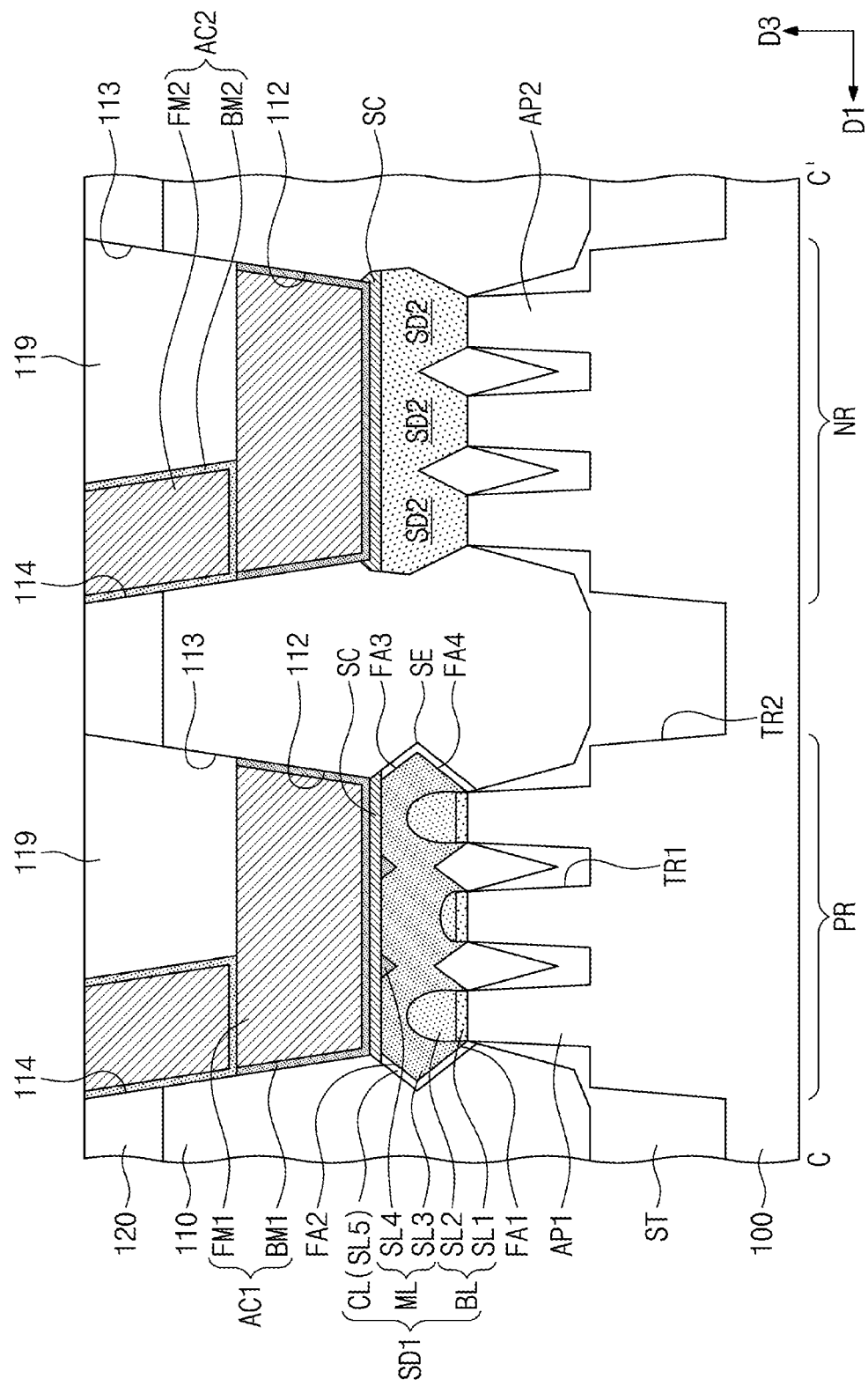
Figure 19A:
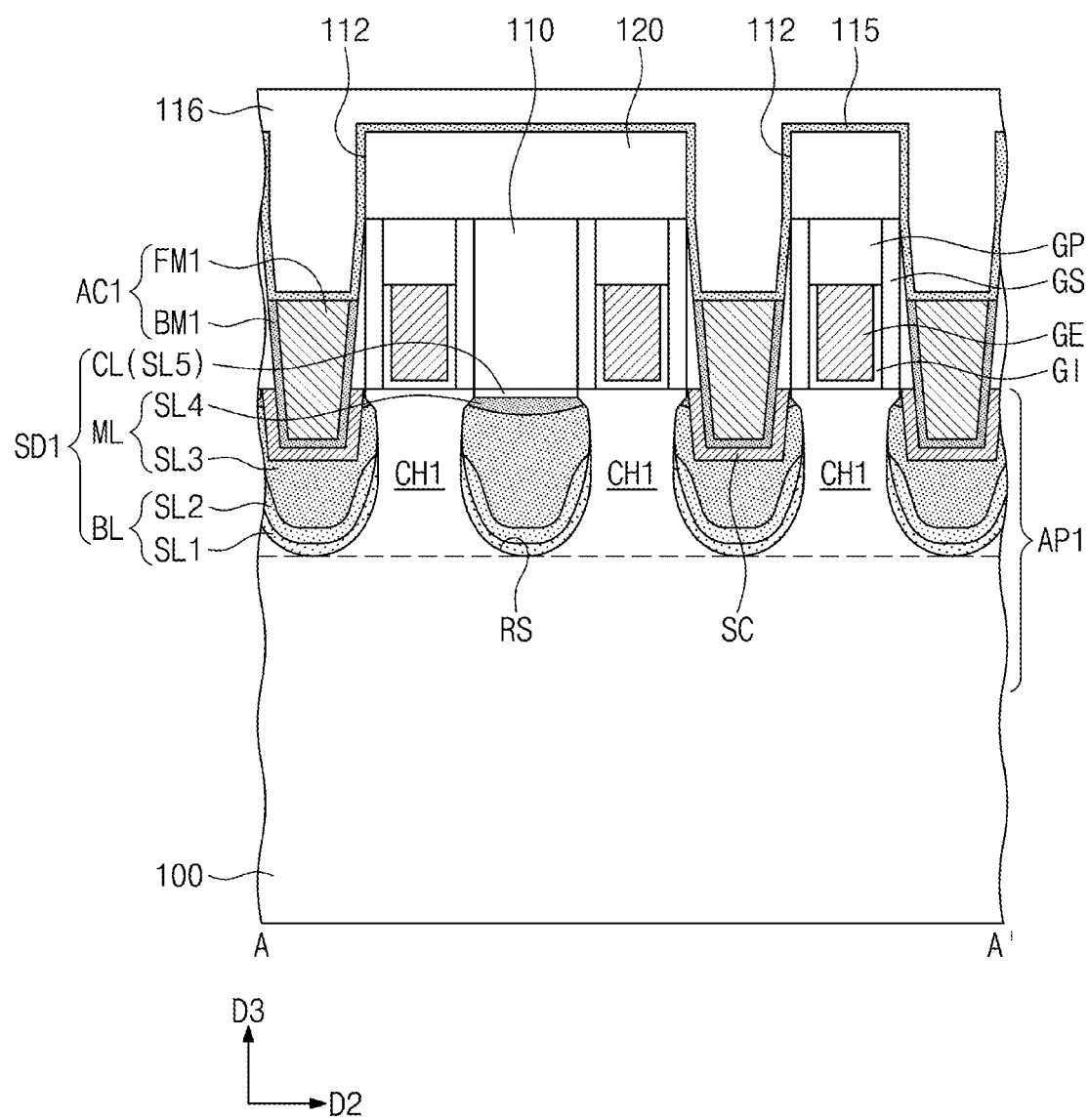
FIGS. 19A to 19C are sectional views taken along lines A-A', B-B', and C-C', respectively, of FIG. 15.
Figure 19B:
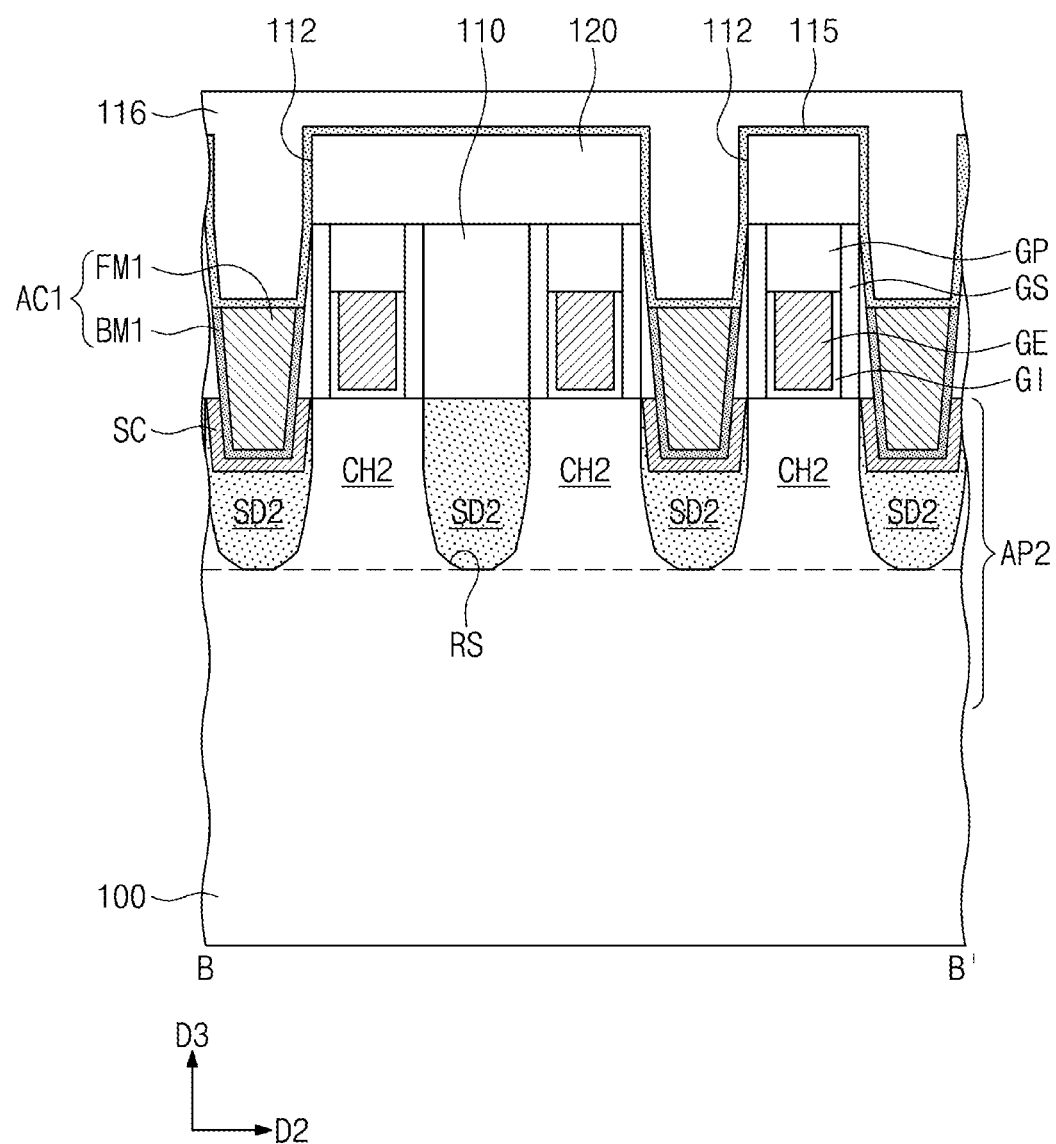
Figure 19C:
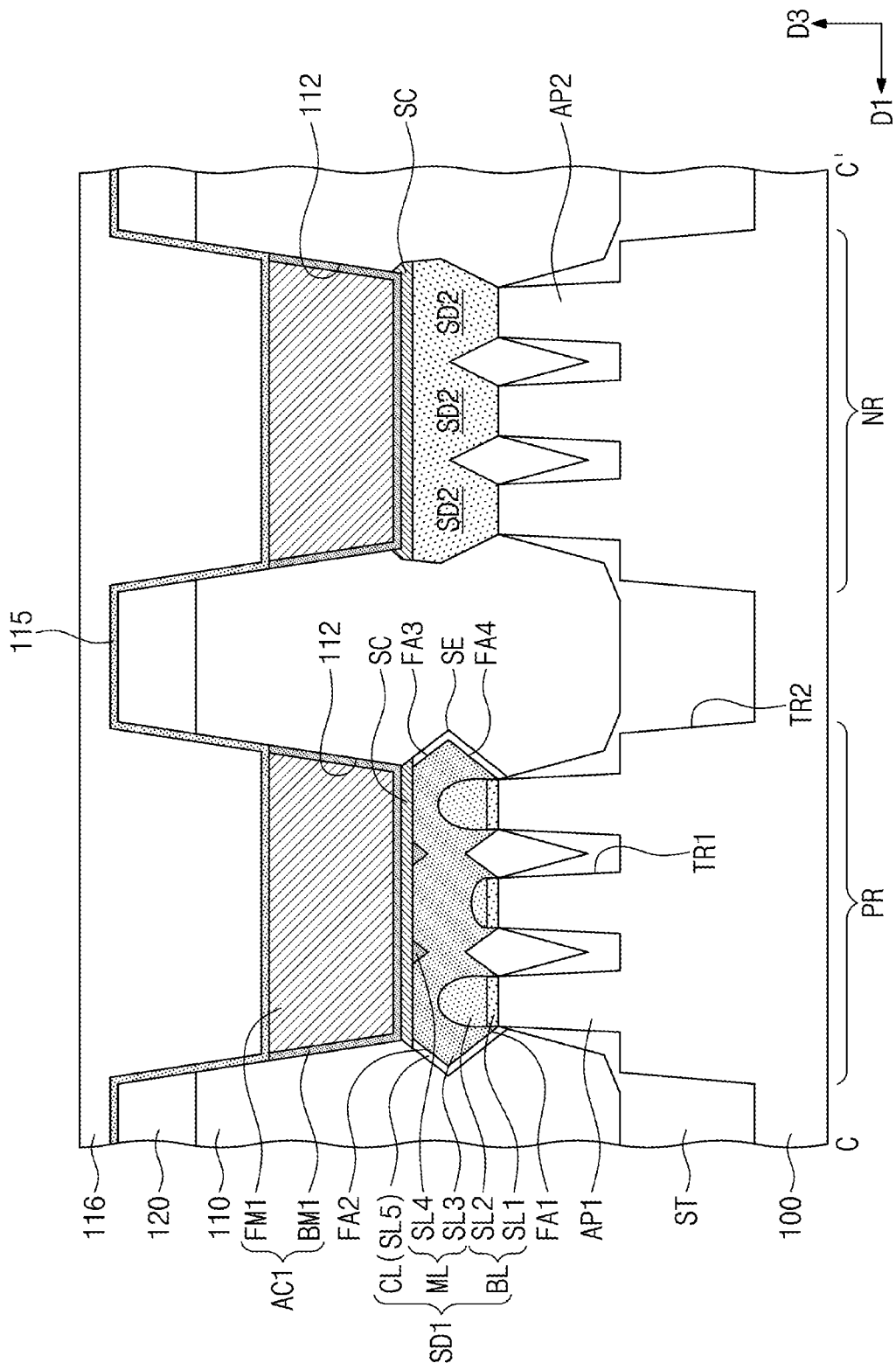
Figure 20:
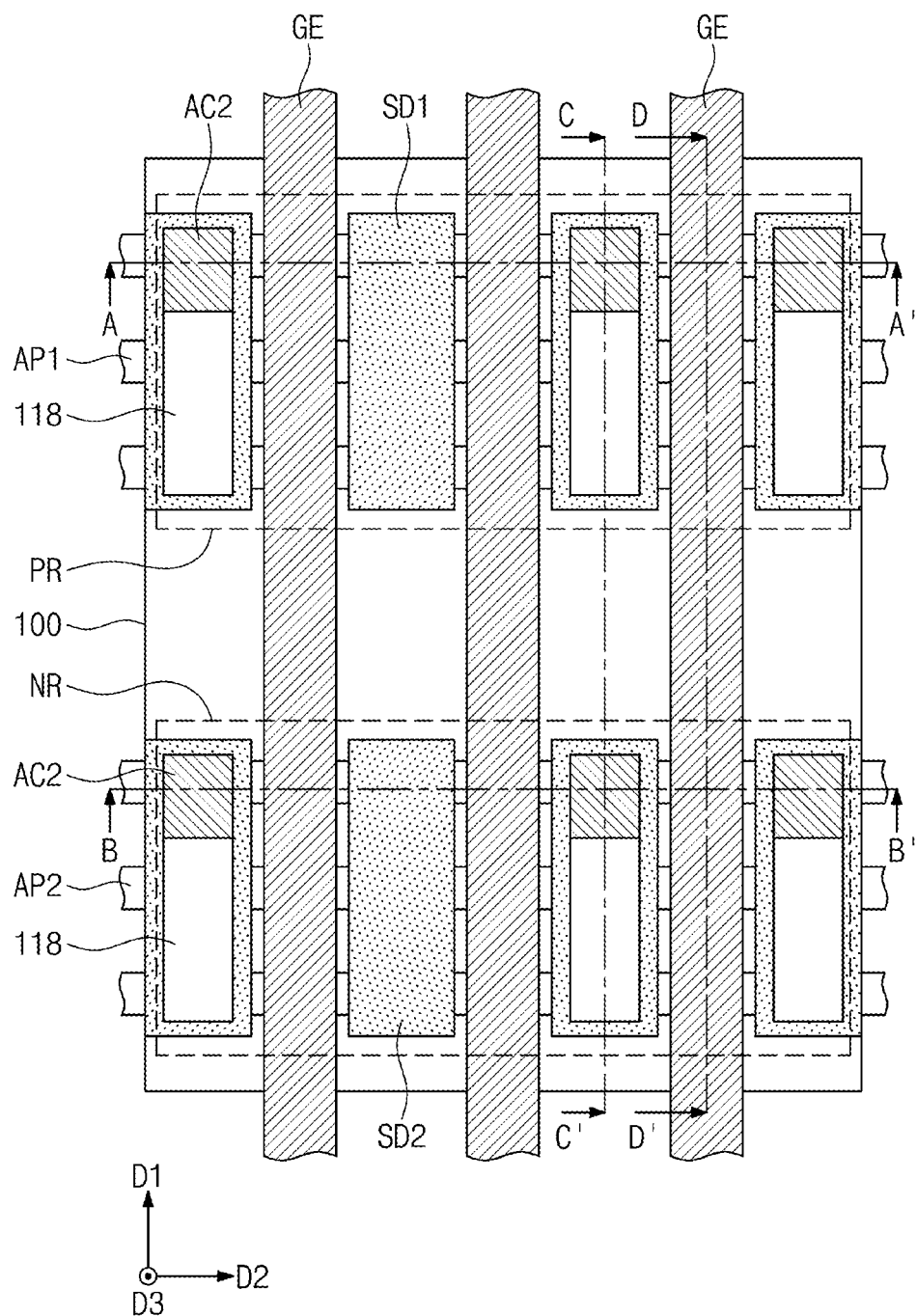
FIG. 20 is a plan view illustrating a method of fabricating a semiconductor device according to an embodiment of the inventive concept.
Figure 21A:
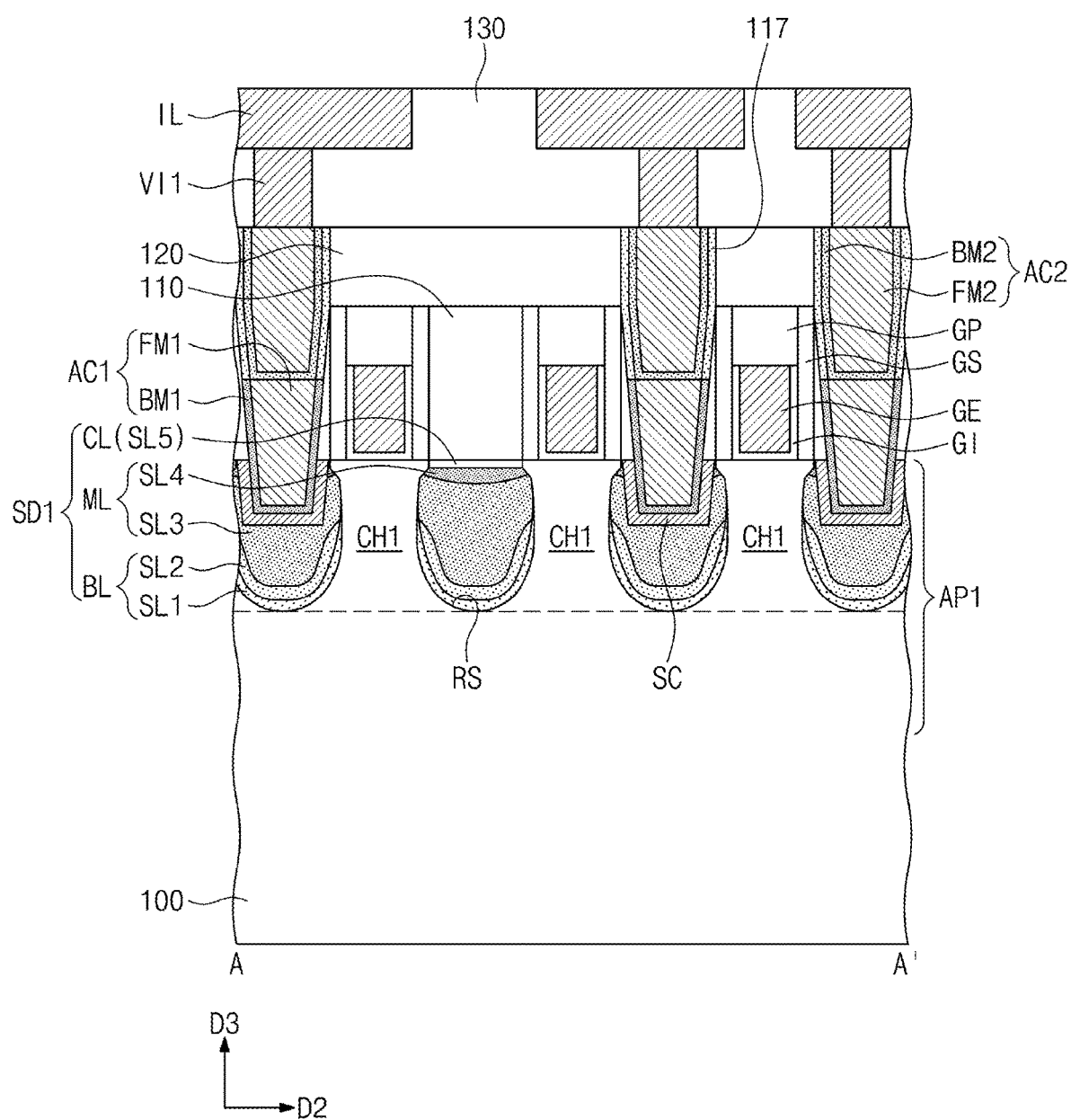
FIGS. 21A to 21D are sectional views taken along lines A-A', B-B', C-C', and D-D', respectively, of FIG. 20.
Figure 21B:
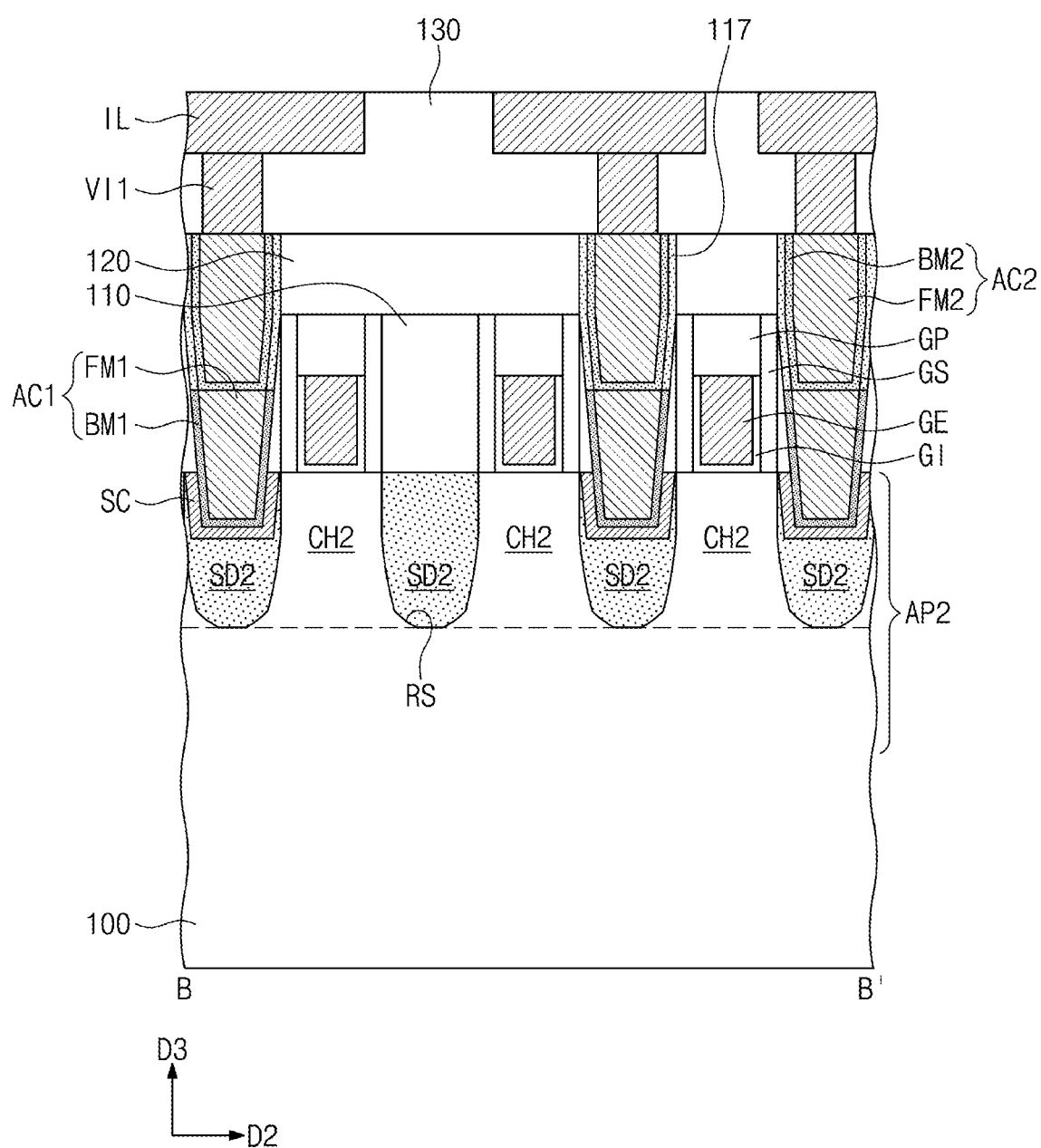
Figure 21C:
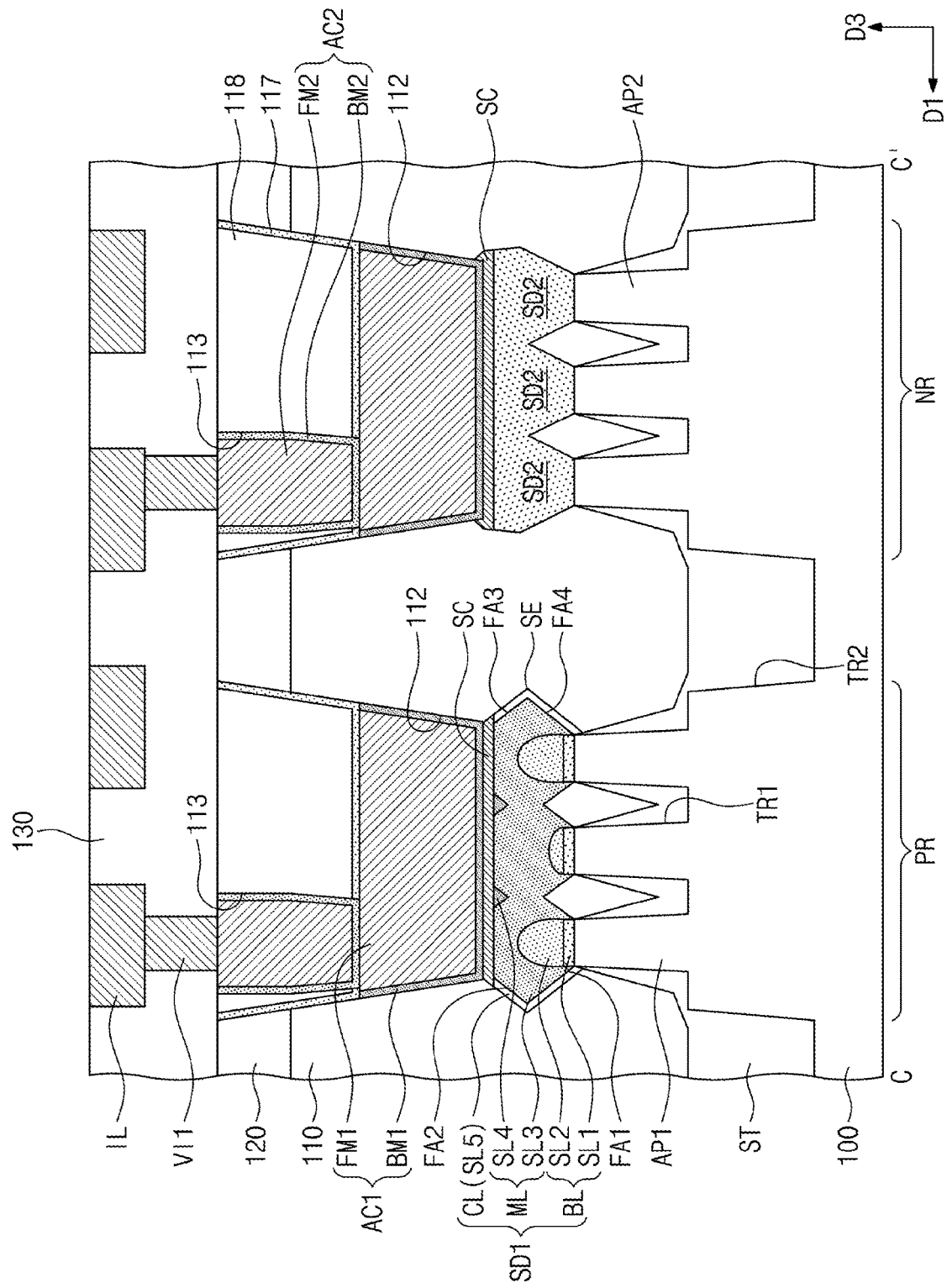
Figure 21D:
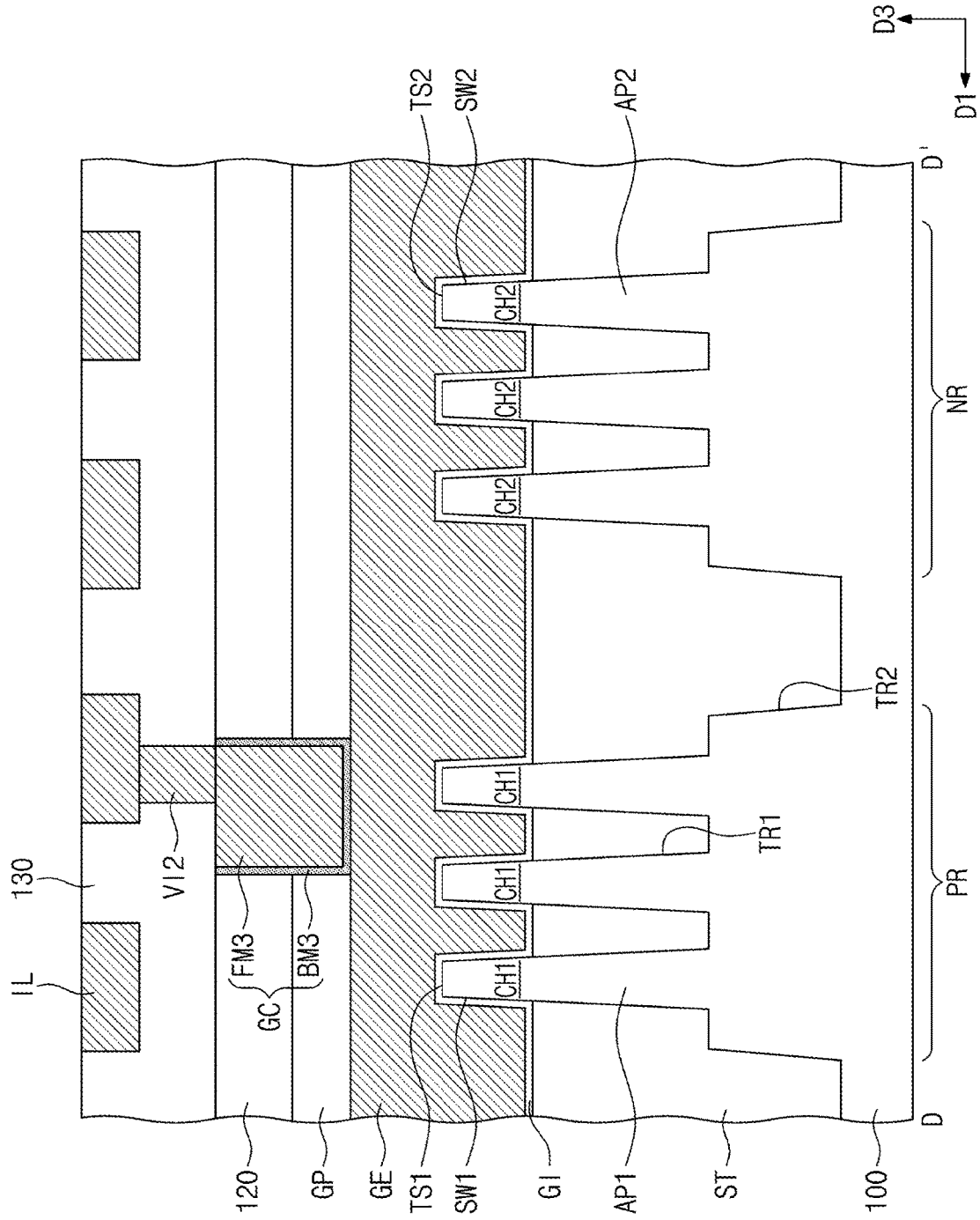

FIGS. 19A to 19C are sectional views taken along lines A-A', B-B', and C-C', respectively, of FIG. 15. FIG. 20 is a plan view illustrating a method of fabricating a semiconductor device according to an embodiment of the inventive concept. FIGS. 21A to 21D are sectional views taken along lines A-A', B-B', C-C', and D-D', respectively, of FIG. 20.

Referring to FIGS. 19A to 19C, a first gap-filling layer 115 and a second gap-filling layer 116 may be sequentially formed in the contact holes 112, in which the lower contact patterns AC1 described with reference to FIGS. 14A to 14C are formed. The first gap-filling layer 115 and the second gap-filling layer 116 may include different materials from each other. As an example, the first gap-filling layer 115 may be formed of and/or include silicon nitride, and the second gap-filling layer 116 may be formed of and/or include silicon oxide.

Referring to FIGS. 20 and 21A to 21D, the first openings 113 may be formed to penetrate the first and second gap-filling layers 115 and 116, and the upper contact patterns AC2 may be formed in the first openings 113. The first openings 113 may be formed to expose the top surfaces of the lower contact patterns AC1. In an embodiment, the first openings 113 may be formed by a dry etching process. At least one gate contact GC, which is electrically connected to the gate electrode GE, may be provided to penetrate the second interlayer insulating layer 120 and the gate capping pattern GP. The gate contact GC may include the third conductive pattern FM3 and the third barrier pattern BM3.

The formation of the upper contact patterns AC2 may include a planarization process, and in an embodiment, as a result of the planarization process, first gapfill patterns 117 and second gapfill patterns 118 may be formed from the first gap-filling layer 115 and the second gap-filling layer 116, respectively. Thereafter, the third interlayer insulating layer 130, the interconnection lines IL, and the vias VI1 and VI2 may be formed.

FIGS. 22A to 22D are sectional views, which are taken along the lines A-A', B-B', C-C', and D-D', respectively, of FIG. 1A to illustrate a semiconductor device according to an embodiment of the inventive concept. For the sake of brevity, the elements and features of this example that are similar to those previously shown and described will not be described in much further detail.

Referring to FIGS. 1A and 22A to 22D, the substrate 100 including the first and second active regions PR and NR may be provided. The device isolation layer ST may be provided on the substrate 100. The device isolation layer ST may define the first active pattern AP1 and the second active pattern AP2 in an upper portion of the substrate 100. The first active pattern AP1 and the second active pattern AP2 may be defined on the first active region PR and the second active region NR, respectively.

The first channel patterns CH1, which are vertically stacked, may be provided on the first active pattern AP1. The first channel patterns CH1, which are stacked on the first active pattern AP1, may be spaced apart from each other in the third direction D3. The first channel patterns CH1, which are stacked on the first active pattern AP1, may be overlapped with each other, when viewed in a plan view.

The second channel patterns CH2, which are vertically stacked, may be provided on the second active pattern AP2. The second channel patterns CH2, which are stacked on the second active pattern AP2, may be spaced apart from each other in the third direction D3. The second channel patterns CH2, which are stacked on the second active pattern AP2, may be overlapped with each other, when viewed in a plan view. The first and second channel patterns CH1 and CH2 may be formed of and/or include at least one of silicon (Si), germanium (Ge), or silicon-germanium (SiGe).

The first source/drain patterns SD1 may be provided on the first active pattern AP1. The second source/drain patterns SD2 may be provided on the second active patterns AP2. The gate electrodes GE may be provided to cross the first and second channel patterns CH1 and CH2 or to extend in the first direction D1.

Figure 22A:
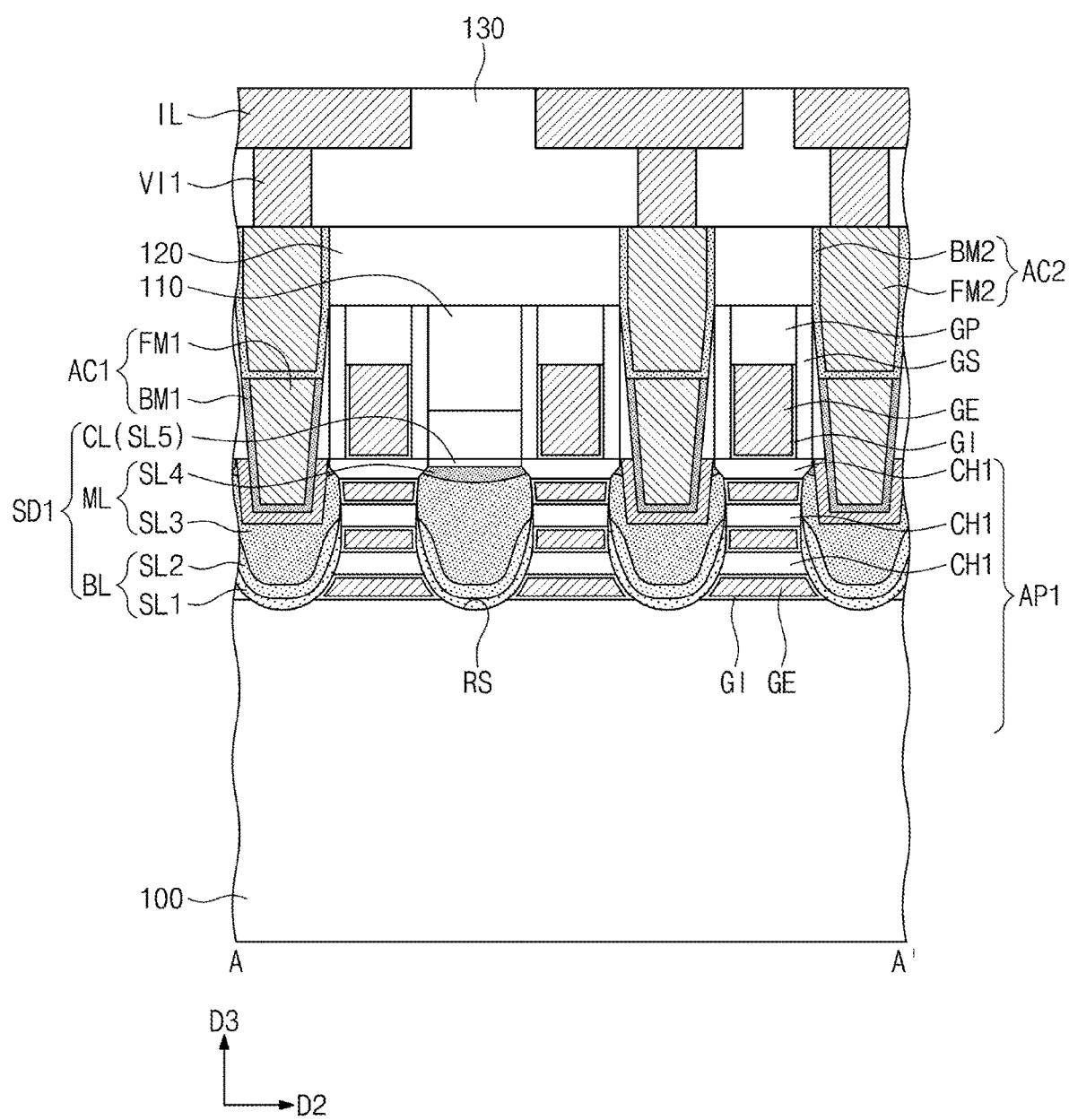
FIGS. 22A to 22D are sectional views, which are taken along the lines A-A', B-B', C-C', and D-D', respectively, of FIG. 1A to illustrate a semiconductor device according to an embodiment of the inventive concept.
Figure 22B:
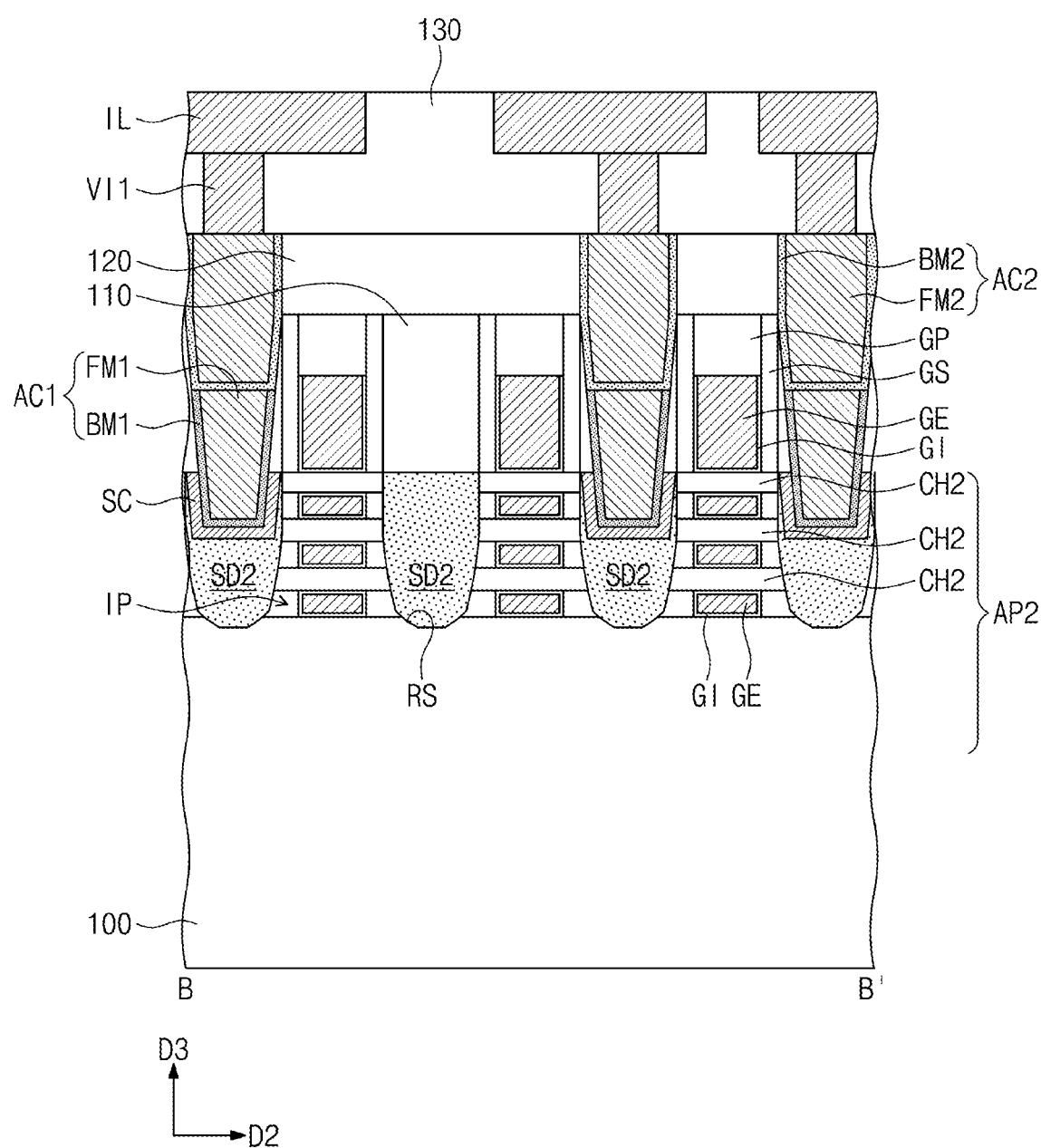
Figure 22C:
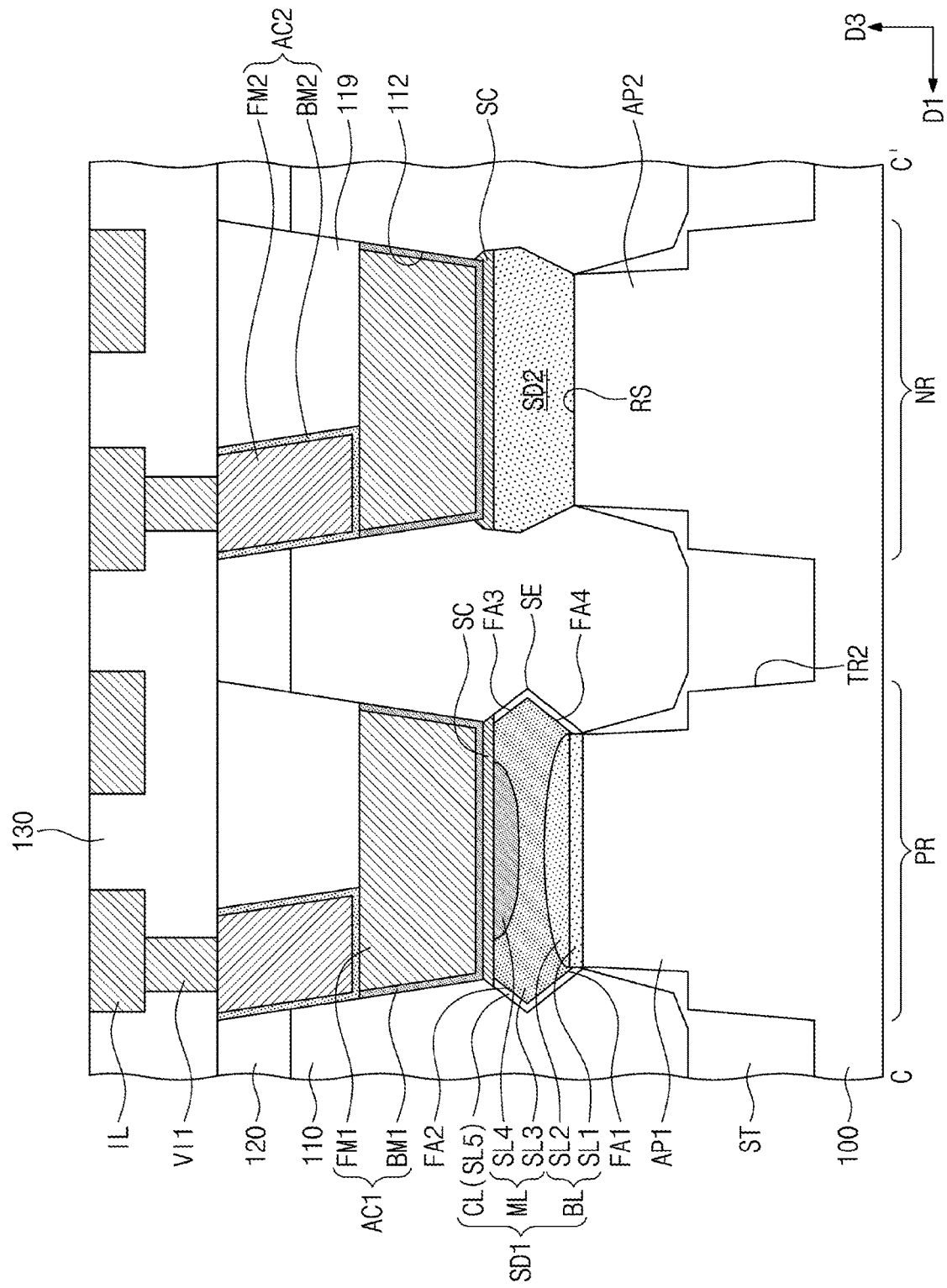
Figure 22D:
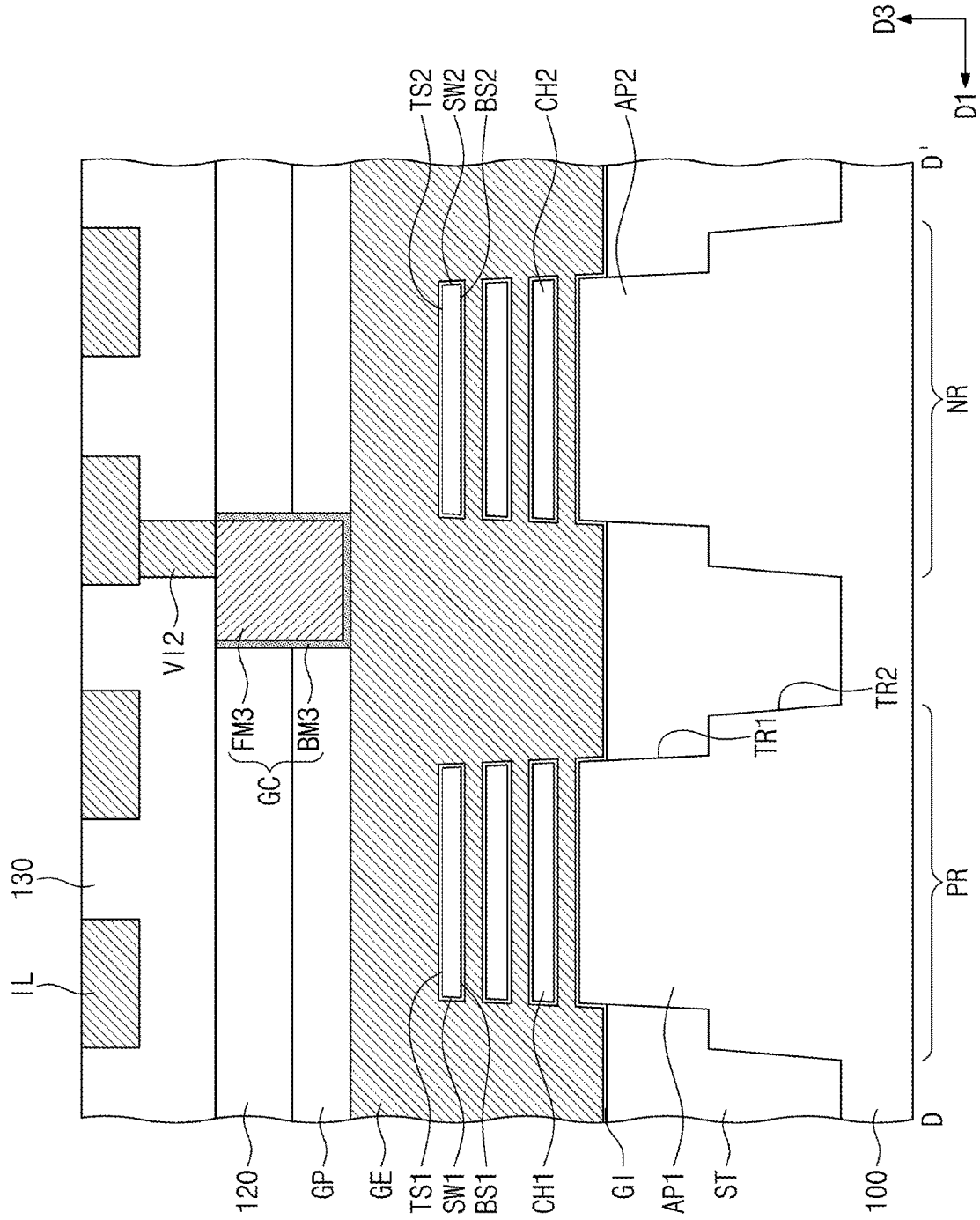

The gate electrode GE may be provided to surround each of the first and second channel patterns CH1 and CH2 (e.g., see FIG. 22D). The gate electrode GE may be provided on the first top surface TS1, at least one first side surface SW1, and a first bottom surface BS1 of the first channel pattern CH1. The gate electrode GE may be provided on the second top surface TS2, at least one second side surface SW2, and a second bottom surface BS2 of the second channel pattern CH2. In other words, the gate electrode GE may enclose top, bottom, and both (e.g., opposite) side surfaces of each of the first and second channel patterns CH1 and CH2. A transistor according to the present embodiment may be a three-dimensional field-effect transistor (e.g., multi-bridge channel field-effect transistor (MBCFET)), in which the gate electrode GE is provided to three-dimensionally surround the channel patterns CH1 and CH2.

The gate dielectric pattern GI may be provided between each of the first and second channel patterns CH1 and CH2 and the gate electrode GE. The gate dielectric pattern GI may be provided to surround each of the first and second channel patterns CH1 and CH2.

On the second active region NR, an insulating pattern IP may be interposed between the gate dielectric pattern GI and the second source/drain pattern SD2. The gate electrode GE may be spaced apart from the second source/drain pattern SD2 by the gate dielectric pattern GI and the insulating pattern IP. By contrast, the insulating pattern IP may be omitted on the first active region PR.

The first interlayer insulating layer 110 and the second interlayer insulating layer 120 may be provided on the substrate 100. The active contacts AC may be provided to penetrate the first and second interlayer insulating layers 110 and 120 and may be electrically connected to the first and second source/drain patterns SD1 and SD2, respectively. The gate contact GC may be provided to penetrate the second interlayer insulating layer 120 and the gate capping pattern GP and to be electrically connected to the gate electrode GE.

The third interlayer insulating layer 130 may be provided on the second interlayer insulating layer 120. The interconnection lines IL and vias VI1 and VI2 may be provided in the third interlayer insulating layer 130.

In a semiconductor device according to an embodiment of the inventive concept, it may be possible to increase a distance between an upper contact pattern and a gate contact and thereby to protect/prevent contacts from being undesirably connected to each other. This may make it possible to realize a highly reliable semiconductor device.

While example embodiments of the inventive concept have been particularly shown and described, it will be understood by one of ordinary skill in the art that variations in form and detail may be made therein without departing from the scope of the attached claims.

What is claimed is:

1. A semiconductor device comprising:
   a gate electrode on a substrate and extending in a first direction;
   source/drain patterns spaced apart from each other, in a second direction that intersects the first direction, with the gate electrode interposed therebetween;
   a gate contact electrically connected to the gate electrode; and
   an active contact electrically connected to at least one of the source/drain patterns,
   wherein the active contact comprises:
      a lower contact pattern electrically connected to the at least one of the source/drain patterns, the lower contact pattern having a first width in the first direction; and
      an upper contact pattern electrically connected to a top surface of the lower contact pattern, the upper contact pattern having a second width in the first direction that is smaller than the first width, and
   wherein the upper contact pattern and the gate contact horizontally overlap each other in a third direction that is oblique to the second direction and do not horizontally overlap each other in the second direction.

2. The semiconductor device of claim 1,
   wherein the lower contact pattern comprises a first conductive pattern and a first barrier pattern that is on side and bottom surfaces of the first conductive pattern, and
   wherein the first barrier pattern is absent from at least a portion of a top surface of the first conductive pattern.

3. The semiconductor device of claim 2, wherein a top surface of the first barrier pattern is located at a level lower than a top surface of the upper contact pattern.

4. The semiconductor device of claim 2,
   wherein the upper contact pattern comprises a second conductive pattern and a second barrier pattern that is on side and bottom surfaces of the second conductive pattern, and
   wherein the second barrier pattern extends into a region between the second conductive pattern and the first conductive pattern.

5. The semiconductor device of claim 4, wherein a thickness of the second barrier pattern is different from a thickness of the first barrier pattern.

6. The semiconductor device of claim 4,
   wherein the second conductive pattern comprises aluminum, copper, tungsten, molybdenum, or cobalt, and
   wherein the first conductive pattern comprises a different one of aluminum, copper, tungsten, molybdenum, or cobalt from the second conductive pattern.

7. The semiconductor device of claim 1,
   wherein the upper contact pattern comprises a first side surface and a second side surface that are respectively inclined at first and second angles with respect to the top surface of the lower contact pattern, and
   wherein the first and second angles are acute and obtuse, respectively.

8. The semiconductor device of claim 7, wherein the first side surface is aligned with a side surface of the lower contact pattern.

9. The semiconductor device of claim 1,
   wherein the upper contact pattern comprises a first side surface and a second side surface that are respectively inclined at first and second angles with respect to the top surface of the lower contact pattern, and
   wherein both of the first and second angles are acute or both of the first and second angles are obtuse.

10. The semiconductor device of claim 1, wherein a bottom surface of the upper contact pattern is at a level lower than a top surface of the gate electrode.

11. The semiconductor device of claim 1,
    wherein the top surface of the lower contact pattern is at a level lower than a bottom surface of the gate contact, and
    wherein the lower contact pattern extends below a bottom surface of the gate electrode and into a first source/drain pattern of the source/drain patterns.

12. The semiconductor device of claim 1, further comprising:
    a first via on the upper contact pattern; and
    a second via on the gate contact,
    wherein the first via and the second via horizontally overlap each other.

13. The semiconductor device of claim 1,
    wherein the lower contact pattern comprises:
       a first end portion that is adjacent to the gate contact; and
       a second end portion that is opposite the first end portion in the first direction and distal from the gate contact, and
    wherein the upper contact pattern is on the second end portion and is absent from the first end portion.

14. The semiconductor device of claim 1, wherein the gate contact is between ones of the source/drain patterns that are adjacent to each other in the second direction.

15. The semiconductor device of claim 1, further comprising a first channel pattern between the source/drain patterns,
wherein the first channel pattern comprises a plurality of first channel patterns that are vertically stacked, and
wherein the gate electrode surrounds top, bottom, and opposite side surfaces of each of the plurality of first channel patterns.

16. A semiconductor device comprising:
a gate electrode on a substrate and extending in a first direction;
source/drain patterns spaced apart from each other, in a second direction that intersects the first direction, with the gate electrode interposed therebetween;
a gate contact electrically connected to the gate electrode; and
an active contact electrically connected to at least one of the source/drain patterns,
wherein the active contact comprises a lower contact pattern electrically connected to the at least one of the source/drain patterns and an upper contact pattern electrically connected to a top surface of the lower contact pattern,
wherein the lower contact pattern comprises a first end portion proximal to the gate contact and a second end portion opposite the first end portion in the first direction and distal from the gate contact, and
wherein the upper contact pattern is on the second end portion and is absent from the first end portion.

17. The semiconductor device of claim 16,
wherein a horizontal plane defined by the first direction and the second direction includes both a portion of the upper contact pattern and a portion of the gate contact,
wherein, in the horizontal plane, the second end portion is spaced apart from the gate contact by a first distance in a third direction that is oblique to the first and second directions, and
wherein, in the horizontal plane, the first end portion is spaced apart from the gate contact in the second direction by a second distance that is shorter than the first distance.

18. The semiconductor device of claim 16, further comprising:
a first via on the upper contact pattern; and
a second via on the gate contact,
wherein the first via and the second via horizontally overlap each other.

19. The semiconductor device of claim 16,
wherein the lower contact pattern comprises a first conductive pattern and a first barrier pattern that is on side and bottom surfaces of the first conductive pattern,
wherein the upper contact pattern comprises a second conductive pattern and a second barrier pattern that is on side and bottom surfaces of the second conductive pattern, and
wherein the second barrier pattern extends into a region between the second conductive pattern and the first conductive pattern.

20. A semiconductor device comprising:
a gate electrode extending in a first direction on an active pattern on a substrate;
source/drain patterns spaced apart from each other, in a second direction, with the gate electrode interposed therebetween;
a gate contact electrically connected to the gate electrode;
an active contact electrically connected to at least one of the source/drain patterns;
a gate insulating layer between the active pattern and the gate electrode;
a gate capping pattern on the gate electrode;
a first via on the active contact;
a second via on the gate contact;
an interconnection line electrically connected to the first via or the second via; and
an interlayer insulating layer on the gate capping pattern,
wherein the active contact comprises:
a lower contact pattern electrically connected to the at least one of the source/drain patterns, the lower contact pattern having a first width in the first direction; and
an upper contact pattern electrically connected to a top surface of the lower contact pattern, the upper contact pattern having a second width in the first direction that is smaller than the first width,
wherein the interconnection line has a third width in the second direction that is wider than a fourth width in the second direction of the first via or the second via, and
wherein the upper contact pattern and the gate contact horizontally overlap each other.

* * * * *